US010483488B2

United States Patent
Jin et al.

(10) Patent No.: US 10,483,488 B2
(45) Date of Patent: Nov. 19, 2019

(54) ORGANIC LIGHT-EMITTING ELEMENT

(71) Applicant: TORAY INDUSTRIES, INC., Tokyo (JP)

(72) Inventors: Guangnan Jin, Shanghai (CN); Peng Wang, Shanghai (CN); Fangrong Xu, Shanghai (CN); Lingzhi Zhong, Shanghai (CN); Takeshi Ishigaki, Shanghai (CN); Daisaku Tanaka, Otsu (JP); Takeshi Ikeda, Otsu (JP); Takuya Nishiyama, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 598 days.

(21) Appl. No.: 15/108,149

(22) PCT Filed: Dec. 18, 2014

(86) PCT No.: PCT/CN2014/094225
§ 371 (c)(1),
(2) Date: Oct. 3, 2016

(87) PCT Pub. No.: WO2015/096657
PCT Pub. Date: Jul. 2, 2015

(65) Prior Publication Data
US 2017/0018733 A1    Jan. 19, 2017

(30) Foreign Application Priority Data

Dec. 26, 2013  (CN) .......................... 2013 1 0728921

(51) Int. Cl.
*H01L 51/52*      (2006.01)
*H01L 51/00*      (2006.01)
(52) U.S. Cl.
CPC ........ *H01L 51/5253* (2013.01); *H01L 51/006* (2013.01); *H01L 51/0058* (2013.01);
(Continued)

(58) Field of Classification Search
None
See application file for complete search history.

(56) References Cited

U.S. PATENT DOCUMENTS

| 7,102,282 B1 | 9/2006 | Yamada |
| 8,343,638 B2 | 1/2013 | Yang |
| (Continued) | | |

FOREIGN PATENT DOCUMENTS

| CN | 101257744 | 9/2008 |
| CN | 101355140 | 1/2009 |
| (Continued) | | |

OTHER PUBLICATIONS

Shufen Chen et al., "Improved light outcoupling for phosphorescent top-emitting organic light-emitting devices", Applied Physics Letters, A I P Publishing LLC, vol. 88, No. 15, Apr. 14, 2006, 3 pages.
(Continued)

*Primary Examiner* — Jay Yang
(74) *Attorney, Agent, or Firm* — RatnerPrestia

(57) ABSTRACT

An organic light-emitting element, including a substrate, a first electrode, a light-emitting layer containing one organic or more layer film, and a light-emitting element of a second electrode are disclosed. The light-emitting element is provided with a covering layer. For the organic material contained in covering layer, at least one point in the wavelength range between 430 nm and 460 nm the attenuation coefficient is greater than 0.10 while in the wavelength range of 460 nm to 500 nm its attenuation coefficient is 0.10 or below. The organic light-emitting element achieves high light-emitting efficiency and color reproducibility, and can be used as organic EL display, backlight source for liquid crystal display, illumination, light source for measurement devices, indication board or identification lamp etc.

17 Claims, 16 Drawing Sheets

(52) U.S. Cl.
CPC ...... *H01L 51/0061* (2013.01); *H01L 51/0072* (2013.01); *H01L 51/5275* (2013.01); *H01L 51/0054* (2013.01); *H01L 51/0065* (2013.01); *H01L 51/0067* (2013.01); *H01L 51/0068* (2013.01); *H01L 51/5218* (2013.01); *H01L 51/5221* (2013.01)

(56) References Cited

U.S. PATENT DOCUMENTS

| | | | |
|---|---|---|---|
| 8,698,395 | B2 | 4/2014 | Im |
| 9,095,033 | B2 | 7/2015 | Naraoka |
| 2008/0164809 | A1 | 6/2008 | Matsunami et al. |
| 2011/0121271 | A1 | 5/2011 | Jeon |
| 2012/0138918 | A1* | 6/2012 | Naraoka ............... C09K 11/06 257/40 |

FOREIGN PATENT DOCUMENTS

| | | |
|---|---|---|
| CN | 101656300 | 2/2010 |
| CN | 102074568 | 5/2011 |
| EP | 2157627 | 2/2010 |
| JP | 2006156390 | 6/2006 |
| JP | 2006302878 | 11/2006 |
| JP | 2007103303 | 4/2007 |
| WO | 01039554 | 5/2001 |
| WO | 2011043083 | 4/2011 |

OTHER PUBLICATIONS

M. M. El-Nahass et al., "Structural and optical properties of Tris (8-hydroxyquinoline) aluminum (III) (Alq3) thermal evaporated thin films", Journal of Alloys and Compounds, Elsevier, Sequoia, Lausanne, CH, vol. 507, No. 1, Sep. 24, 2010, 8 pages.
Supplementary European Search Report for Application No. 14874470. 9, dated May 22, 2017, 9 pages.
Chinese Office Action for Chinese Application No. 201480070877. 6, dated Mar. 3, 2017—13 Pages.
International Search Report and Written Opinion of the International Searching Authority for International Application No. PCT/CN2014/094225 dated Mar. 25, 2015.

* cited by examiner

ORGANIC LIGHT-EMITTING ELEMENT

CROSS-REFERENCE TO RELATED APPLICATIONS

This is the U.S. National Phase application of PCT International Application No. PCT/CN2014/094225, filed Dec. 18, 2014, and claims priority to Chinese Patent Application No. 201310728921.5, filed Dec. 26, 2013, the disclosures of each of these applications being incorporated herein by reference in their entireties for all purposes.

FIELD OF THE INVENTION

The present invention relates to an organic light-emitting element, and more particularly to an organic light-emitting element that has significantly improved light extraction efficiency.

BACKGROUND OF THE INVENTION

An organic light-emitting element represents a self-emissive display device, having advantages relating to thinness, light weight, wide view angle, low power consumption, high contrast, etc.

The light-emitting principle of an organic light-emitting element is that holes and electrons are introduced by electrode injection, the light is generated when holes and electrons recombine in a light-emitting layer and return to the ground state from the excited state. As such light-emitting elements have characteristics of being advantageously thin and being capable of emitting high brightness light at low driving voltage and emitting light in multiple colors by using different light-emitting materials, therefore, these light-emitting elements receive much concern.

Since C. W. Tang from Kodak Company reported that organic thin-film elements could emit light with high brightness, many researches have been made to applications of the organic thin-film elements. Organic thin-film light-emitting elements are now used in main screens of mobile phones and other devices, and significant progress is demonstrated on practicalization. However, there are various technical issues needs to be addressed. Particularly, realizing high efficiency and low power consumption of the element is one subject to be figured out.

Depending on the direction of the light from the organic light-emitting layer, organic light-emitting elements are classified in two types, namely bottom-emitting organic light-emitting elements and top-emitting organic light-emitting elements. In a bottom-emitting organic light-emitting element, light is pointed to the substrate side. A reflective electrode is provided on the organic light-emitting layer, while a transparent electrode is provided at the lower section of the organic light-emitting layer. In this case, when the organic light-emitting element has an active matrix element, since the part where the thin-film transistor is formed is opaque, the light-emitting area is reduced. On the other hand, in a top-emitting organic element, the transparent electrode is formed at the upper section of the organic light-emitting layer, and the reflective electrode is formed at the lower section of the organic light-emitting layer, so the light is emitting in a direction opposite to the substrate side. Thus, the light-transmitting area is increased and the brightness is increased.

In the current technology, for improving light-emitting efficiency of the top-emitting organic light-emitting elements, one approach is to form an organic covering layer on the upper translucent metal electrode where the light form the light-emitting layer passes through, so as to modulate the optical interference distance, and control reflection of external light and extinction caused by energy movement of surface plasma (as discussed in Patent Documents 1 to 5).

For example, as described in Patent Document 2, an organic covering layer is formed on the upper translucent metallic electrode of the top-emitting organic light-emitting element and has a refractive index 1.7 or more and a thickness of 600 Å, contributing to improving the light-emitting efficiency of the red and green light-emitting element to 1.5 times. The organic covering layer used is an amine derivative or a quinolinol clathrate.

As described in Patent Document 4, materials whose energy gap smaller than 3.2 eV have impact on the wavelength of blue light, and are not suitable for organic covering layers. The materials of the organic covering layer are amine derivatives having specific chemical structures.

Patent Document 5 describes that for the blue light-emitting element with low CIEy, the organic covering layer is made of a material having a variation of refractive index $\Delta n > 0.08$ in the wavelength range of 430 nm to 460 nm. The materials used for the organic covering layer are anthracene derivative having specific chemical structures, etc.

PATENT DOCUMENTS REFERRED

Patent Document 1: WO2001/039554;
Patent Document 2: JP2006-156390;
Patent Document 3: JP2007-103303;
Patent Document 4: JP2006-302878; and
Patent Document 5: WO2011/043083.

BRIEF SUMMARY OF THE INVENTION

As described above, in the current technology, amine derivatives having specific structure of high refractive index or materials meeting certain parametric requirements are used as materials of the organic covering layer to improve light extraction efficiency and color purity. Nevertheless, the problem both covering the light-emitting efficiency and color purity is still not solved, especially in the cases of preparing the blue light-emitting elements.

The inventors of the present invention find that when the covering layer is made of a material that meets certain parametric requirements, and especially is made of a compound of thiophene-based structure, furan-based structure or pyrrole-based structure, or a compound of pyrene-based structure or a compound of anthracene-based structure, that meets certain parametric requirements, improvements in both light extraction efficiency and color purity can be achieved.

The present invention provides an organic light-emitting element, which comprises a substrate, a first electrode, one layer or more of organic film including a light-emitting layer, and a second electrode element. The light-emitting element further comprises a covering layer. The covering layer contains an organic material. For the organic material, at least one point in the wavelength range between 430 nm and 460 nm, its attenuation coefficient is greater than 0.10 while in the wavelength range of 460 nm to 500 nm its attenuation coefficient is 0.10 or below.

DETAILED DESCRIPTION OF THE INVENTION

According to the present invention, the covering layer may be disposed between the first electrode and the second electrode, or may be disposed between the second electrode and the covering layer, or disposed on the second electrode.

Since the covering layer on the second electrode effectively protects the second electrode and the organic light-emitting layer from the influence of external moisture, oxygen and contaminants, therefore may prevent the decrease of the service life of the organic light-emitting element. As compared to bottom-emitting light-emitting elements, top-emitting light-emitting elements have larger light-emitting surface, and consequently have better light extraction efficiency.

According to the present invention, in the organic light-emitting element, the substrate, the first electrode, one layer or more of organic film in which a light-emitting layer is included, the second electrode allowing the light emitted from the light-emitting layer to pass through, and the covering layer are preferably stacked in order. Therein, the covering layer is the layer in which light extraction efficiency is improved.

The present invention thus provides an organic light-emitting element that has significantly improved light extraction efficiency and has superior color purity.

Figure 1:
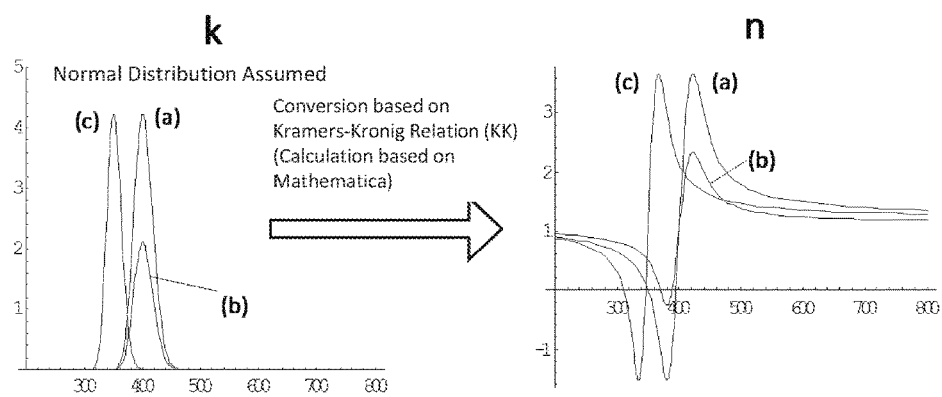
FIG. 1 shows an optical simulation of absorption spectrum and refractive index.
Figure 2:
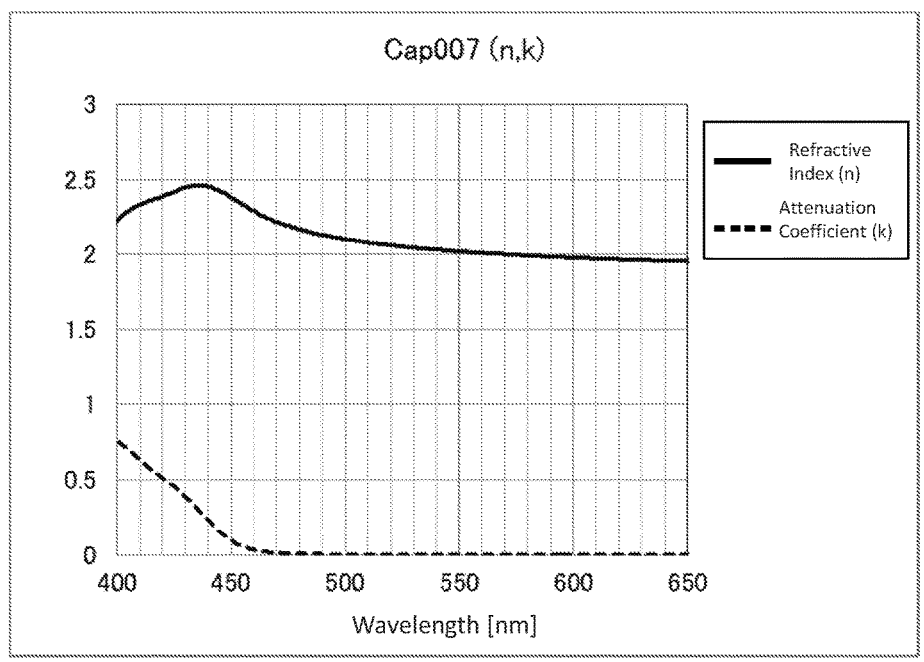
FIG. 2 shows a refractive index (n) and an attenuation coefficient (k) of Cap007 at a given wavelength.
Figure 3:
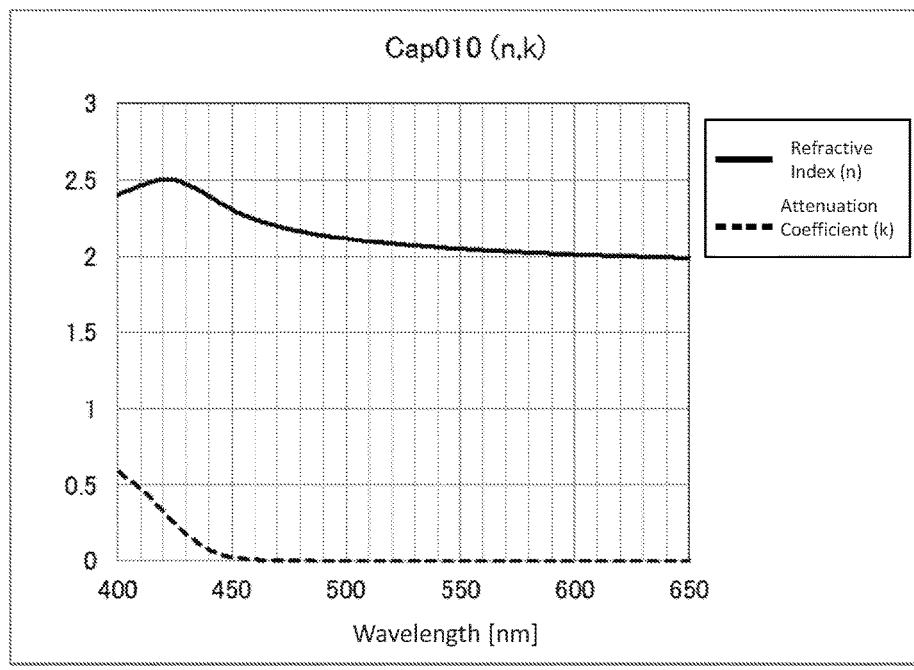
FIG. 3 shows a refractive index (n) and an attenuation coefficient (k) of Cap010 at a given wavelength.
Figure 4:
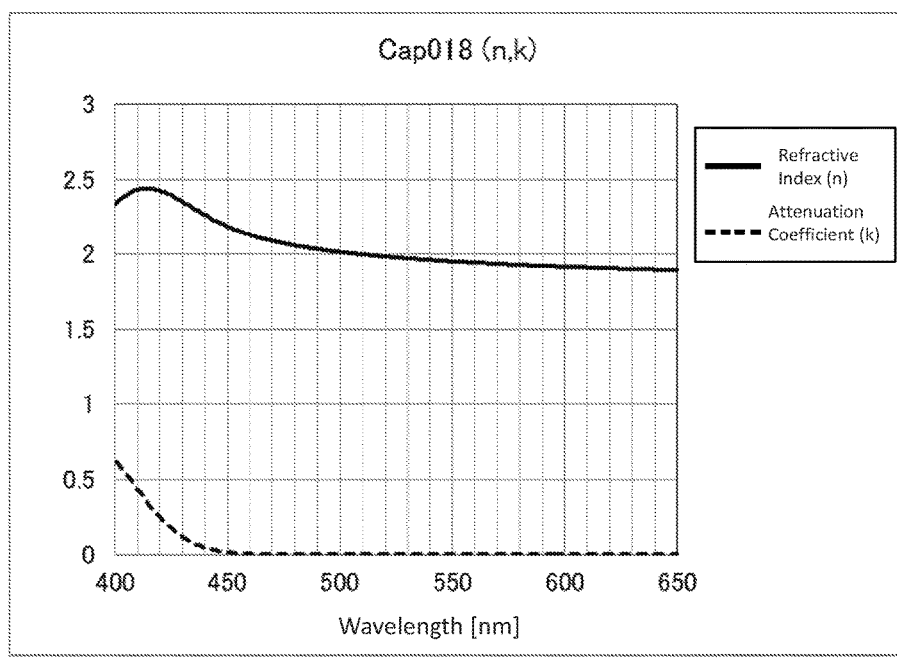
FIG. 4 shows a refractive index (n) and an attenuation coefficient (k) of Cap018 at a given wavelength.
Figure 5:
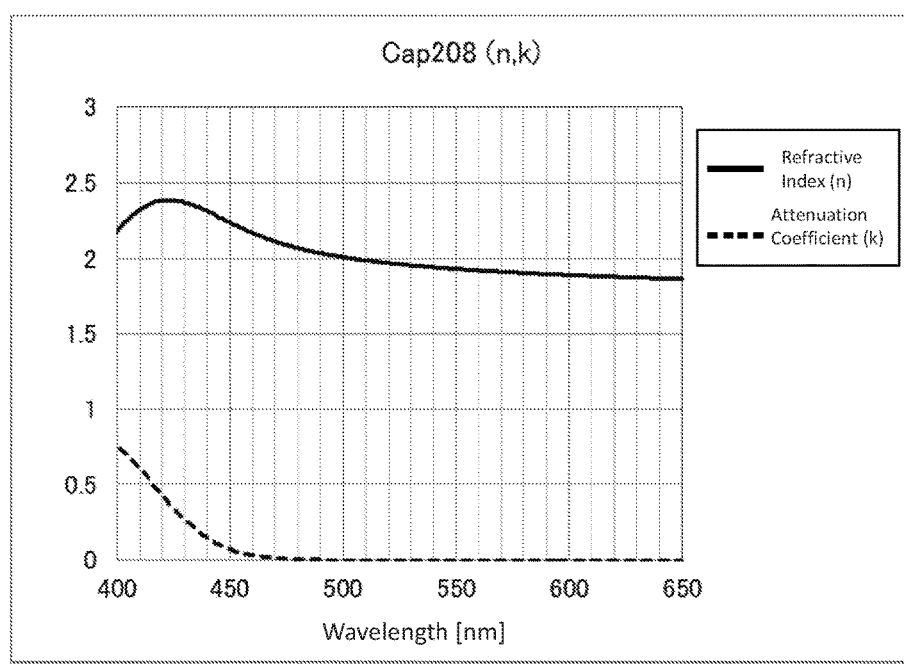
FIG. 5 shows a refractive index (n) and an attenuation coefficient (k) of Cap208 at a given wavelength.
Figure 6:
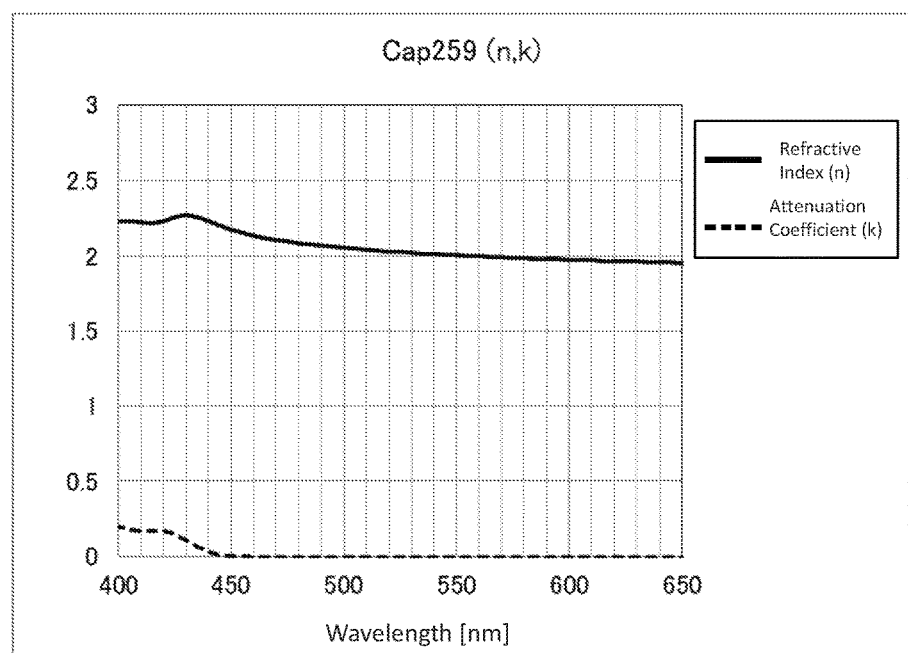
FIG. 6 shows a refractive index (n) and an attenuation coefficient (k) of Cap259 at a given wavelength.
Figure 7:
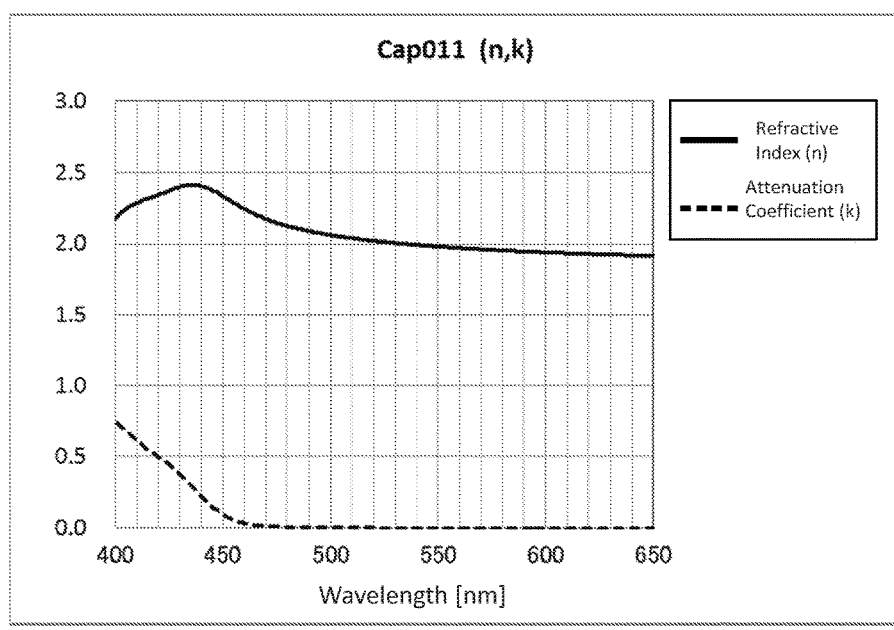
FIG. 7 shows a refractive index (n) and an attenuation coefficient (k) of Cap011 at a given wavelength.
Figure 8:
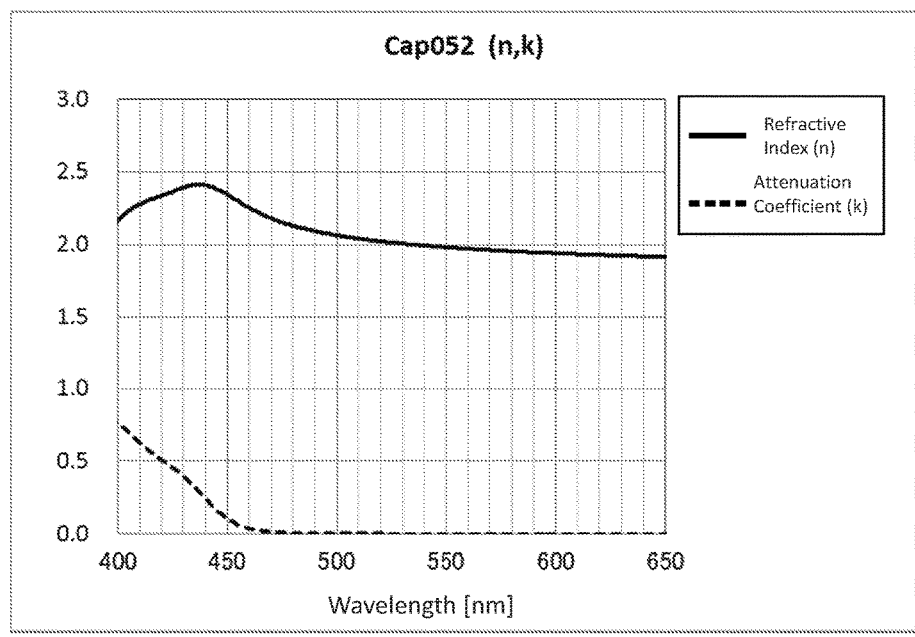
FIG. 8 shows a refractive index (n) and an attenuation coefficient (k) of Cap052 at a given wavelength.
Figure 9:
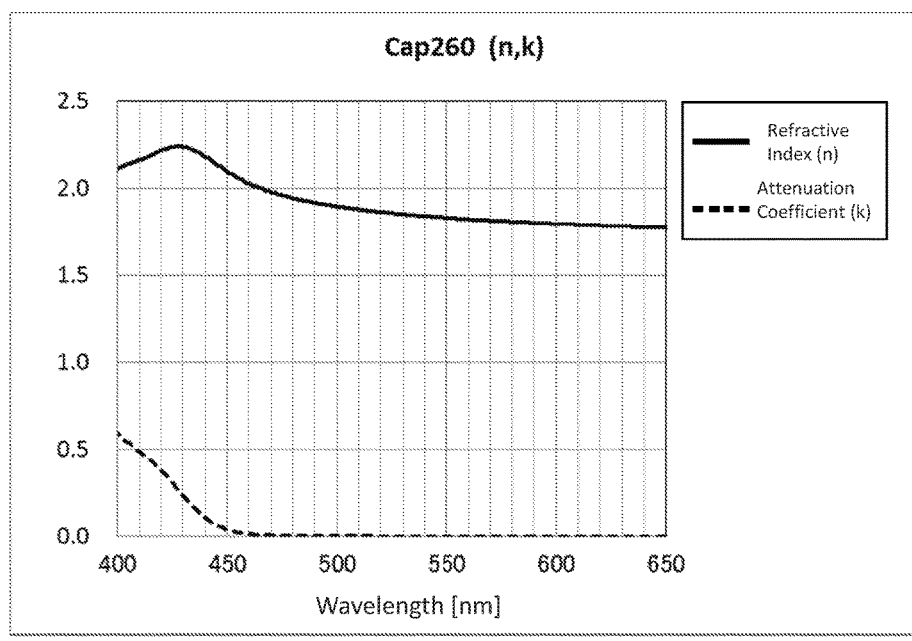
FIG. 9 shows a refractive index (n) and an attenuation coefficient (k) of Cap260 at a given wavelength.
Figure 10:
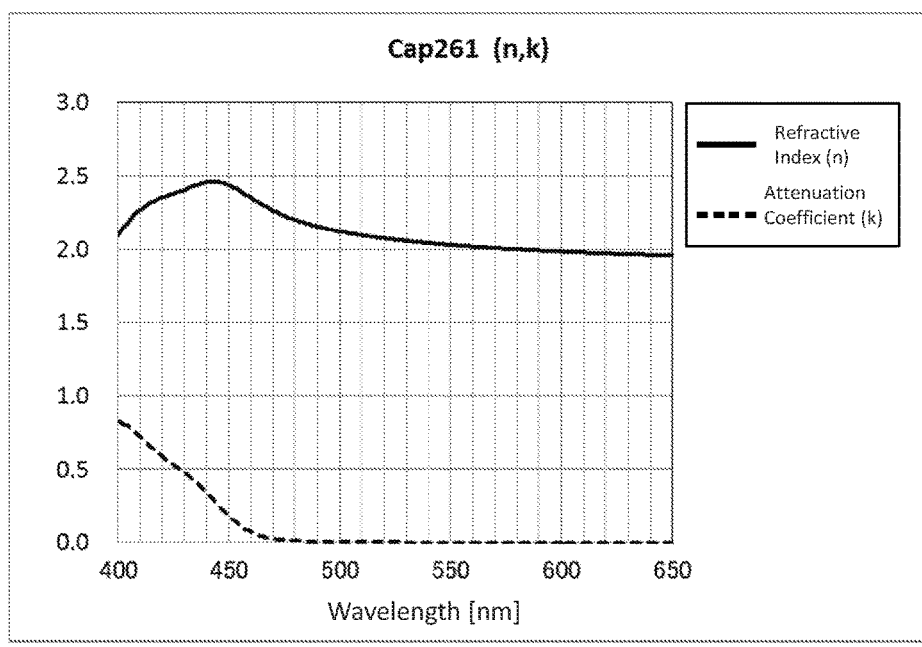
FIG. 10 shows a refractive index (n) and an attenuation coefficient (k) of Cap261 at a given wavelength.
Figure 11:
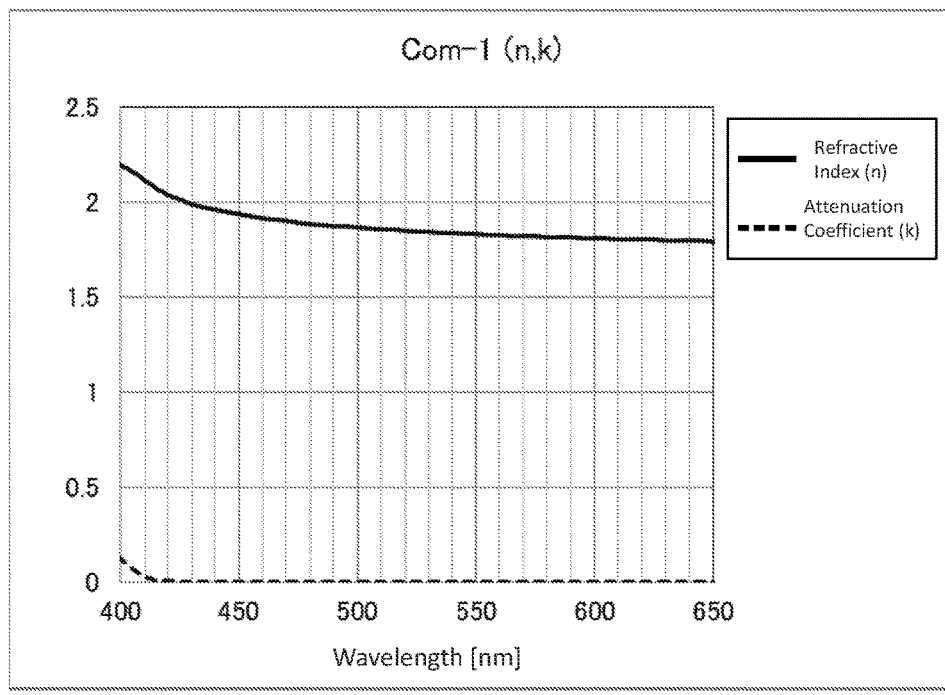
FIG. 11 shows a refractive index (n) and an attenuation coefficient (k) of Com-1 at a given wavelength.
Figure 12:
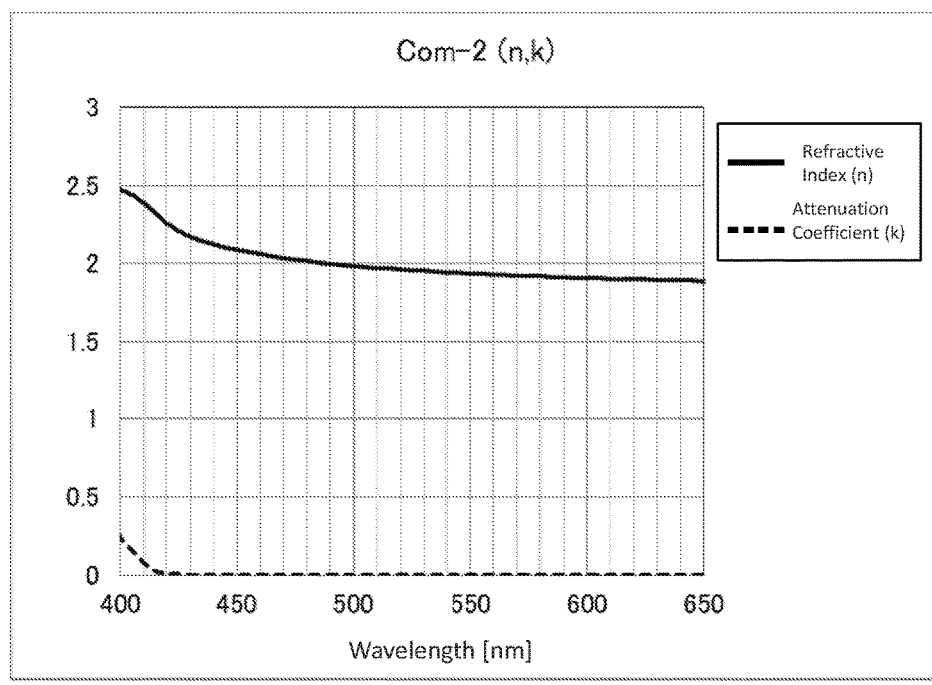
FIG. 12 shows a refractive index (n) and an attenuation coefficient (k) of Com-2 at a given wavelength.
Figure 13:
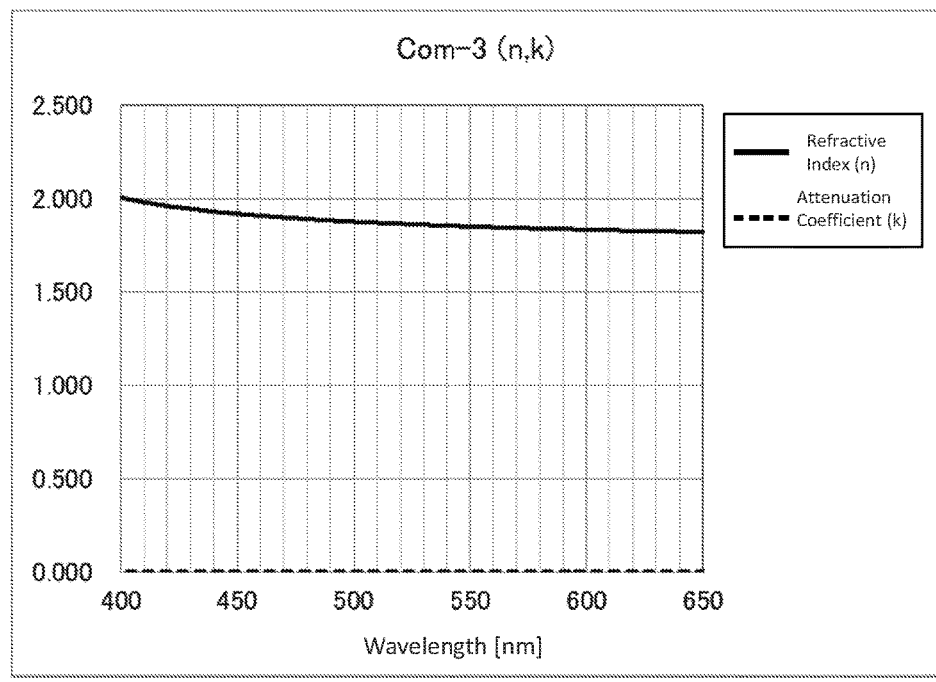
FIG. 13 shows a refractive index (n) and an attenuation coefficient (k) of Com-3 at a given wavelength.
Figure 14:
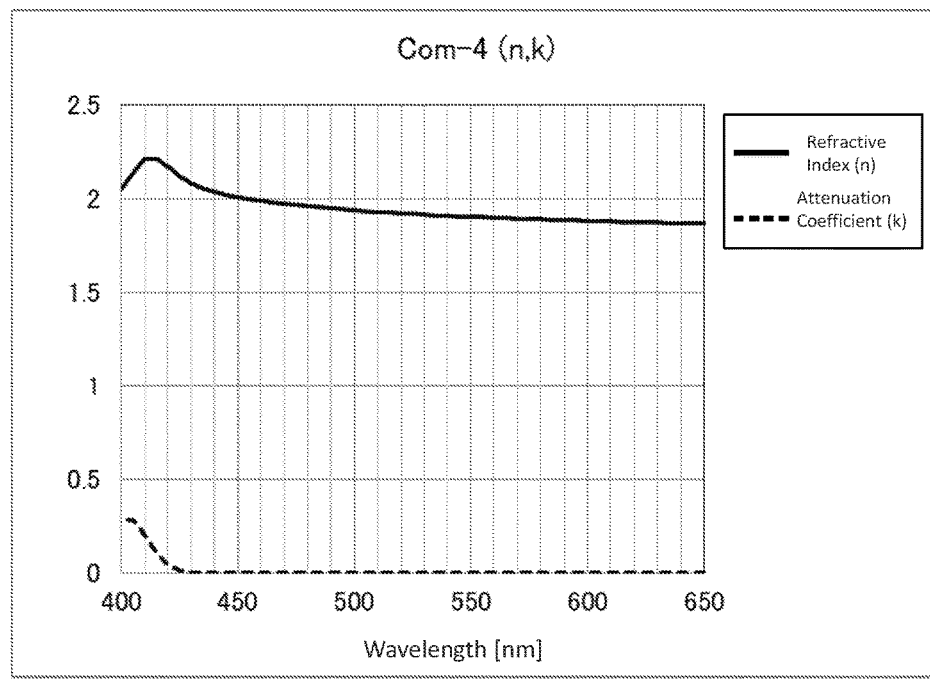
FIG. 14 shows a refractive index (n) and an attenuation coefficient (k) of Com-4 at a given wavelength.
Figure 15:
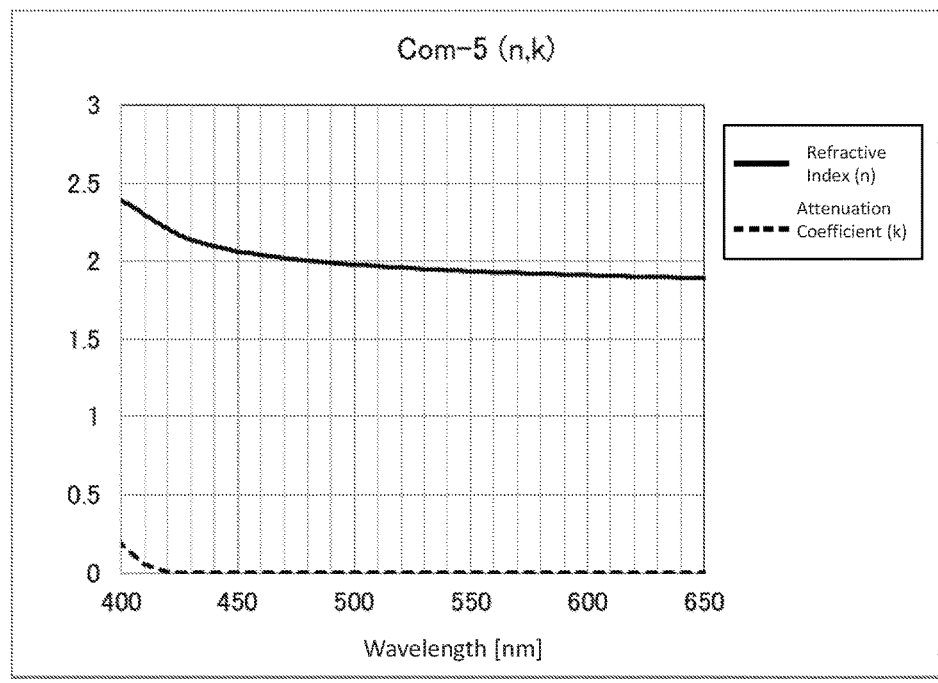
FIG. 15 shows a refractive index (n) and an attenuation coefficient (k) of Com-5 at a given wavelength.
Figure 16:
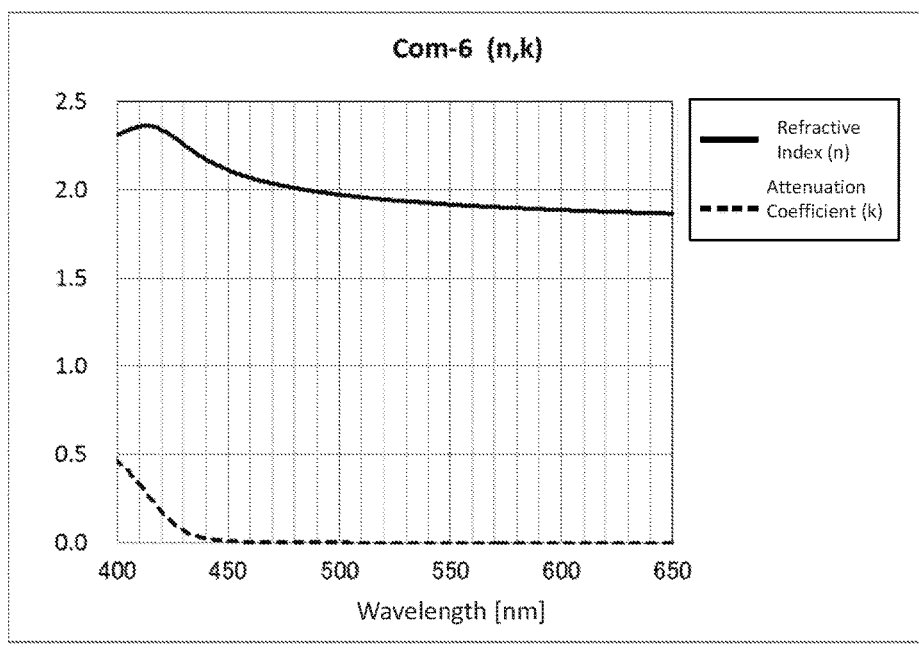
FIG. 16 shows a refractive index (n) and an attenuation coefficient (k) of Com-6 at a given wavelength.

In the light-emitting element having high light-emitting efficiency and high color purity by using the covering layer material, the covering layer is required to have high refractive index. From the optical simulation result shown in FIG. 1, when the covering layer is made of a material having greater attenuation coefficient, the resultant refractive index is higher, and the wavelength range corresponding to the high refractive index varies with the maximum absorption wavelength of the material of the covering layer. After further studies based on the foregoing result, the inventors come to learn that a material of the covering layer having superior properties in the organic light-emitting element, the material is preferably having its attenuation coefficient being greater than 0.10, at least one point in the wavelength range of 430 nm to 460 nm. For even higher refractive index, it is more preferable that the covering layer is made of a material having its attenuation coefficient being greater than 0.12 at least one point in the wavelength range of 430 nm to 460 nm. It is also found that, when the covering layer has good penetrability, the light-emitting efficiency is improved and an element with high color purity is obtained. Therefore, it is preferable that the material used for the layer with an improved light extraction has an attenuation coefficient in the wavelength range of 460 nm to 500 nm being 0.10 or below. As described above, a material of the covering layer with superior performance, the covering layer should include an organic material at least one point in the wavelength range of 430 nm to 460 nm with an attenuation coefficient being greater than 0.10, and in the wavelength range of 460 nm to 500 nm being 0.10 or below.

An organic material satisfying the above requirements preferably is a compound having one or more of thiophene-based structure, furan-based structure and pyrrole-based structure, or a compound having a pyrene-based structure, or a compound having an anthracene-based structure.

Use a material that meets the foregoing parametric requirements as the material of the resultant covering layer may achieve superior performance.

The compound that meets the parametric requirements and has thiophene-based structure, furan-based structure or pyrrole-based structure is described in detail below.

The attenuation coefficient and light-absorption coefficient has a relationship expressed in Equation (A) below, where, α: light-absorption coefficient, k: attenuation coefficient, ω: light frequency, c: velocity of light:

$$\alpha = \frac{2k\omega}{c} \quad (A)$$

As shown in Equation (A), the attenuation coefficient is in direct proportion to the light-absorption coefficient. Therefore, a material having a high light-absorption coefficient also has a high attenuation coefficient. Compounds of thiophene-based structure, furan-based structure and pyrrole-based structure have very high light-absorption coefficient due to structural characteristics, and therefore the attenuation coefficients are high, the compounds are expected to have high refractive index.

Further, compounds having thiophene-based structure, furan-based structure or pyrrole-based structure are easily modified by substituents, therefore at least one point in the wavelength range of 430 nm to 460 nm its attenuation coefficient is greater than 0.10, and in the wavelength range of 430 nm to 500 nm, the attenuation coefficient is 0.10 or below. For this reason, the compounds preferably have thiophene-based structure, furan-based structure or pyrrole-based structure.

In the present invention, the compound having thiophene-based structure, furan-based structure or pyrrole-based structure is represented by Formula (1):

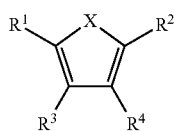

(1)

where X is a sulfur atom, an oxygen atom or N—R;

R is one or more selected from the group consisting of hydrogen, deuterium, substitutable alkyl, cycloalkyl, heterocyclyl, alkenyl, cycloalkenyl, alkynyl, alkoxy, alkylthio, arylether, arylsulfide, aryl, heteroaryl, carbonyl, carboxyl, oxycarbonyl, carbamoyl, alkylamino and silyl;

wherein, $R^1$ to $R^4$ may be identical or different, and each is one or more selected from the group consisting of hydrogen, deuterium, halogen, substitutable alkyl, cycloalkyl, heterocyclyl, alkenyl, cycloalkenyl, alkynyl, alkoxy, alkylthio, arylether, arylsulfide, aryl, heteroaryl, cyano, carbonyl, carboxyl, oxycarbonyl, carbamoyl, alkylamino and silyl, and may be bonded with an adjacent substituent to form a ring; when substitution is made, the substituent is one or more selected from the group consisting of deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino, and C3-C15 silyl that has 1 to 5 silicon atoms.

In the radical group represented by $R^1$ to $R^4$, the alkyl is preferably C1-C20 alkyl; and more preferably one or more saturated aliphatic hydrocarbyls such as methyl, ethyl, n-propyl, isopropyl, n-butyl, sec-butyl and tetra-butyl. The alkyl may be with or without a substituent.

The cycloalkyl is preferably C3-C20 cycloalkyl; and more preferably one or more saturated aliphatic cyclic hydrocarbyls such as cyclopropyl, cyclohexyl, norbornyl and adamantyl.

The cycloalkyl may be with or without a substituent.

The heterocyclyl is preferably C3-C20 heterocyclyl; and more preferably one or more aliphatic rings having atoms other than carbon such as pyran ring, piperidine ring, and cyclic amide. The heterocyclyl may be with or without a substituent.

The alkenyl is preferably C2-C20 alkenyl; and more preferably one or more unsaturated aliphatic hydrocarbyls containing a double bond such as vinyl, allyl and butadienyl. The alkenyl may be with or without a substituent.

The cycloalkenyl is preferably C3-C20 cycloalkenyl; and more preferably one or more unsaturated aliphatic cyclic hydrocarbonsyls containing a double bond such as cyclopentenyl, cyclopentadienyl and cyclohexenyl. The cycloalkenyl may be with or without a substituent.

The alkynyl is preferably C2-C20 alkynyl; and more preferably an unsaturated aliphatic hydrocarbyl containing a triple bond such as ethynyl. The alkynyl may be with or without a substituent.

The alkoxy is preferably C1-C20 alkoxy; and more preferably one or more functional groups bonded with aliphatic hydrocarbyls via ether bonds such as methoxy, ethoxy and propoxy. The aliphatic hydrocarbyl may be with or without a substituent.

The alkylthio is a radical group in which oxygen atoms of alkoxy are replaced with sulfur atoms. It is preferably C1-C20 alkylthio; the alkyl of alkylthio may be with or without a substituent.

The arylether is preferably C6-C60 arylether; and more preferably a functional group bonded with aromatic hydrocarbon groups via ether bonds such as phenoxy. The arylether may be with or without a substituent.

The arylsulfide is a radical group in which oxygen atoms of ether bonds of arylether are replaced with sulfur atoms. It is preferably C6-C60 arylsulfide. The aromatic hydrocarbon groups in arylsulfide may be with or without a substituent.

The aryl is preferably C6-C60 aryl; and more preferably one or more aromatic hydrocarbon groups such as phenyl, naphthyl, biphenyl, phenanthryl, terphenyl and pyrene. The aryl may be with or without a substituent.

The heteroaryl is preferably C4-C60 aromatic heterocyclyl; and more preferably one or more from furyl, thienyl, pyrrole, benzofuranyl, benzothienyl, dibenzofuranyl, dibenzothienyl, pyridyl and quinolyl. The aromatic heterocyclyl may be with or without a substituent.

The halogen atom selected from fluorine, chlorine, bromine and iodine.

The carbonyl, carboxyl, oxycarbonyl, carbamoyl, and alkylamino may be with or without a substituent. The number of carbon atoms in the alkylamino substituent is not limited, while it is usually in the range of 2 to 60.

The silyl is expressed as a functional group having bonds bonded to silicon atoms, such as trimethylsilyl. Silyl may be with or without a substituent. The number of carbon atoms in silyl is not limited, while it is usually in the range of 3 to 20. In addition, the number of silicon atoms is in the range of 1 to 6.

The siloxy is expressed as a functional group that bonds silicon atoms through ether bonds, such as trimethylsiloxy. Siloxy may be with or without a substituent.

The substituent is one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino, and C3-C15 silyl that has 1 to 5 silicon atoms.

The compound having thiophene-based structure, furan-based structure or pyrrole-based structure as expressed by Formula (1) may create steric hindrance effects when having the same or different substituents substituted, thereby providing superior thin-film stability.

It is thus clear that when the covering layer is made of a compound having thiophene-based structure, furan-based structure or pyrrole-based structure with high refractive index and superior thin-film stability, the problem of improving both the light extraction efficiency and the ageing stability can be solved.

Since the compound of thiophene-based structure, furan-based structure or pyrrole-based structure with substituted amino exhibits excellent light-absorption coefficient, high attenuation coefficient may be obtained, and high refractive index is expectable.

In the present invention, the compound having thiophene-based structure, furan-based structure or pyrrole-based structure is preferably represented by Formula (2):

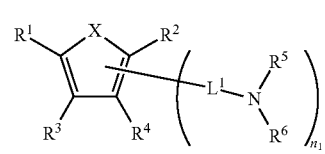

(2)

where X is a sulfur atom, an oxygen atom or N—R;

R is one or more selected from the group consisting of hydrogen, deuterium, substitutable alkyl, cycloalkyl, heterocyclyl, alkenyl, cycloalkenyl, alkynyl, alkoxy, alkylthio, arylether, arylsulfide, aryl, heteroaryl, carbonyl, carboxyl, oxycarbonyl, carbamoyl, alkylamino and silyl;

R¹ to R⁴ may be identical or different, and each is one or more selected from the group consisting of hydrogen, deuterium, halogen, substitutable alkyl, cycloalkyl, heterocyclyl, alkenyl, cycloalkenyl, alkynyl, alkoxy, alkylthio, arylether, arylsulfide, aryl, heteroaryl, cyano, carbonyl, carboxyl, oxycarbonyl, carbamoyl, alkylamino and silyl, and may be bonded with an adjacent substituent to form a ring;

$L^1$ is selected from arylene and heteroarylene and forms a single bond with one or more of $R^1$ to $R^4$;

$R^5$ and $R^6$ may be identical or different, and each of $R^5$ and $R^6$ is selected from substitutable alkyl, substitutable cycloalkyl, substitutable aryl, substitutable heteroaryl and substitutable heterocyclyl; and $n_1$ is an integer from 1 to 4, and at least one of $R^1$ to $R^4$ is bonded with $L^1$; when substitution is made, the substituent is one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C4-C55 aromatic heterocyclyl, carbonyl, carboxyl, oxycarbonyl, carbamoyl, C1-C40 alkylamino, and C3-C15 silyl that has 1 to 5 silicon atoms.

The arylene is preferably C6-C60 aryl; and more preferably one or more from aromatic hydrocarbon groups such as phenylene, naphthylene, biphenylene, phenanthrylene, terphenylene and pyrenylene. Arylene may be with or without a substituent.

The heteroarylene is preferably C4-C60 aromatic heterocyclyl; and more preferably one or more form furylene, thienylene, pyrrolidinylidene, benzofuranylene, benzothienylene, dibenzofuranylene, dibenzothienylene, pyridylene and quinolylene. Aromatic heterocyclylic group may be with or without a substituent.

The description of the other substituents is the same as that of the substituent described above.

In addition, as shown in the Lorentz-Lorent equation, refractive index is in a direct proportion to polarizability and density. A material having higher polarizability and higher density has a greater refractive index.

$$\frac{n^2-1}{n^2+2} = \frac{4}{3}\pi\frac{P_\lambda}{V}$$

n: Refractive Index, λ: Light Wavelength, $P_\lambda$: Polarizability, V: Molecular Volume Heteroaryl helps to enhance polarizability, thereby contributing to high refractive index. Furthermore, considering from aspects of non-crystalline and thin-film stability, in Formula (2), at least one of $R^5$ to $R^6$ is heteroaryl, and preferably pyridyl or quinolyl.

Moreover, considering from aspects of easy synthesis and heat resistance during the film formation in the process of heating evaporation, $n_1$ is preferably 1 or 2.

In the present invention, the compound having thiophene-based structure, furan-based structure or pyrrole-based structure is represented by Formula (3):

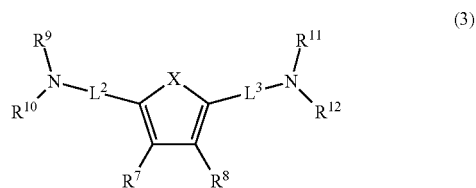

(3)

where X is a sulfur atom, an oxygen atom or N—R;

R is one or more selected from the group consisting of hydrogen, deuterium, substitutable alkyl, cycloalkyl, heterocyclyl, alkenyl, cycloalkenyl, alkynyl, alkoxy, alkylthio, arylether, arylsulfide, aryl, heteroaryl, carbonyl, carboxyl, oxycarbonyl, carbamoyl, alkylamino and silyl;

$R^7$ and $R^8$ may be identical or different, and each of $R^7$ and $R^8$ is one or more selected from the group consisting of hydrogen, deuterium, halogen, substitutable alkyl, cycloalkyl, heterocyclyl, alkenyl, cycloalkenyl, alkynyl, alkoxy, alkylthio, arylether, arylsulfide, aryl, heteroaryl, cyano, carbonyl, carboxyl, oxycarbonyl, carbamoyl, alkylamino and silyl, and may be bonded with an adjacent substituent to form a ring;

Each of $L^2$ and $L^3$ is selected from arylene and heteroarylene; and $R^9$ to $R^{12}$ may be identical or different, and is each one or more selected from the group consisting of substitutable alkyl, substitutable cycloalkyl, substitutable aryl, substitutable heteroaryl or substitutable heterocyclyl; when substitution is made, the substituent is selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C4-C55 aromatic heterocyclyl, carbonyl, carboxyl, oxycarbonyl, carbamoyl, C1-C40 alkylamino and C3-C15 silyl that has 1 to 5 silicon atoms.

The compound of thiophene-based structure, furan-based structure or pyrrole-based structure is not particularly limited, and the following are some examples.

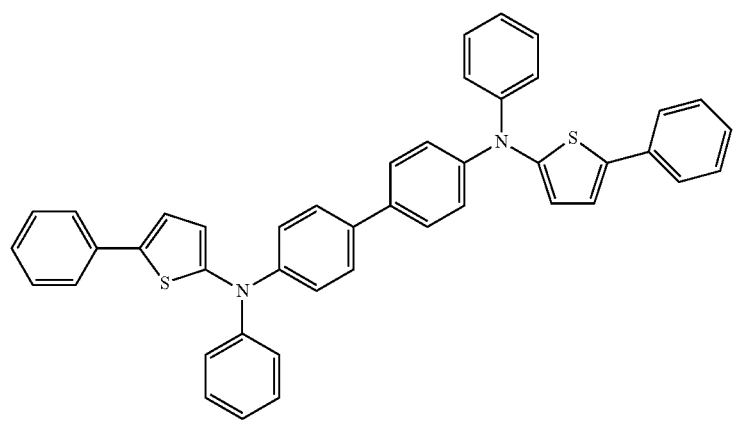

Cap001

-continued
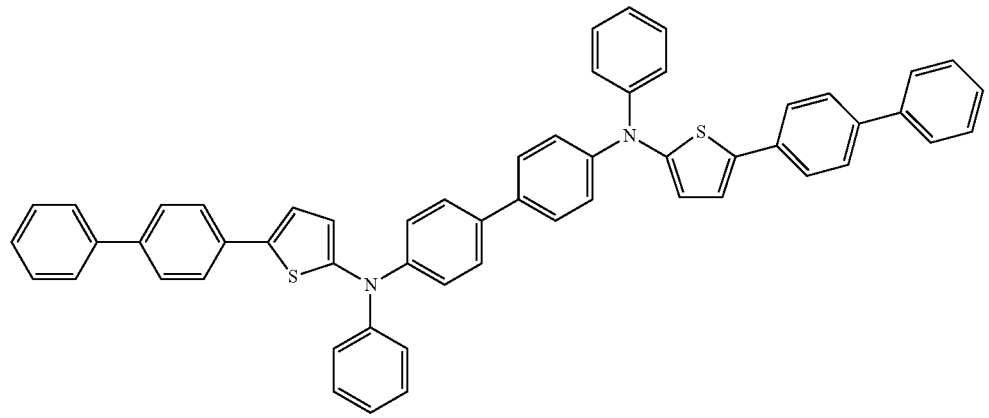
Cap002
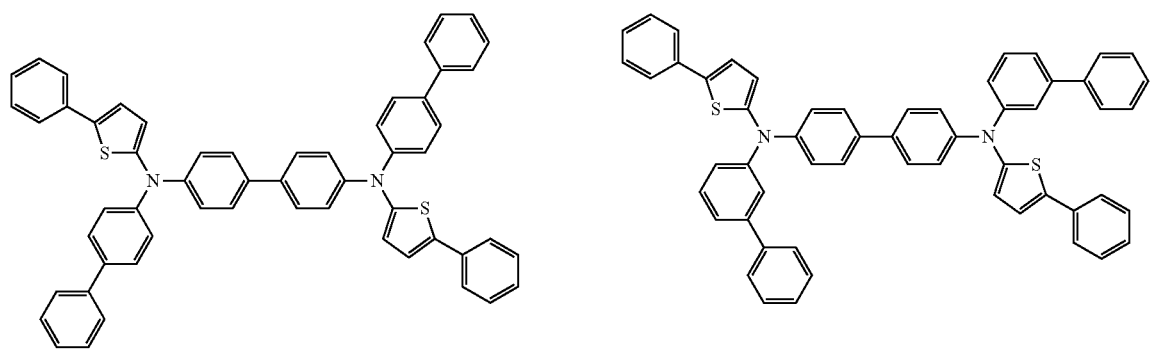
Cap003　　　Cap004
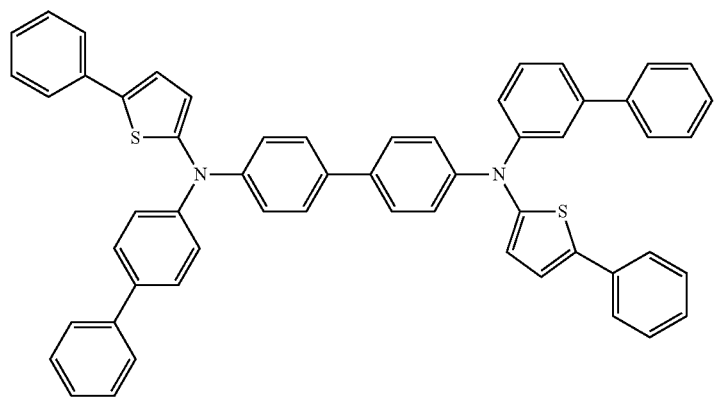
Cap005
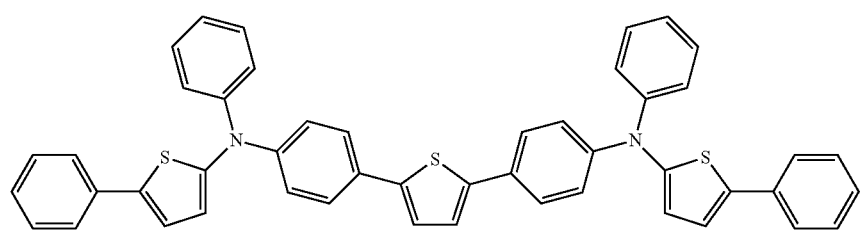
Cap006

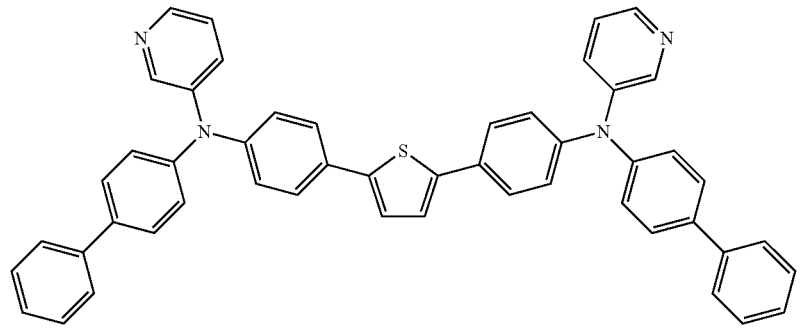
Cap007
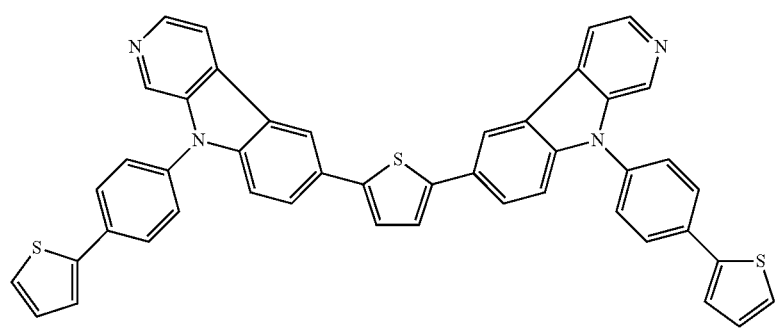
Cap008
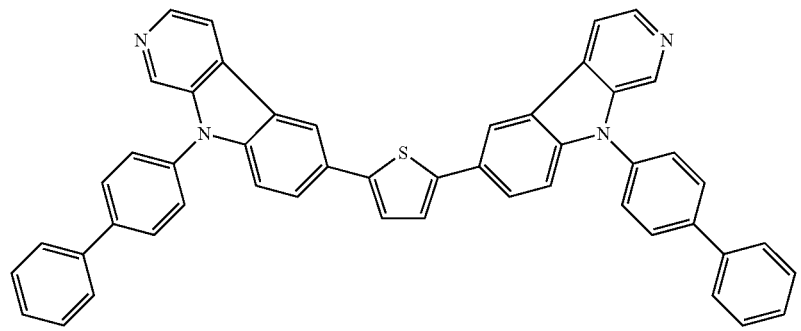
Cap009
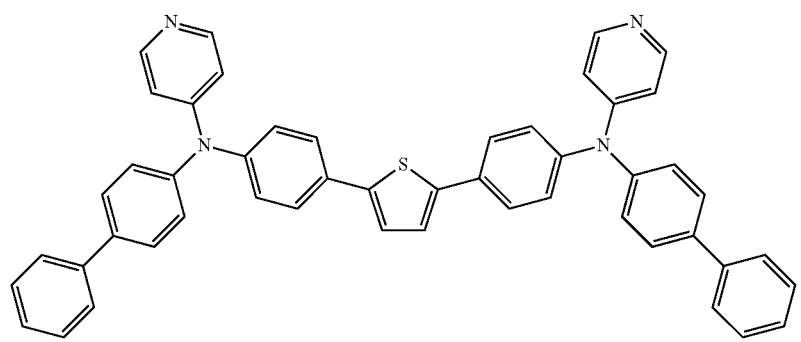
Cap010

-continued
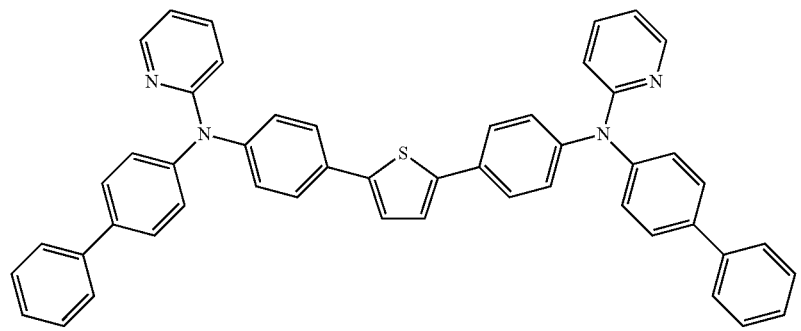
Cap011
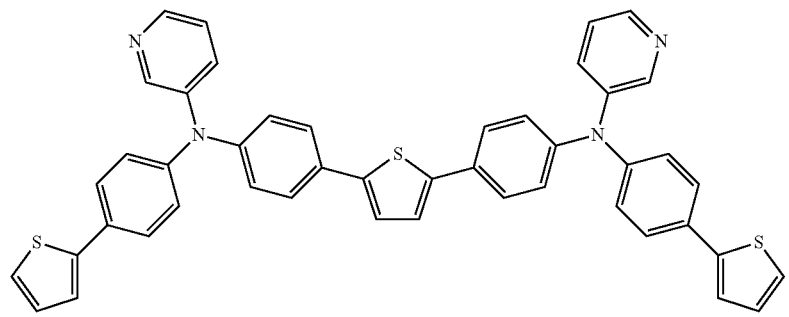
Cap012
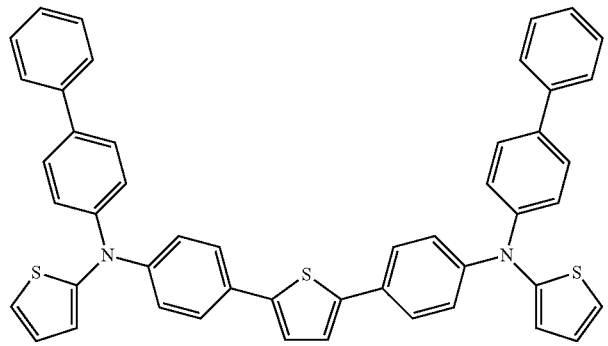
Cap013
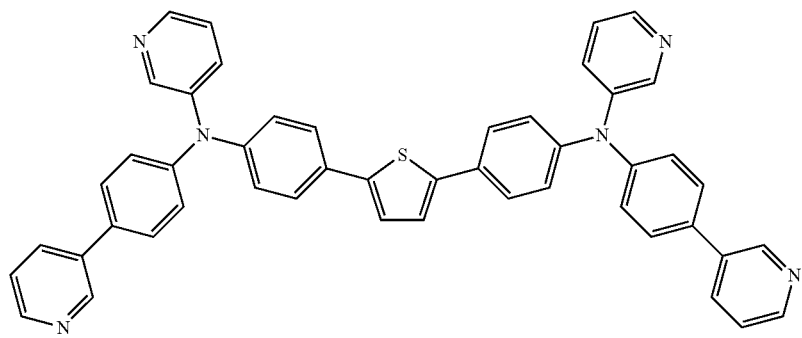
Cap014

-continued
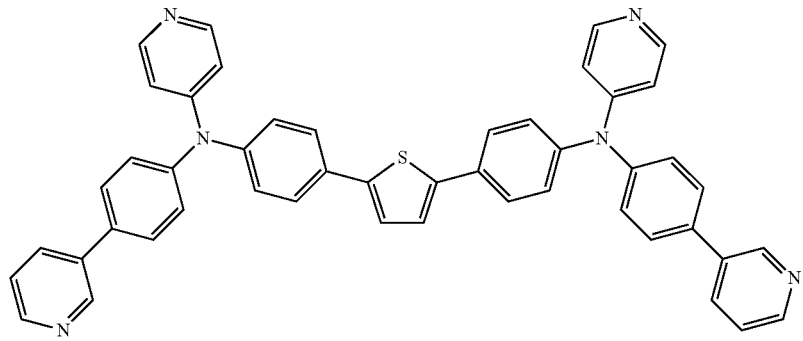
Cap015
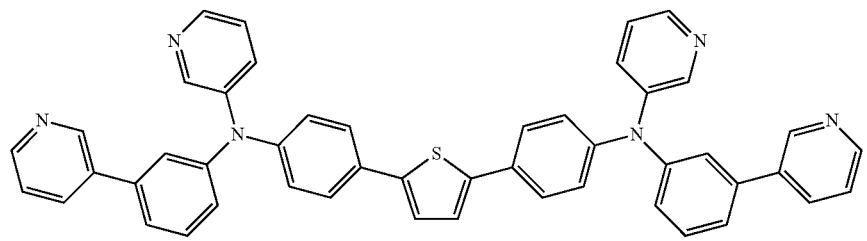
Cap016
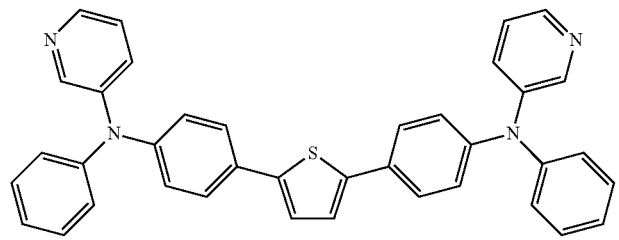
Cap017
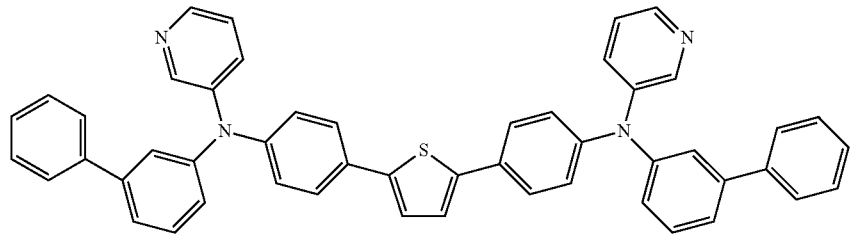
Cap018
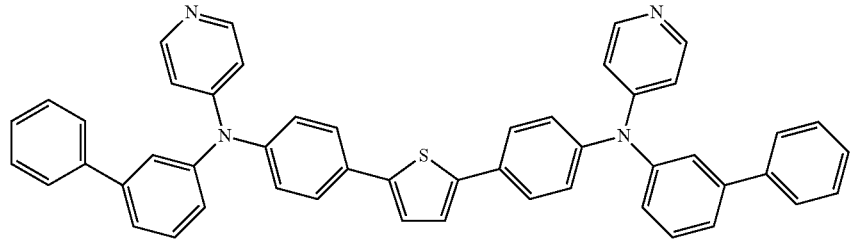
Cap019
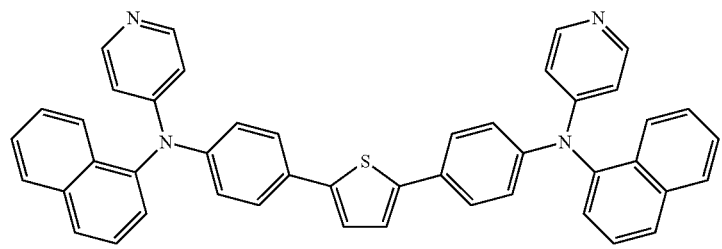
Cap020

-continued
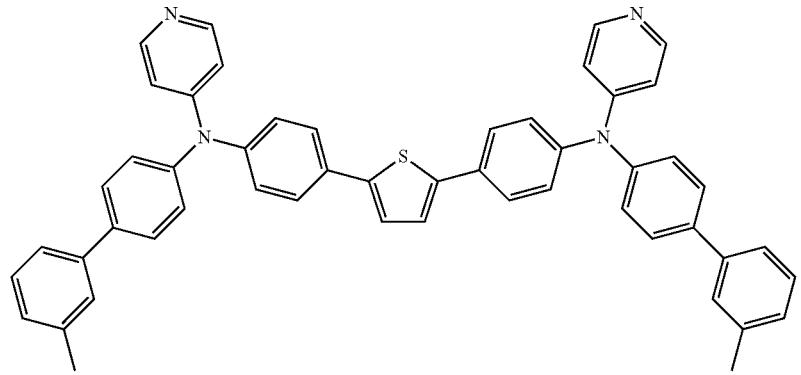
Cap021
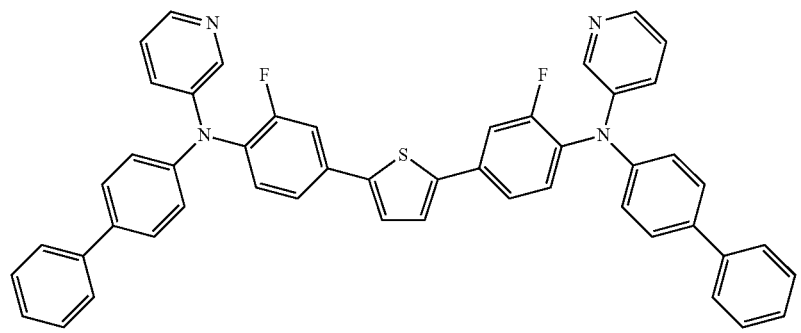
Cap022
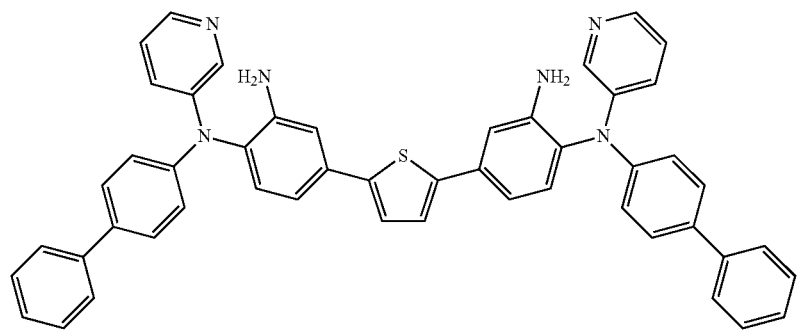
Cap023
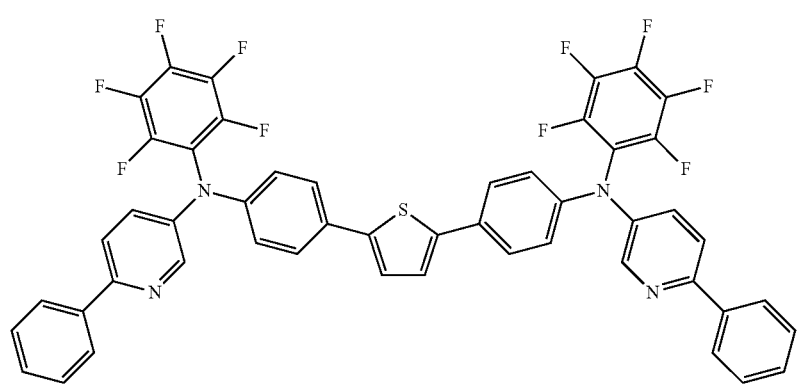
Cap024

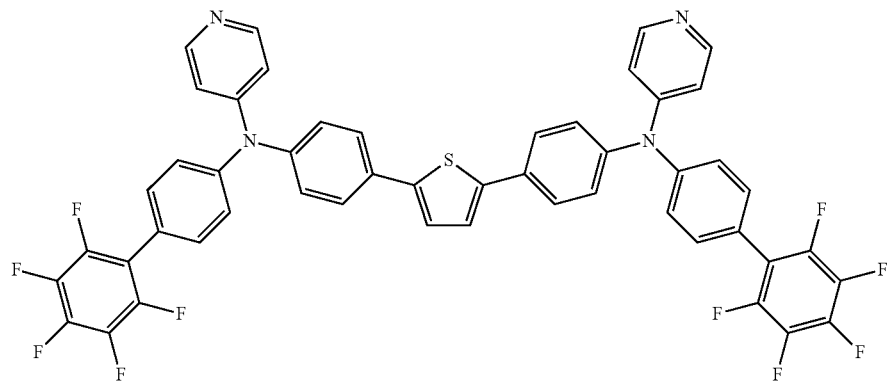
Cap025
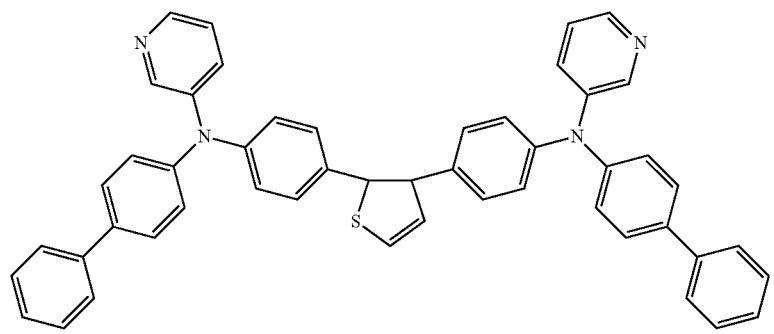
Cap026
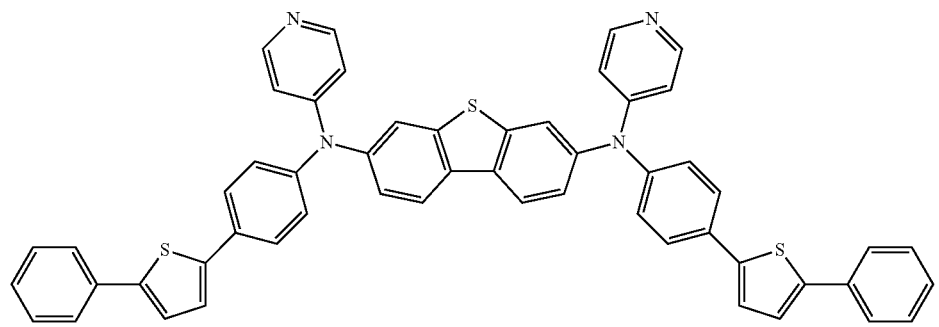
Cap027
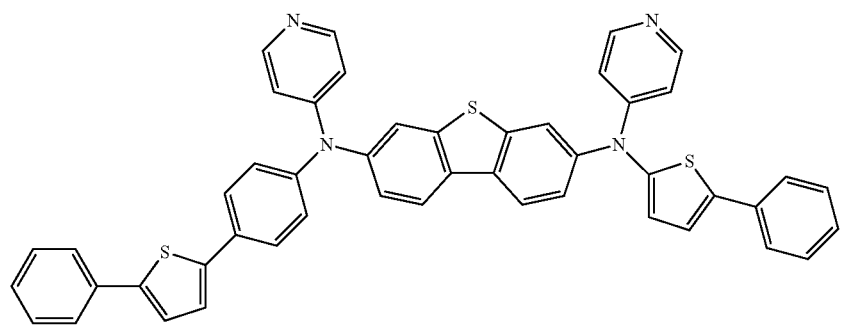
Cap028

-continued
Cap029
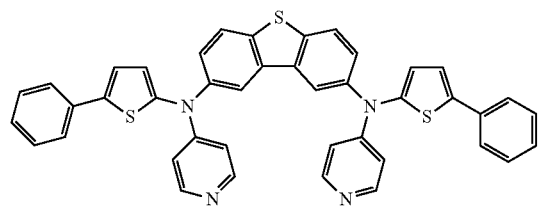
Cap030
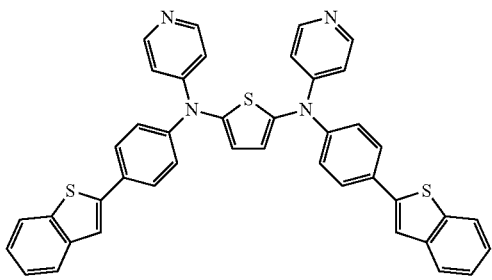
Cap031
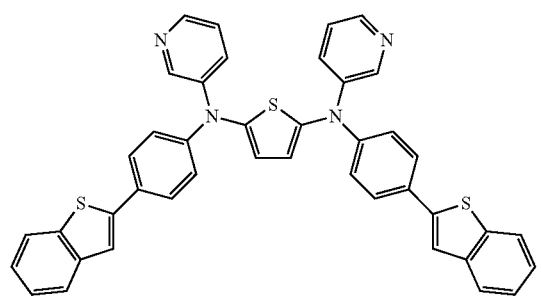
Cap032
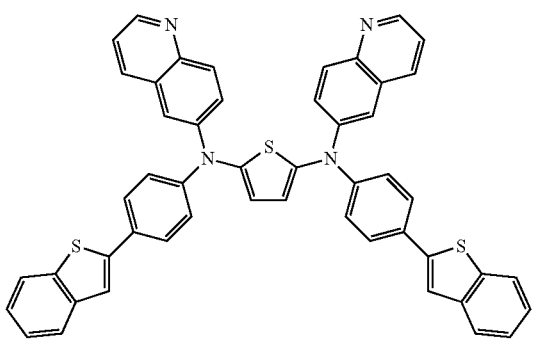
Cap033
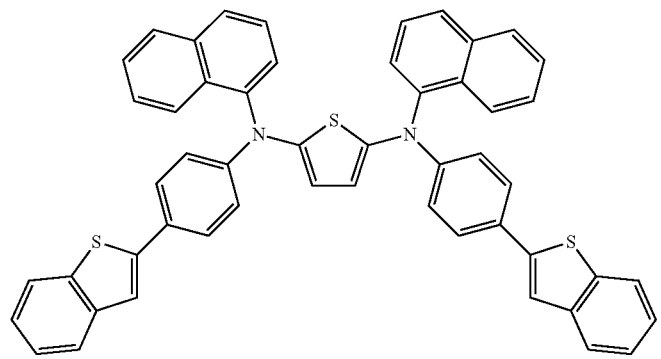
Cap034
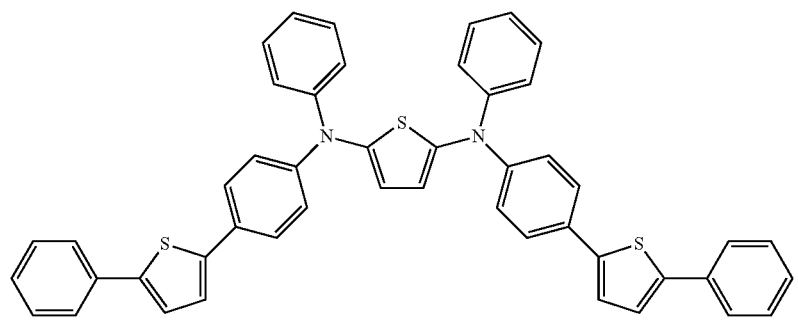

Cap035
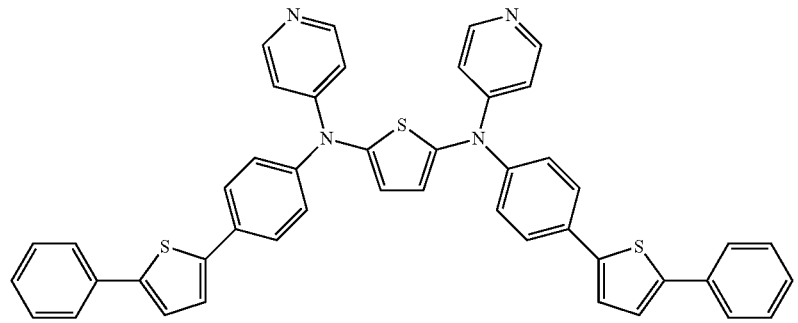
Cap036
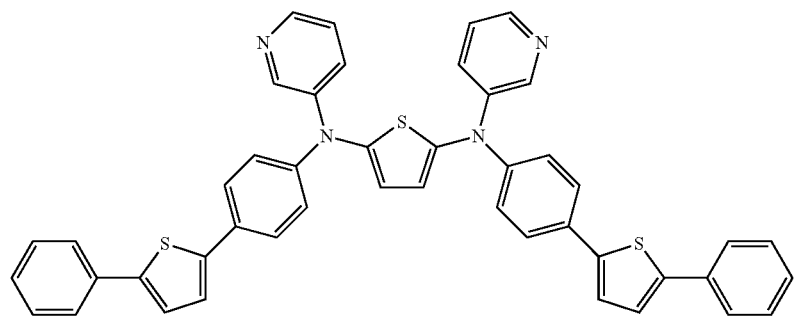
Cap037
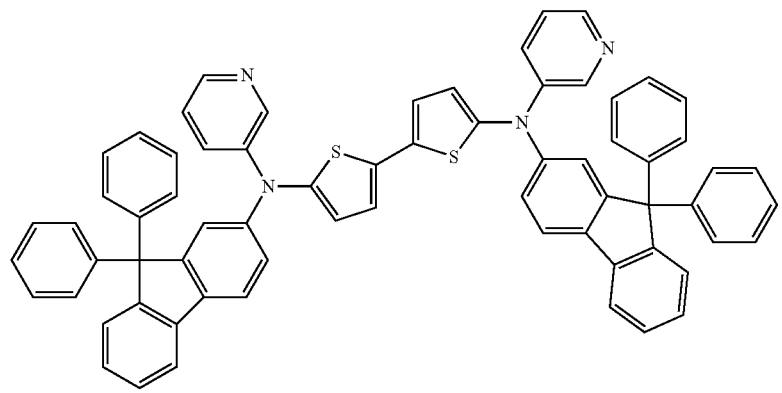
Cap038
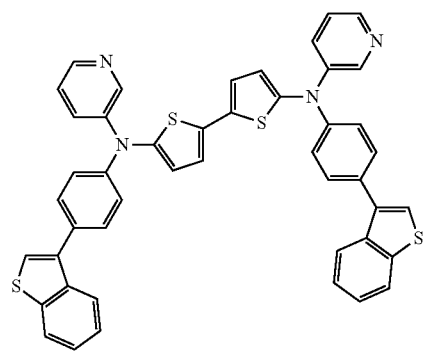
Cap039
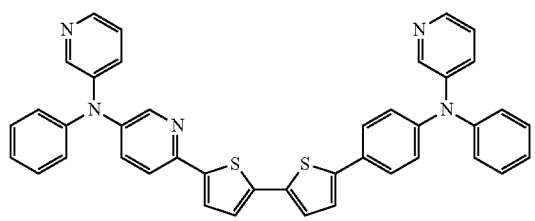

-continued
Cap040
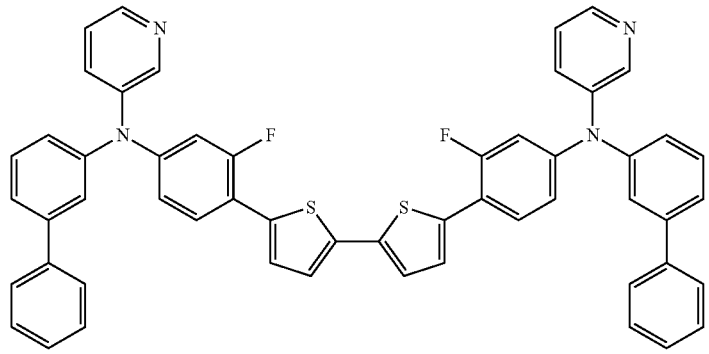
Cap041
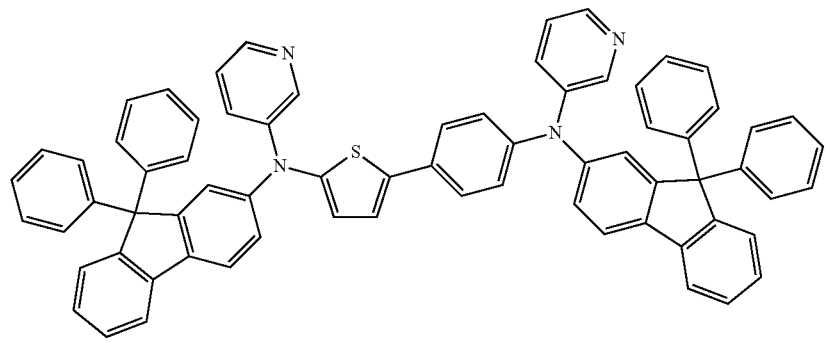
Cap042
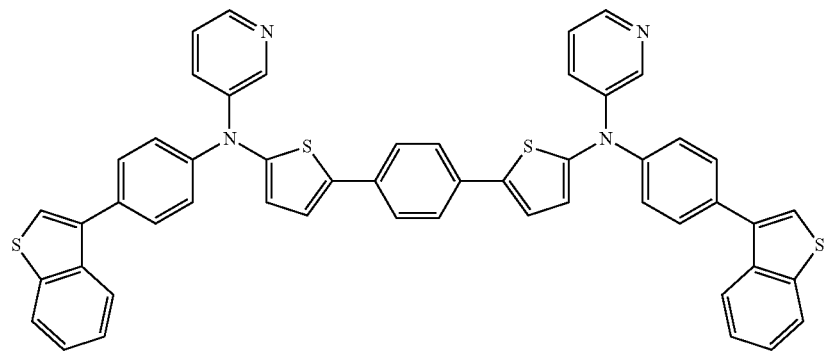
Cap043
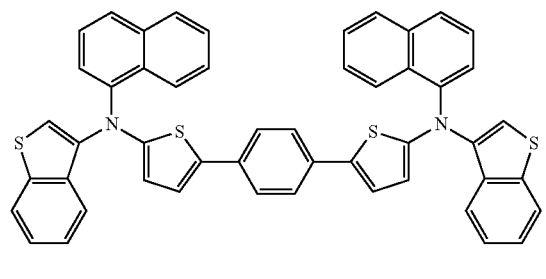
Cap044
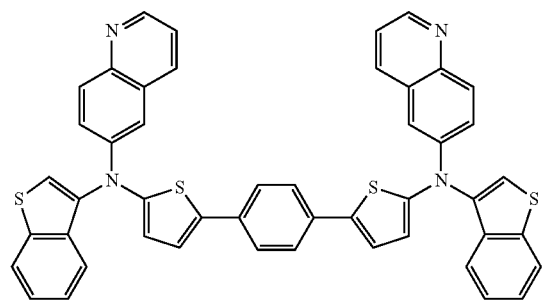

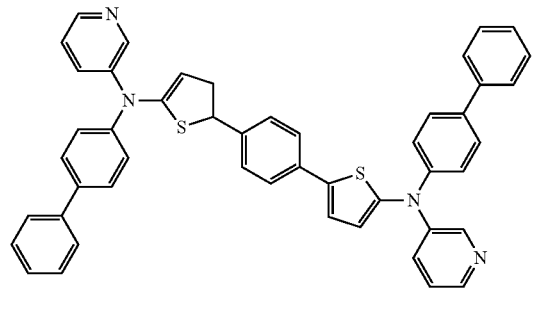
Cap045
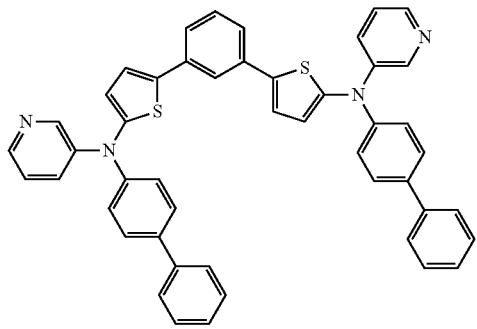
Cap046
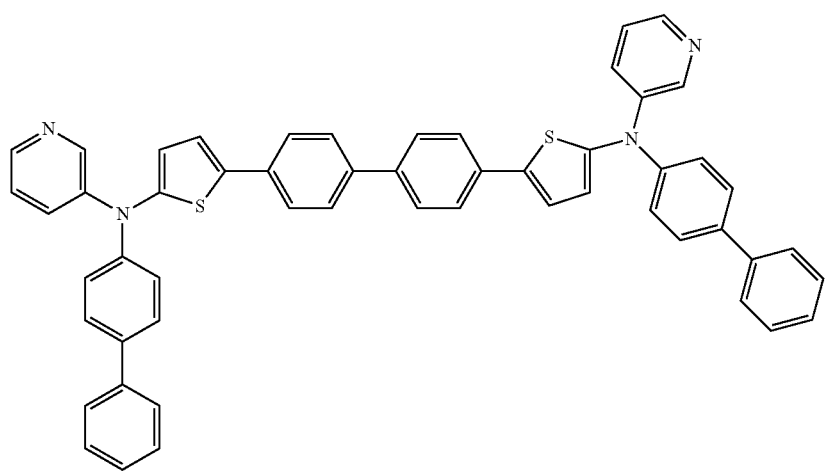
Cap047
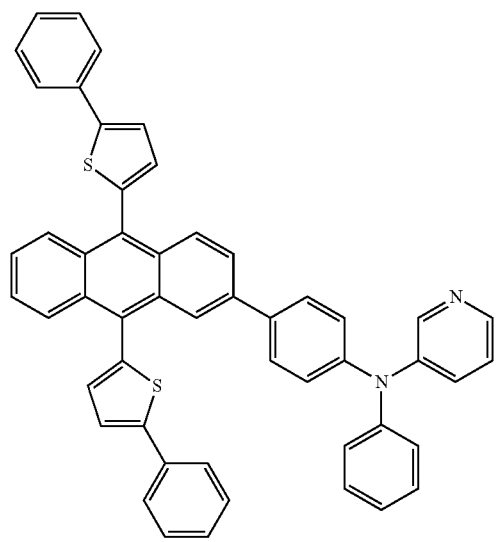
Cap048

-continued
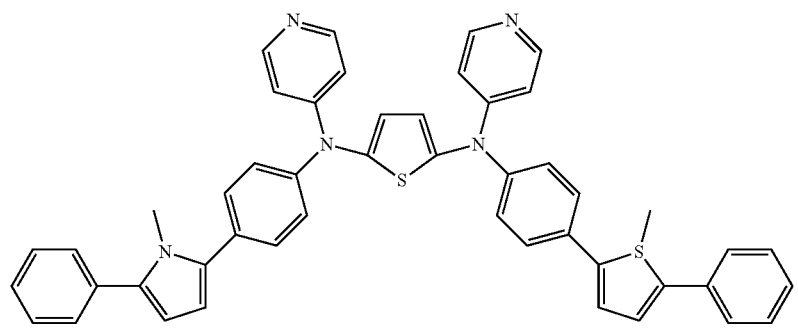
Cap049
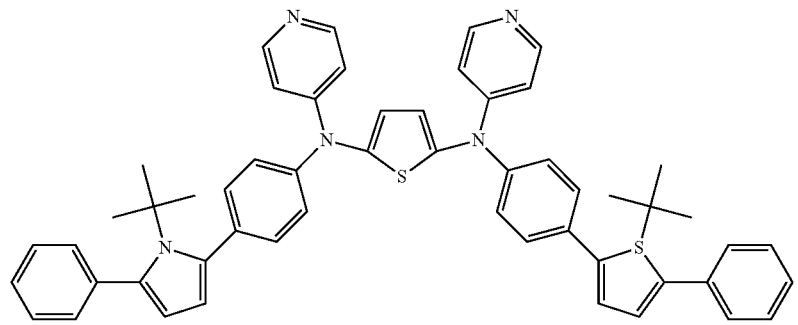
Cap050
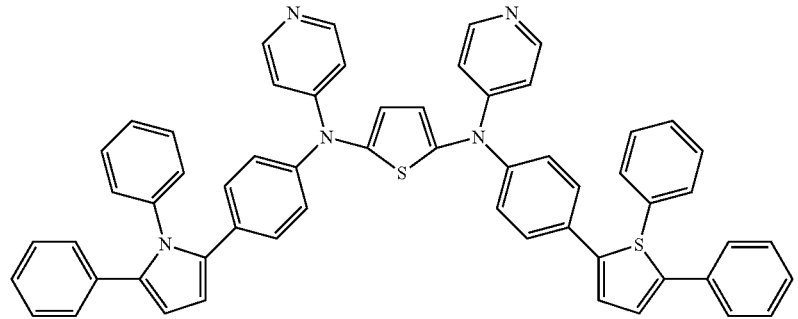
Cap051
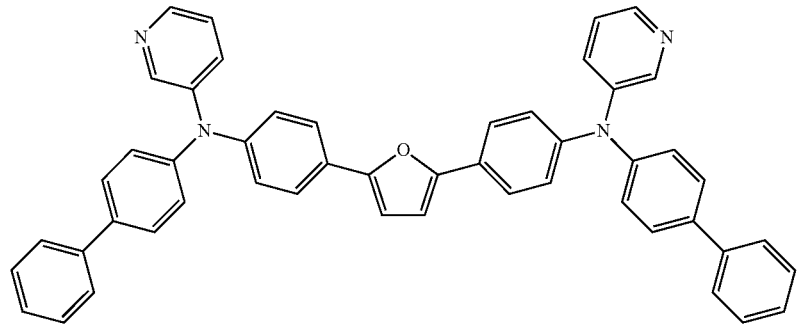
Cap052
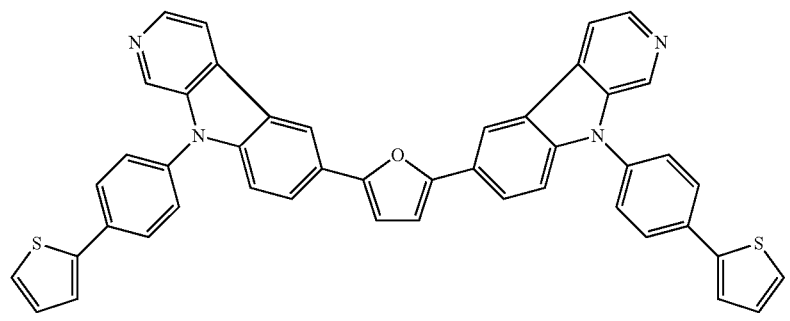
Cap053

-continued
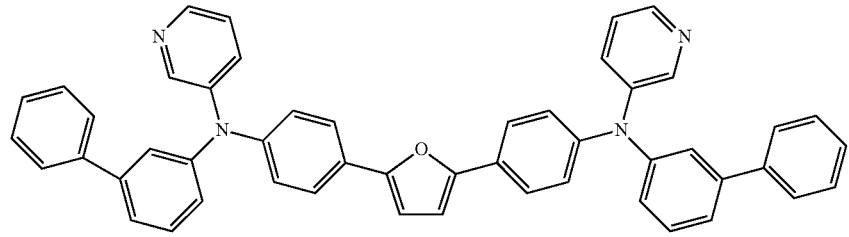
Cap054
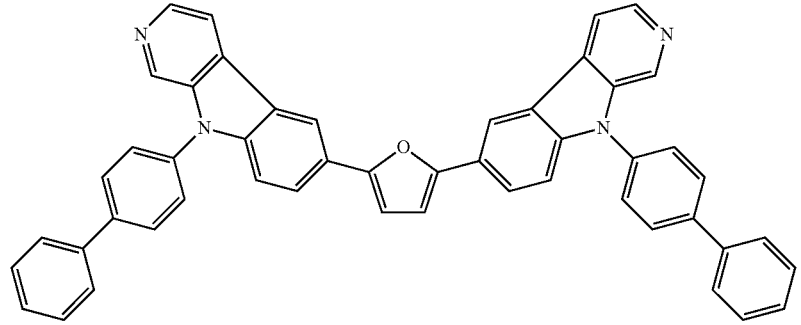
Cap055
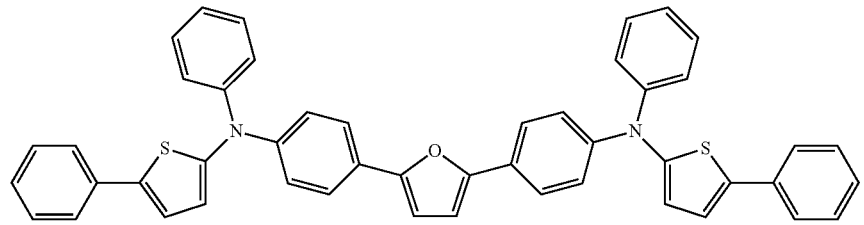
Cap056
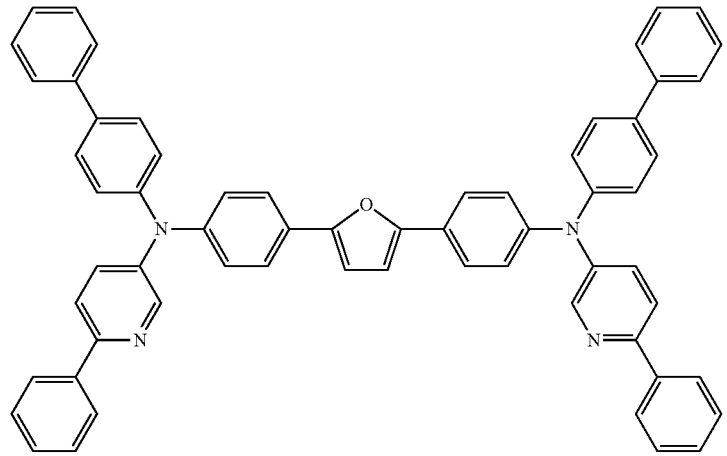
Cap057
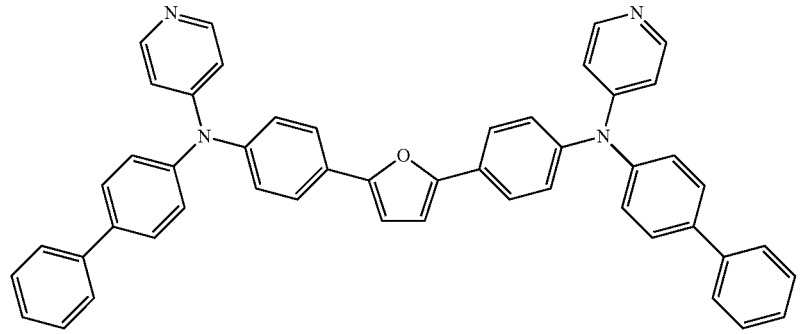
Cap058

-continued
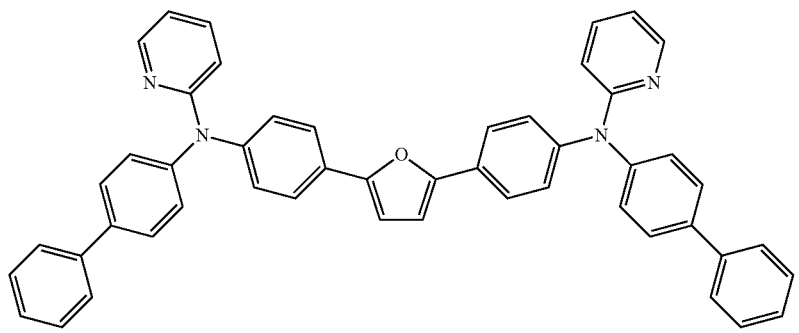
Cap059
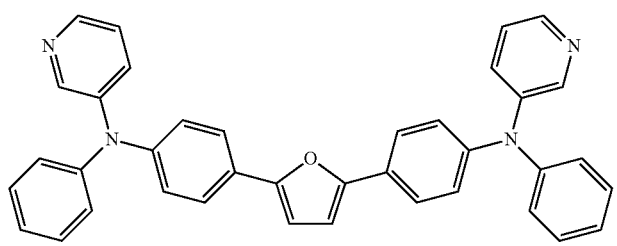
Cap060
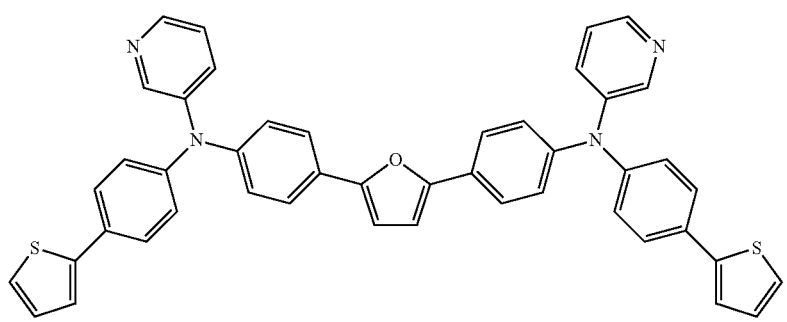
Cap061
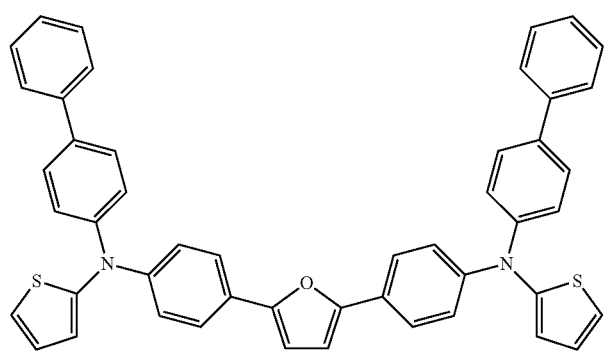
Cap062
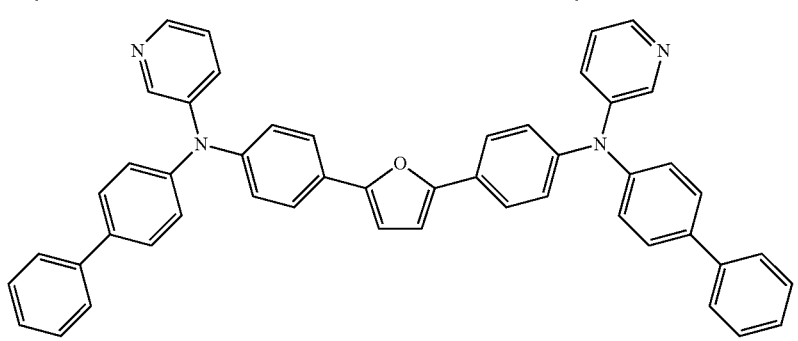
Cap063

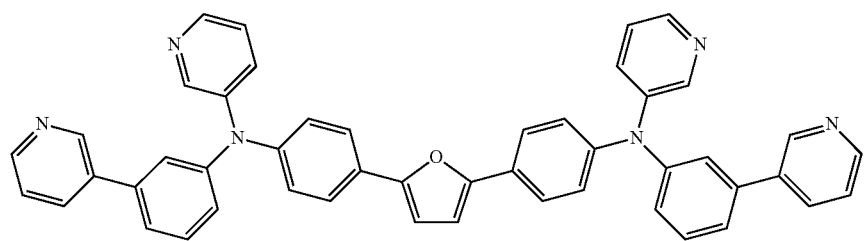
Cap064
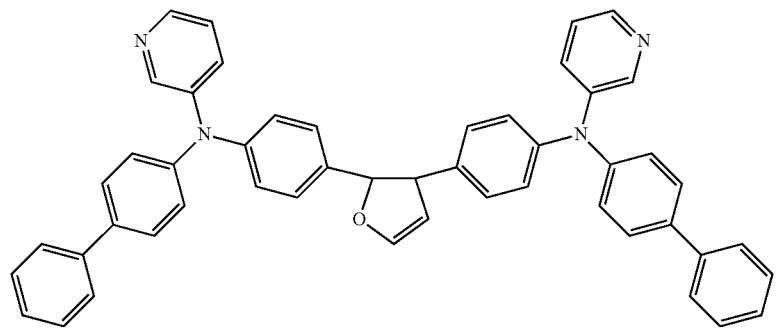
Cap065
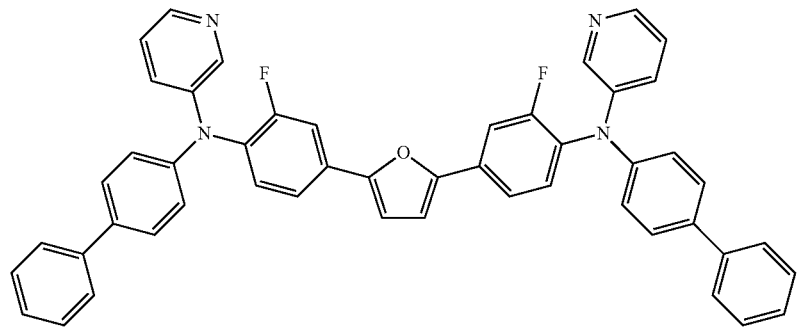
Cap066
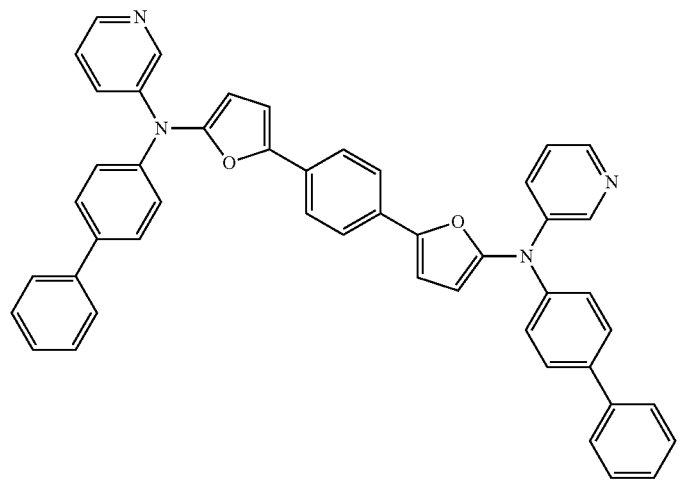
Cap067

-continued
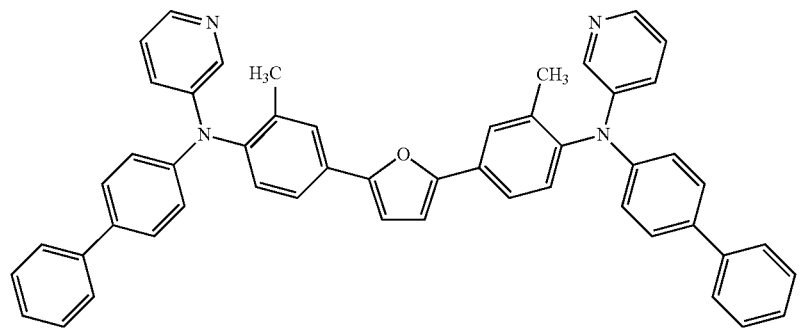
Cap068
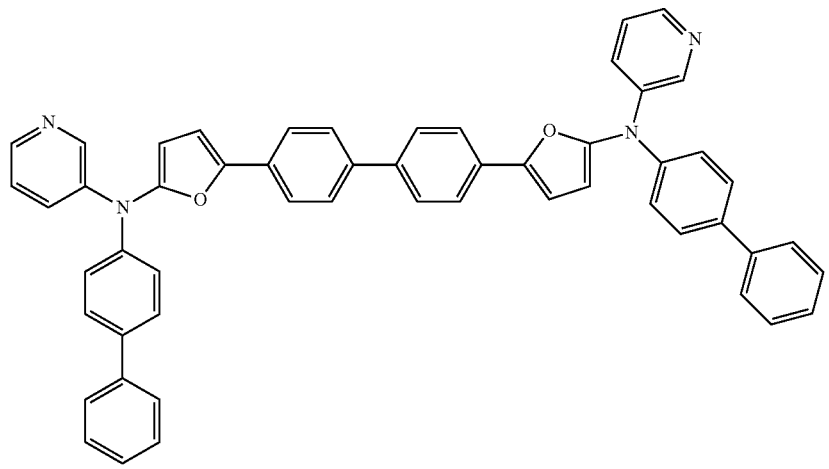
Cap069
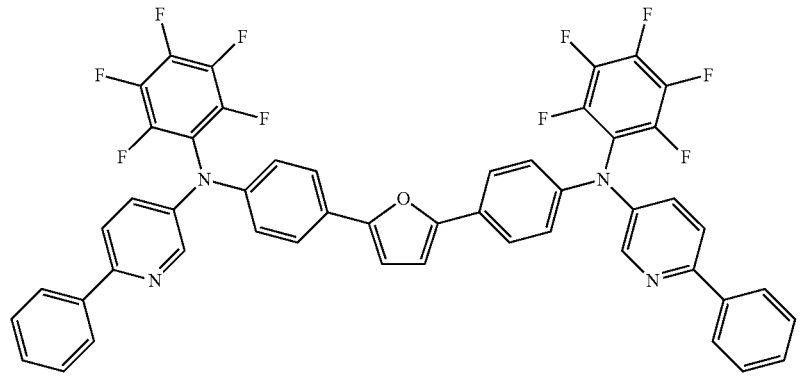
Cap070
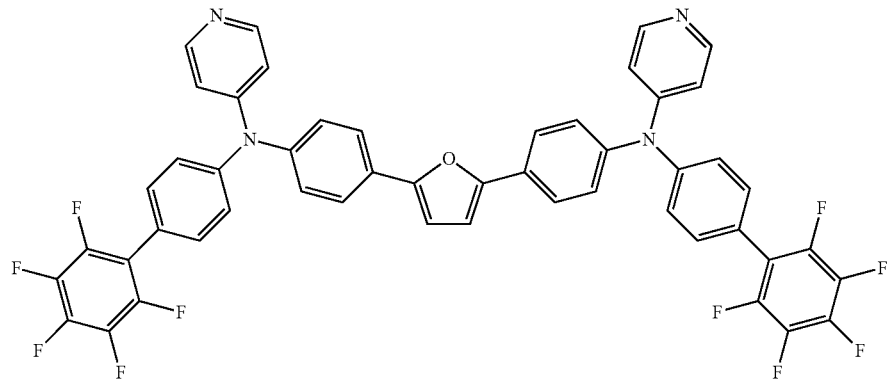
Cap071

-continued
Cap072
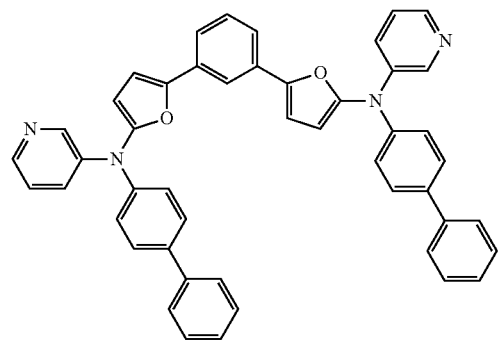
Cap073
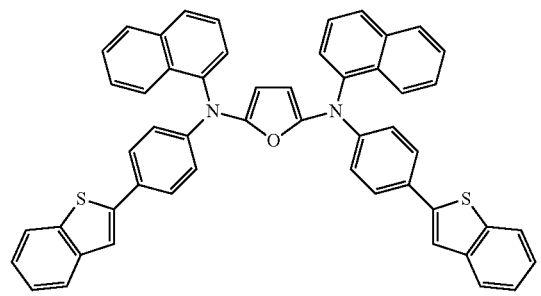
Cap074
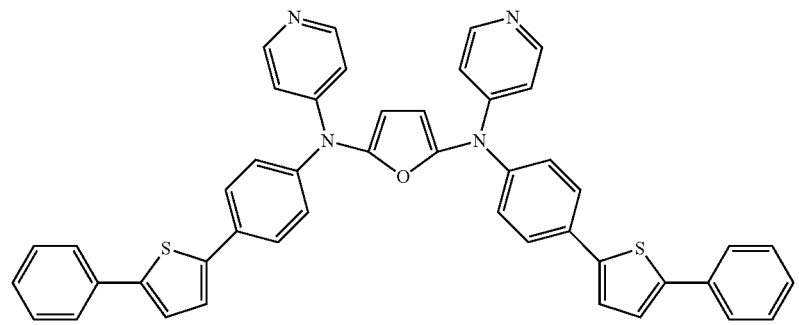
Cap075
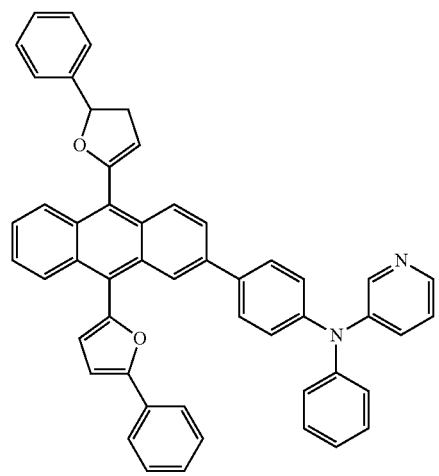
Cap076
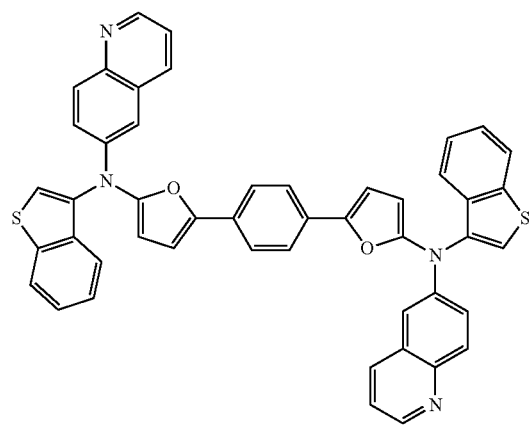
Cap077
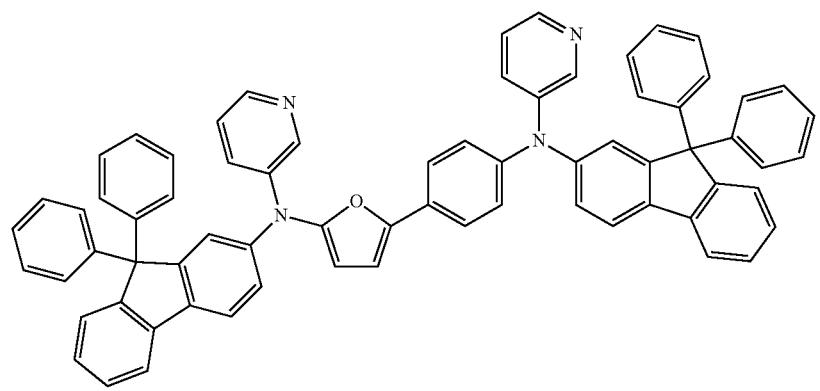

-continued
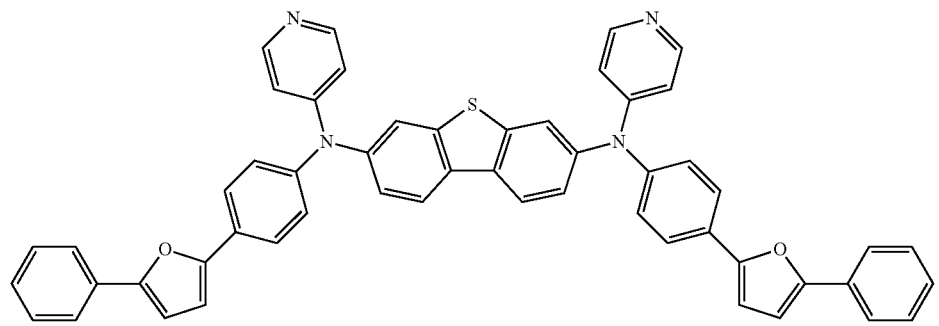
Cap078
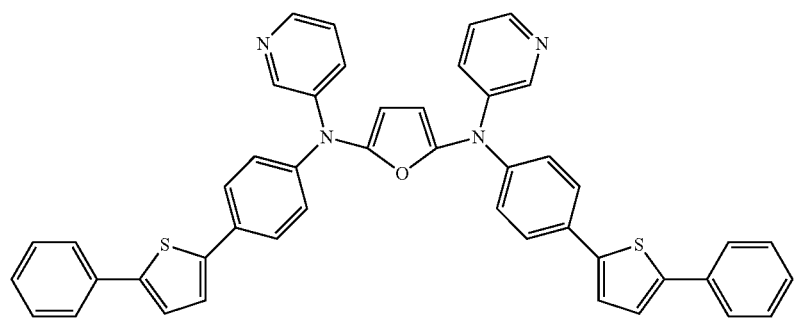
Cap079
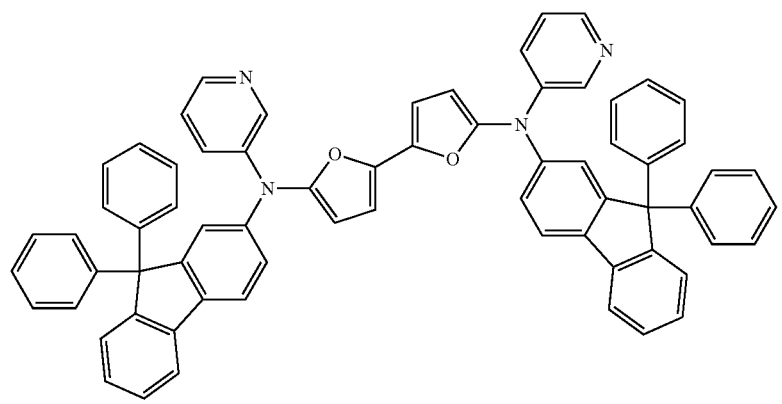
Cap080
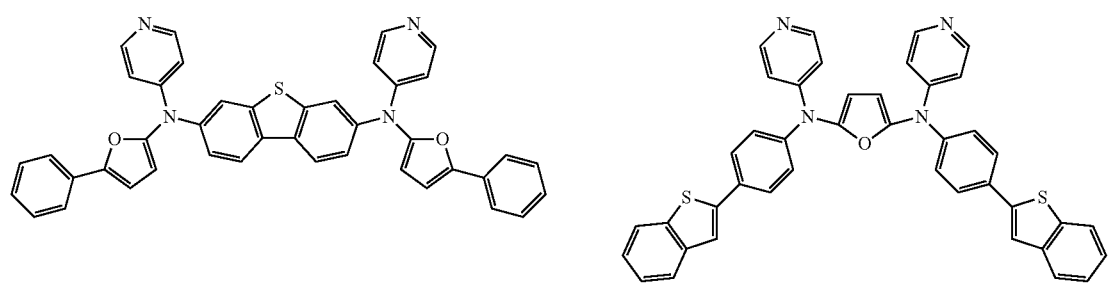
Cap081 Cap082

Cap083
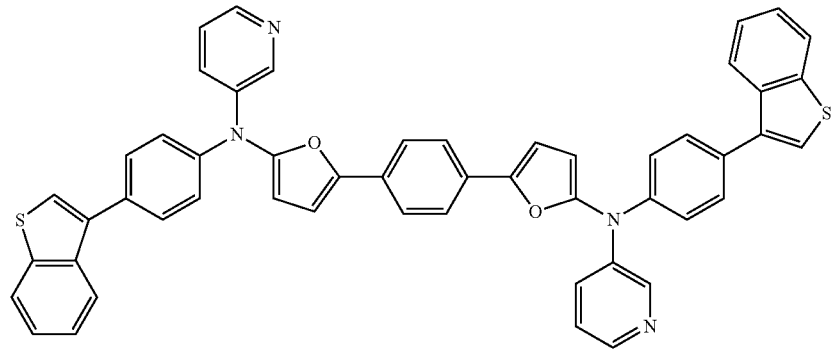
Cap084
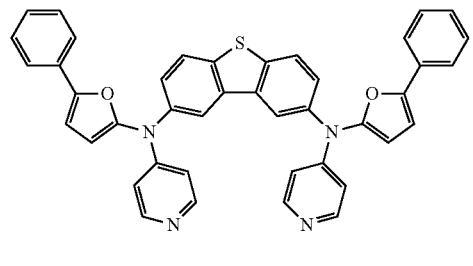
Cap085
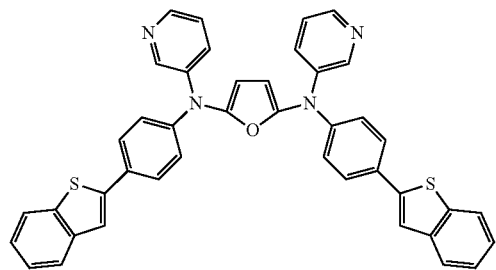
Cap086
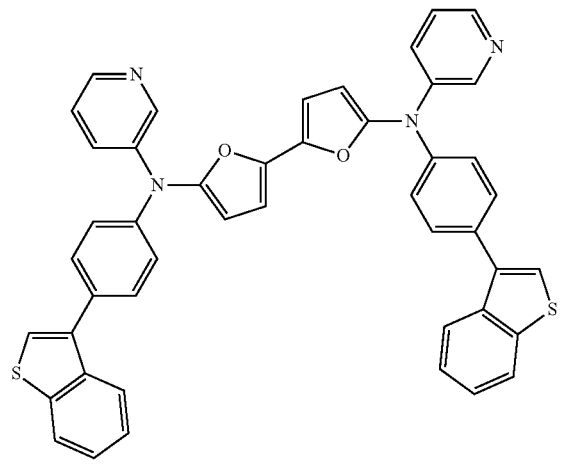
Cap087
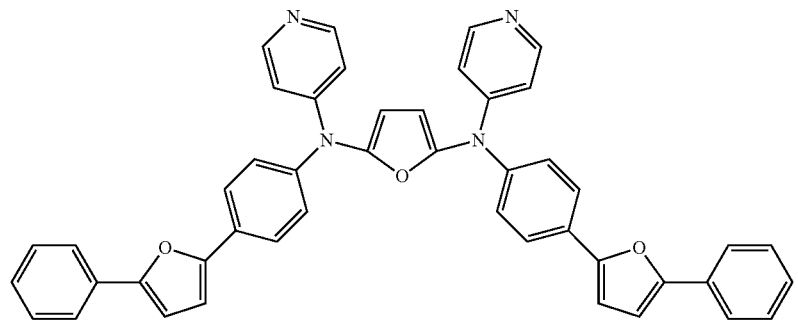

-continued
Cap088
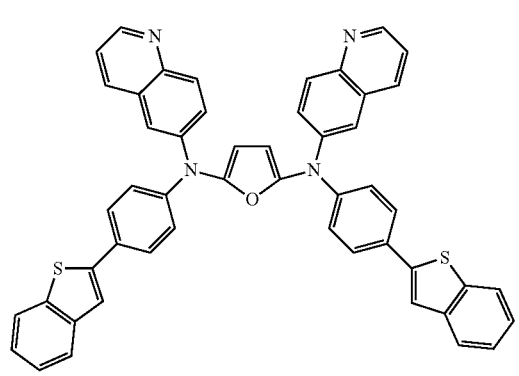
Cap089
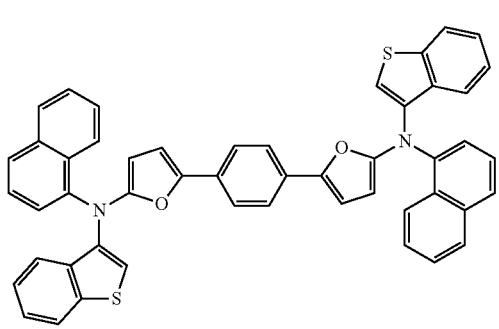
Cap090
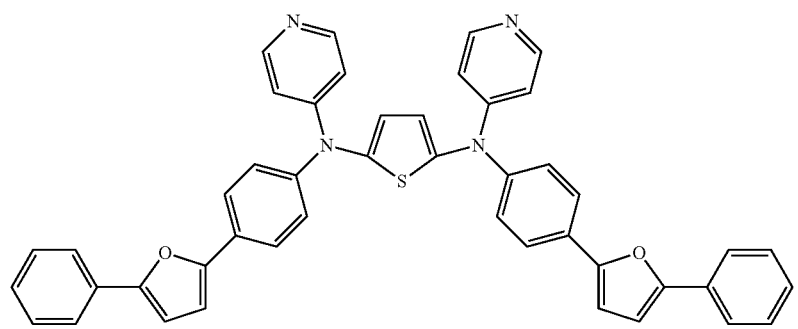
Cap091
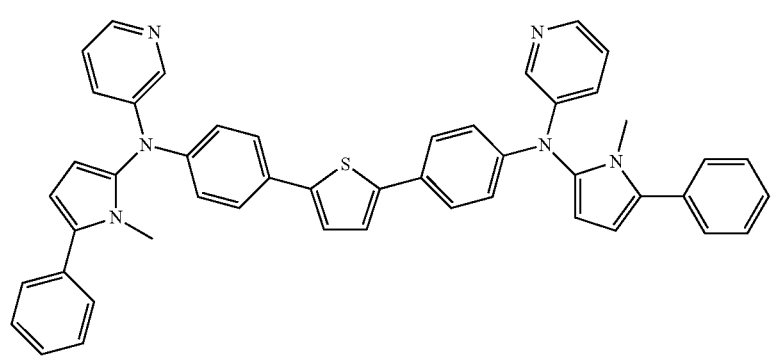
Cap092
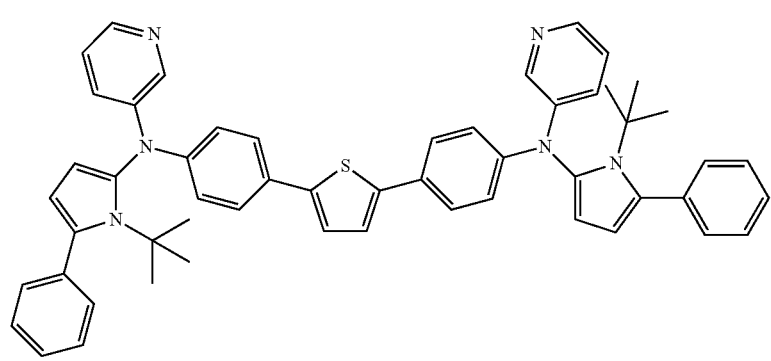

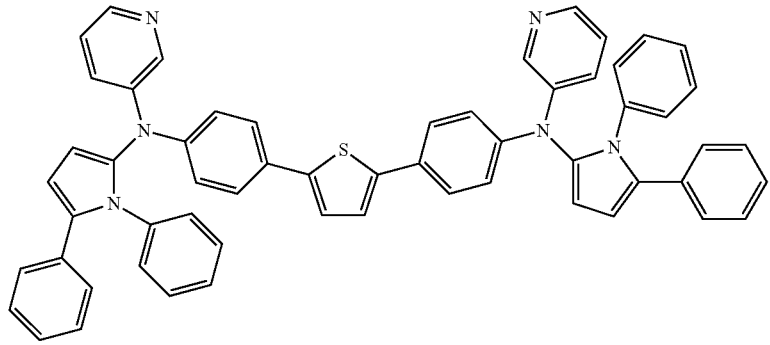
Cap093
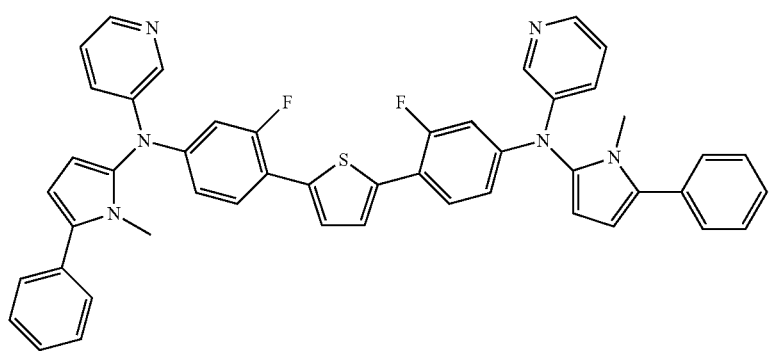
Cap094
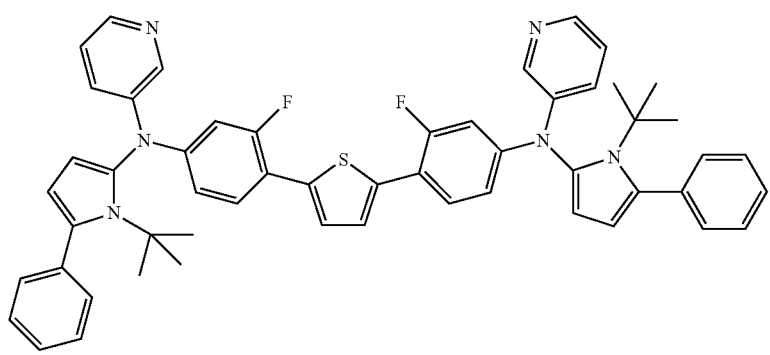
Cap095
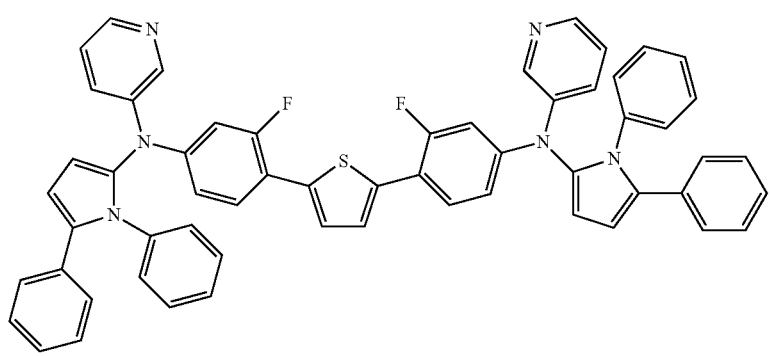
Cap096

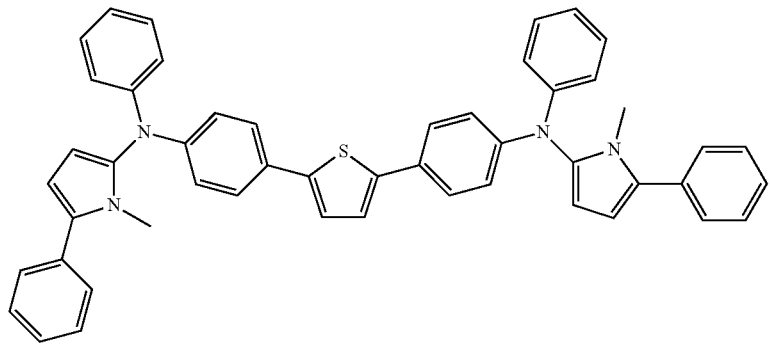
Cap097
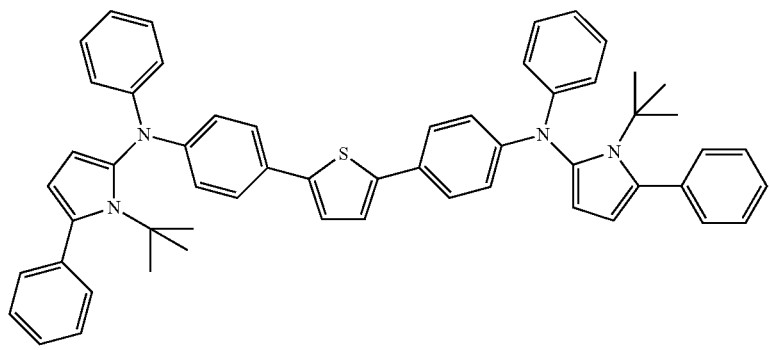
Cap098
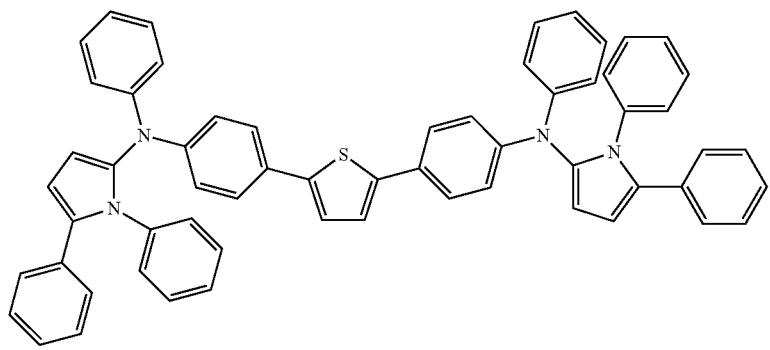
Cap099
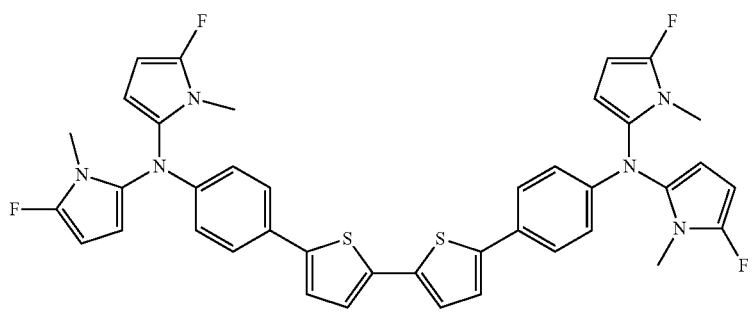
Cap100

-continued
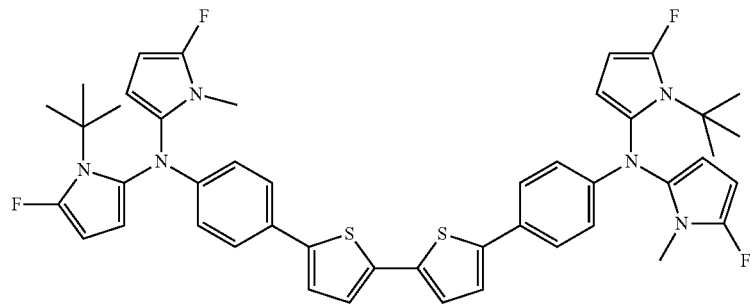
Cap101
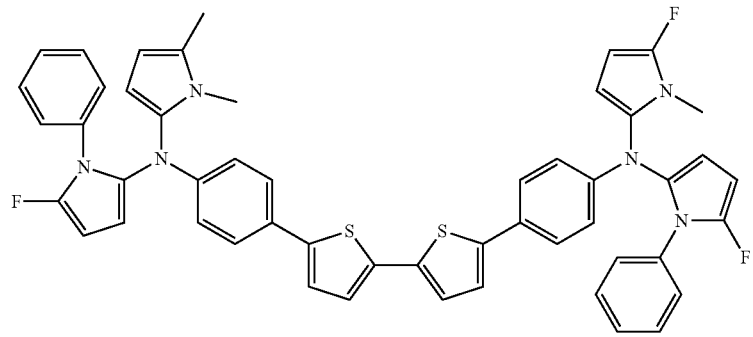
Cap102
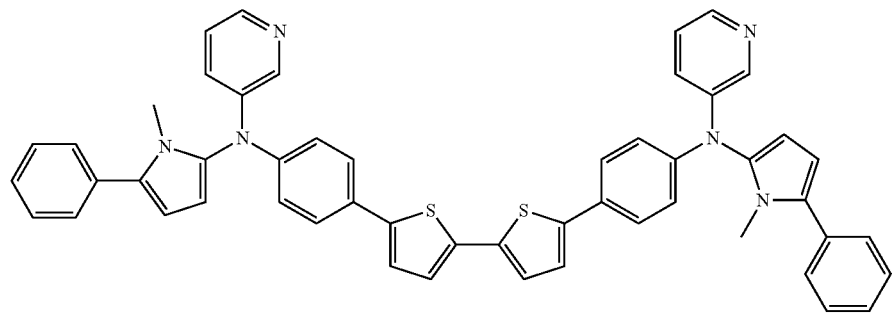
Cap103
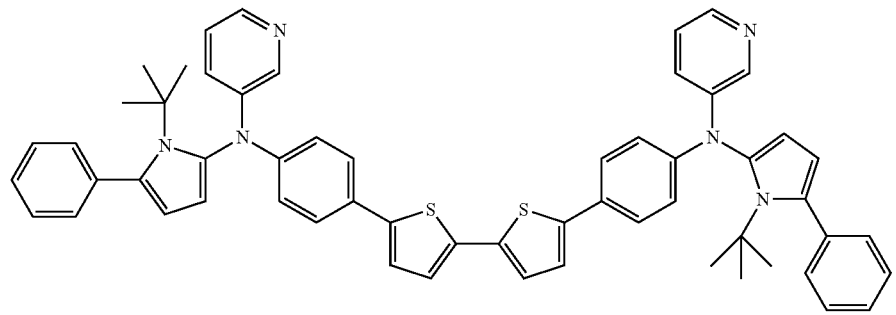
Cap104
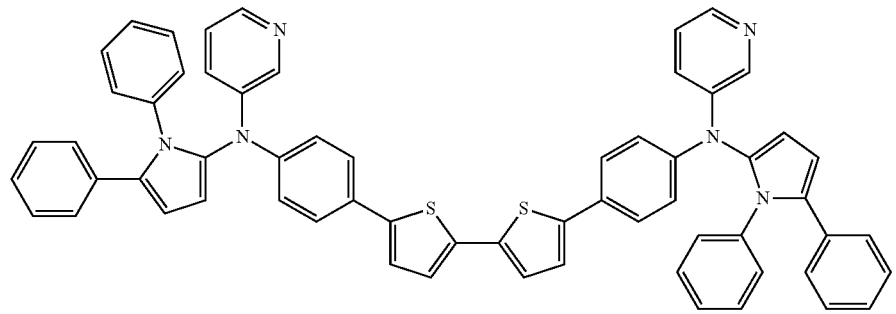
Cap105

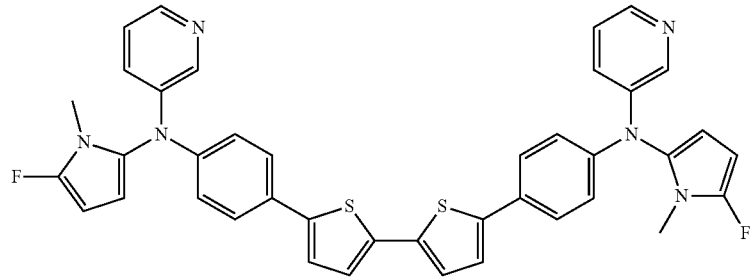
Cap106
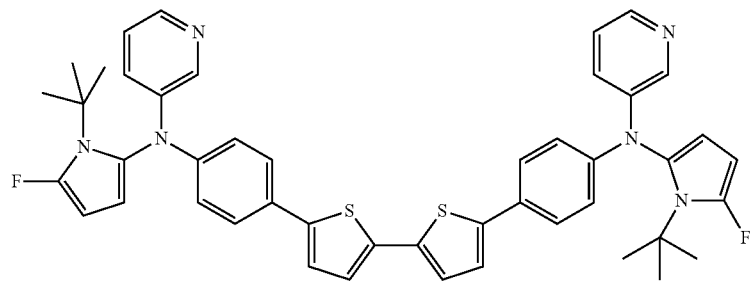
Cap107
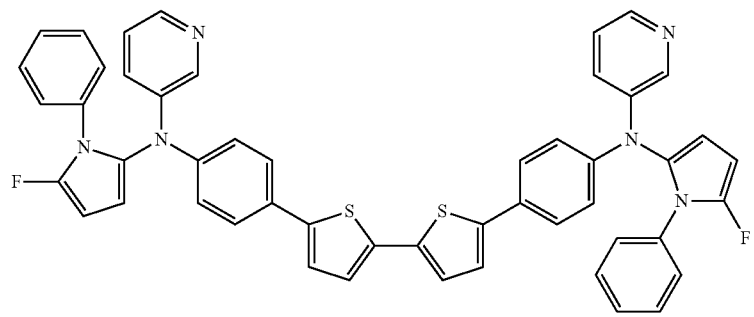
Cap108
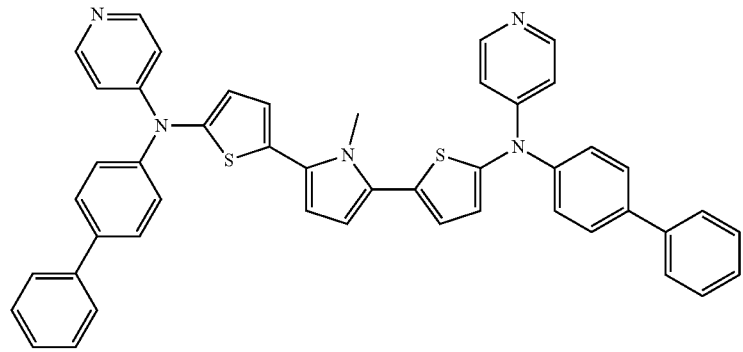
Cap109
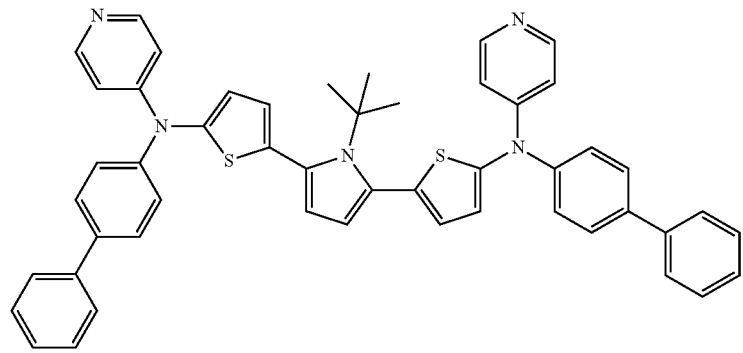
Cap110

-continued
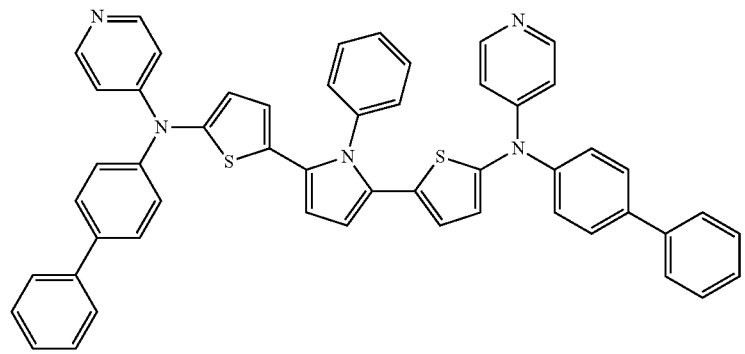
Cap111
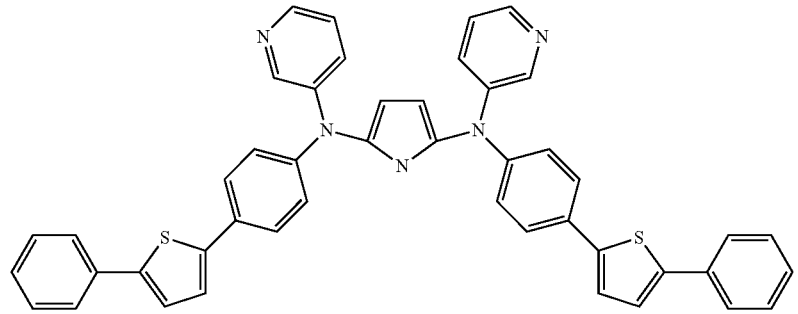
Cap112
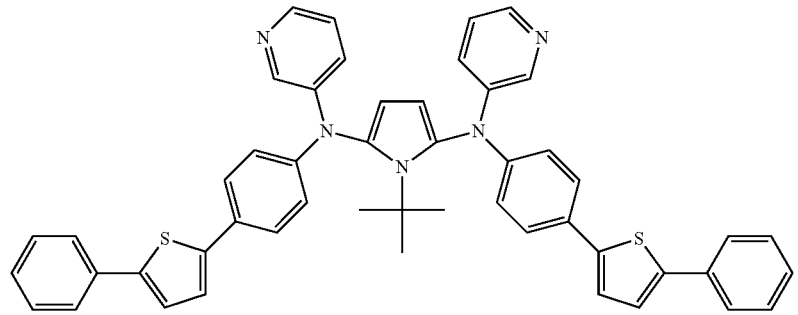
Cap113
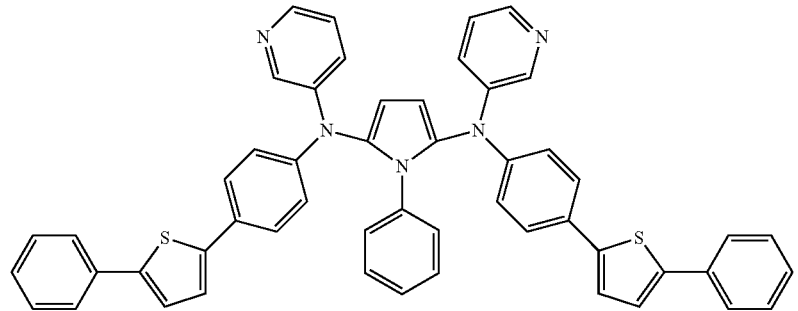
Cap114
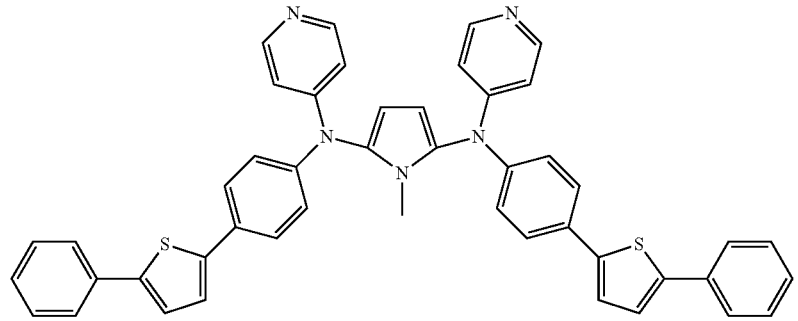
Cap115

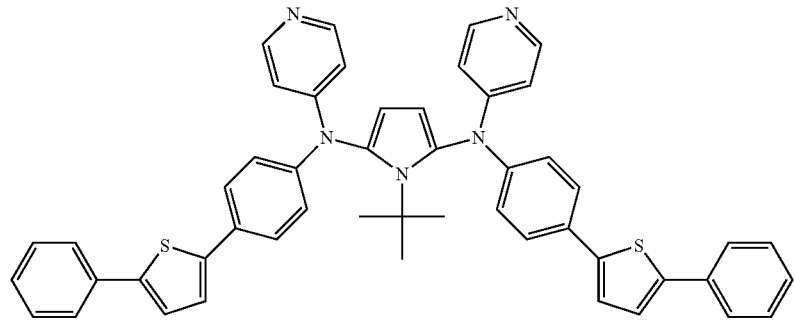
Cap116
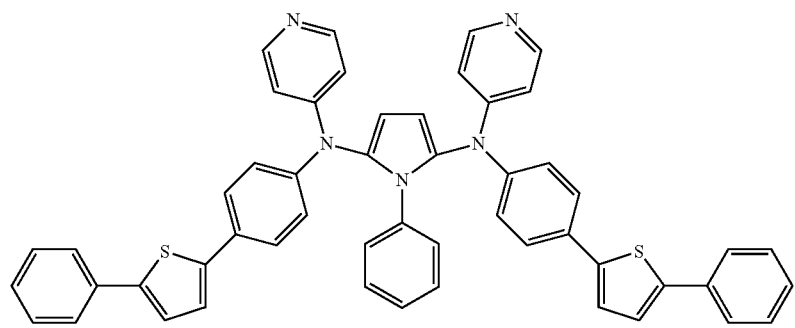
Cap117
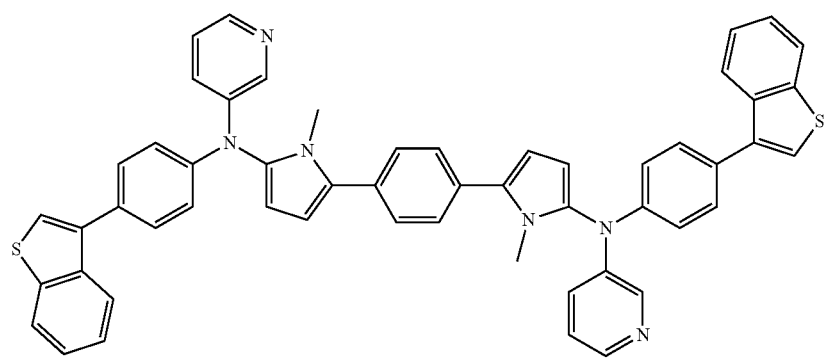
Cap118
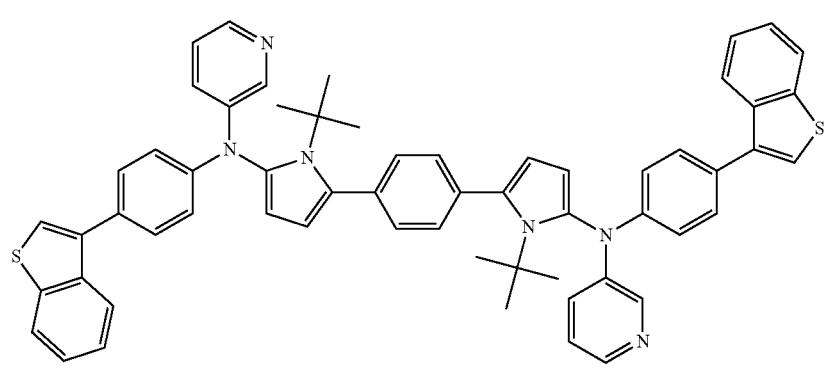
Cap119

-continued
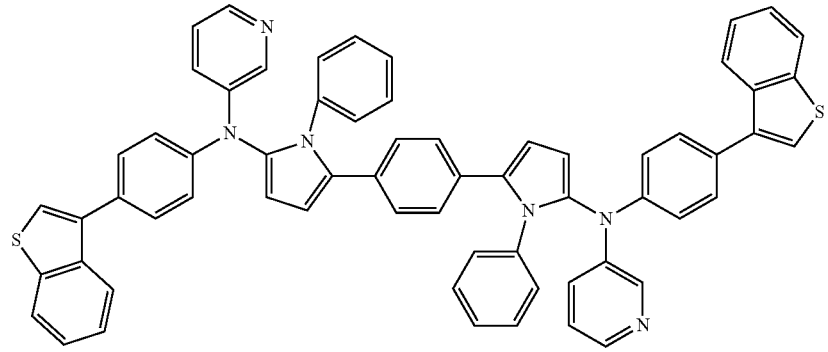
Cap120
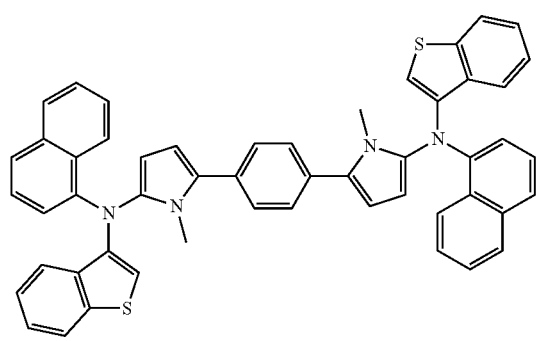
Cap121
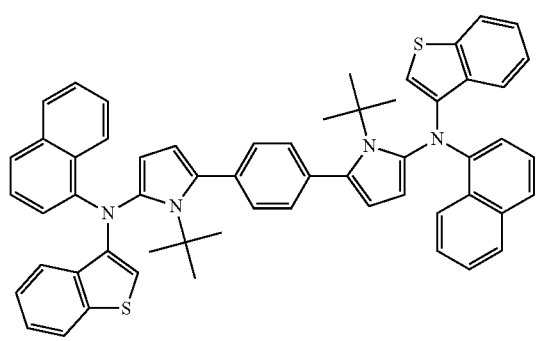
Cap122
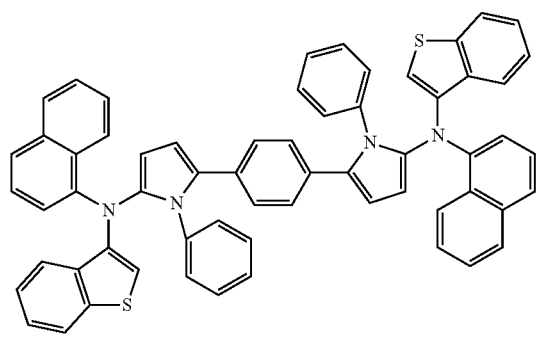
Cap123
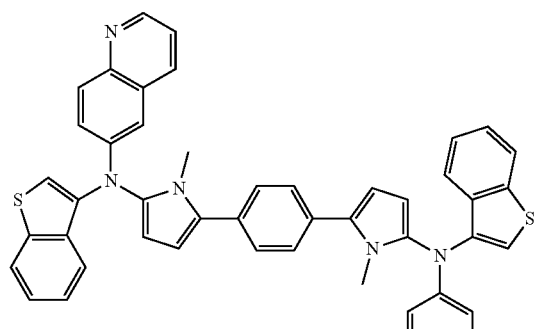
Cap124
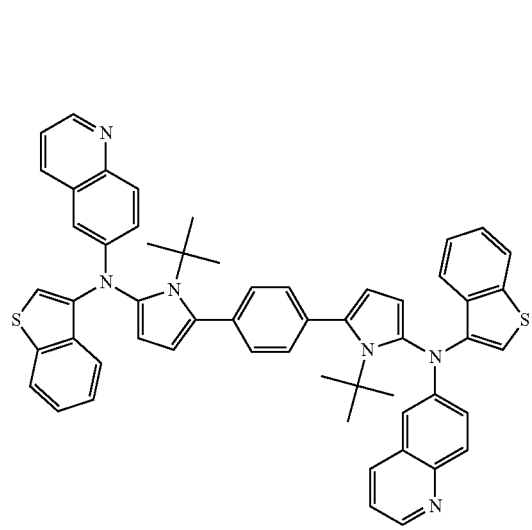
Cap125
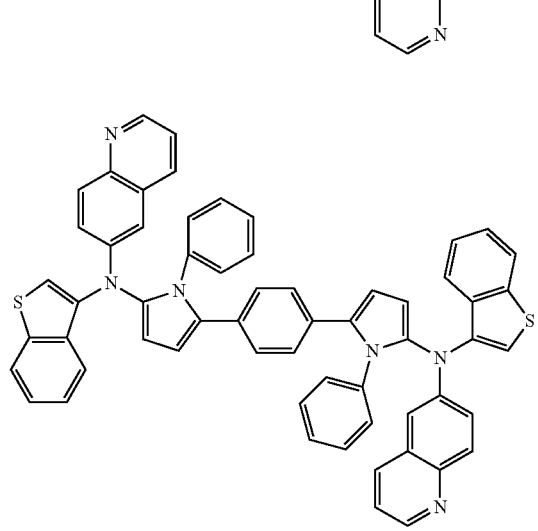
Cap126

-continued
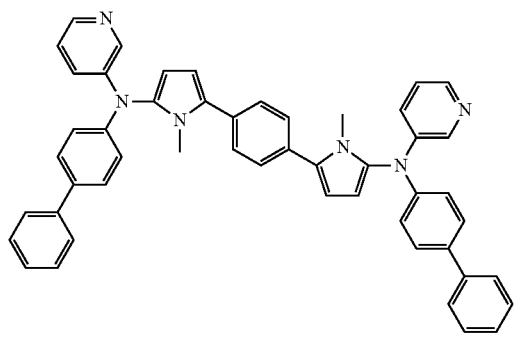
Cap127
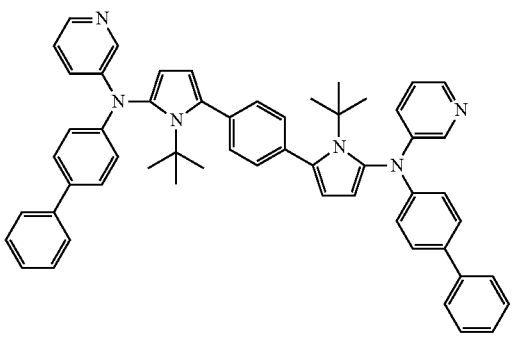
Cap128
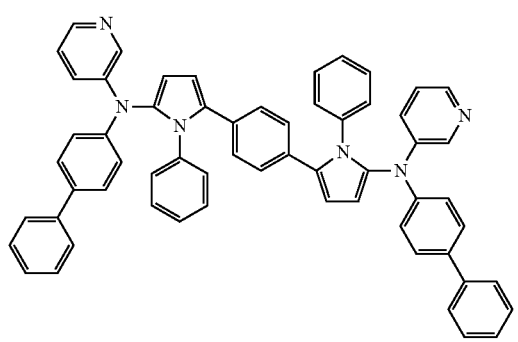
Cap129
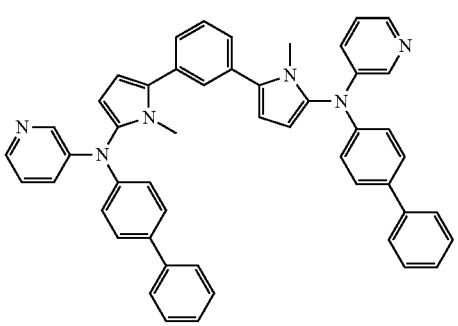
Cap130
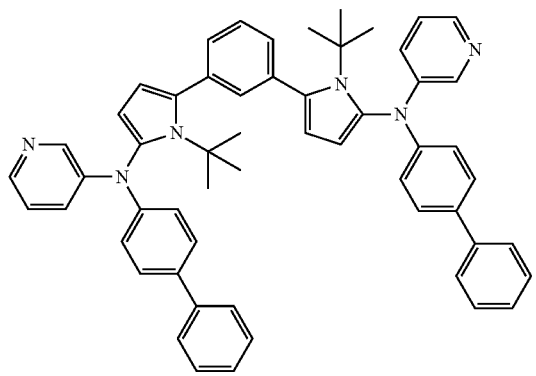
Cap131
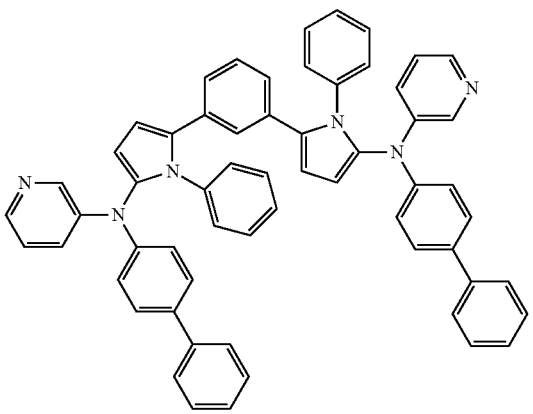
Cap132
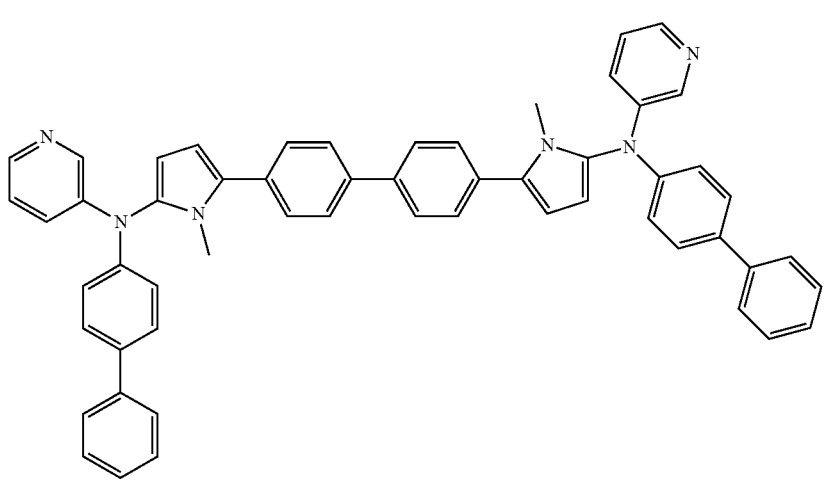
Cap133

-continued
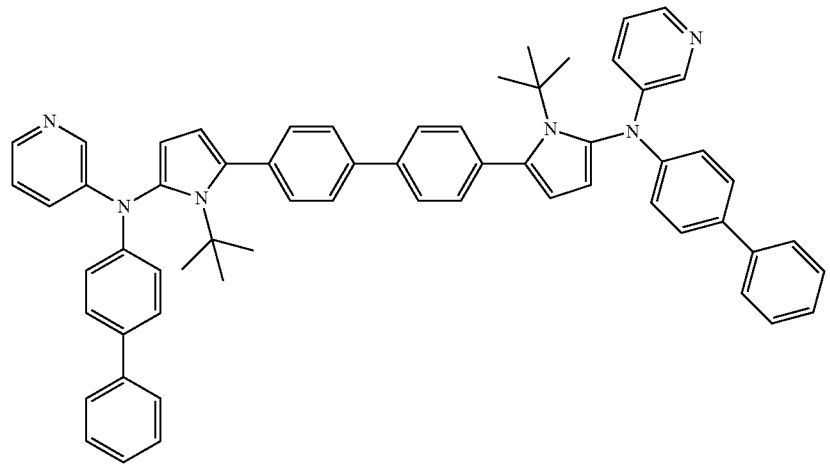
Cap134
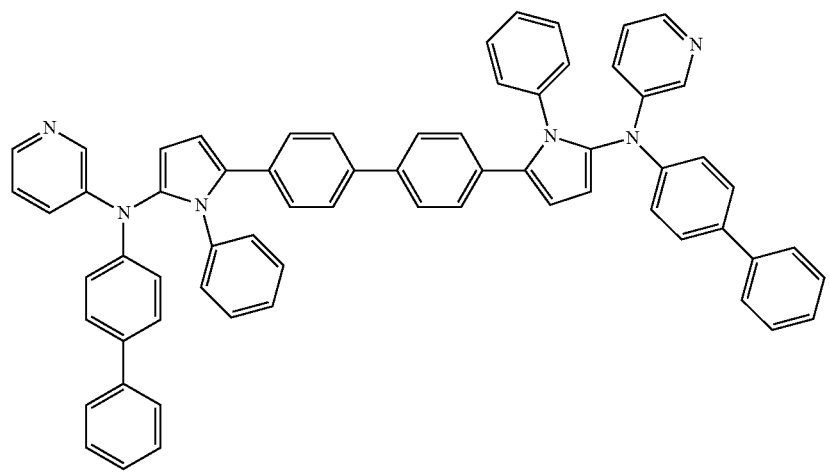
Cap135
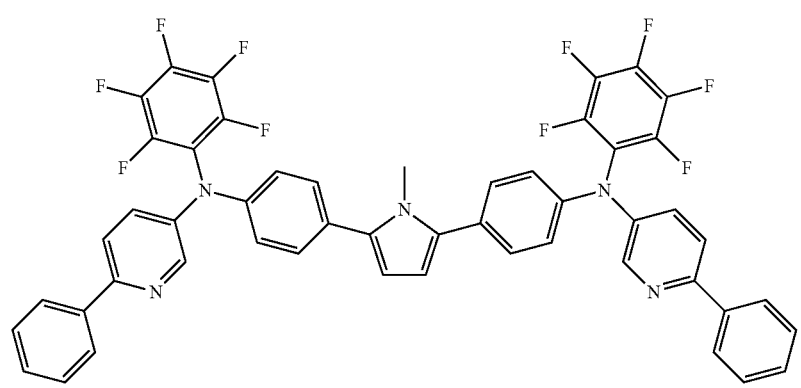
Cap136

-continued
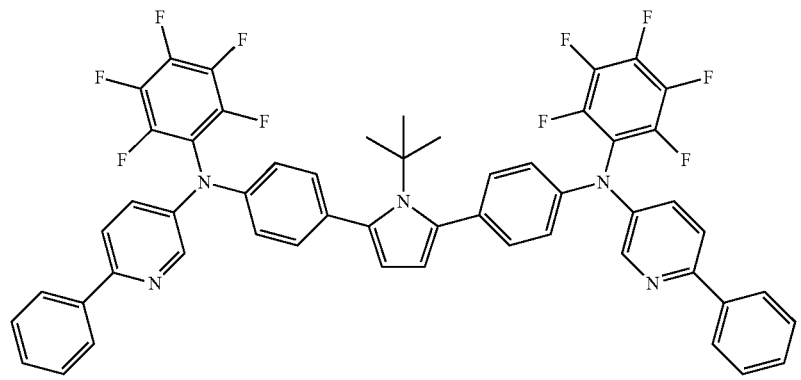
Cap137
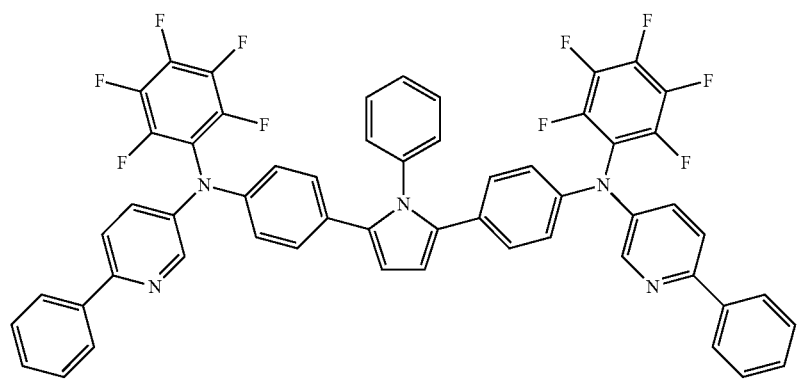
Cap138
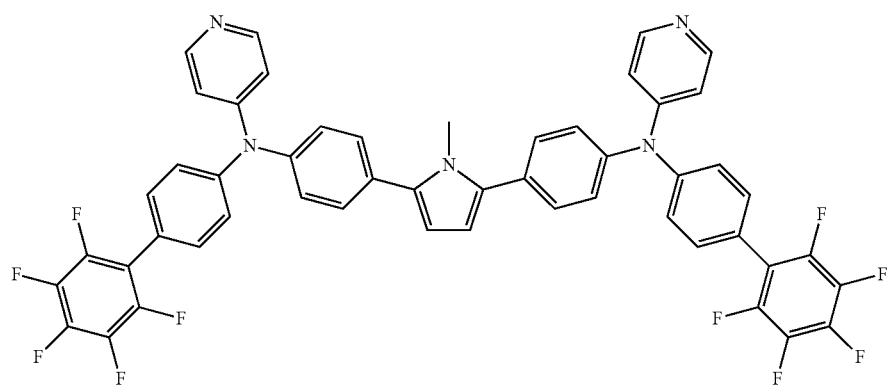
Cap139
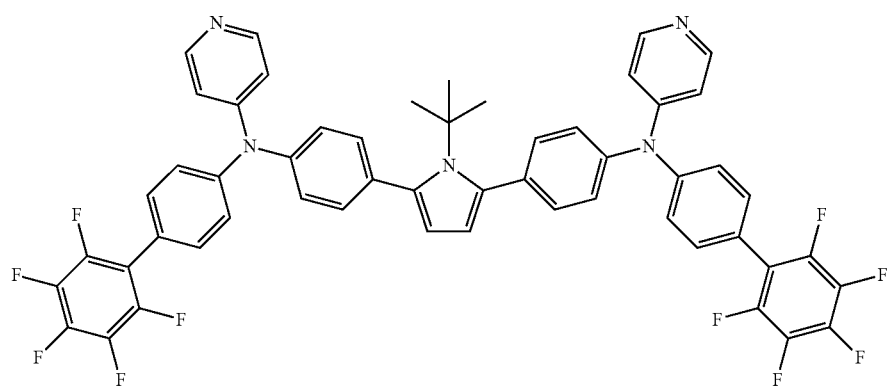
Cap140

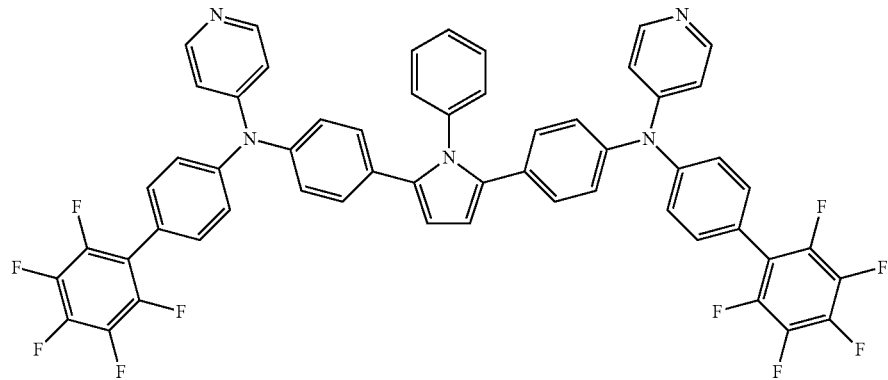
Cap141
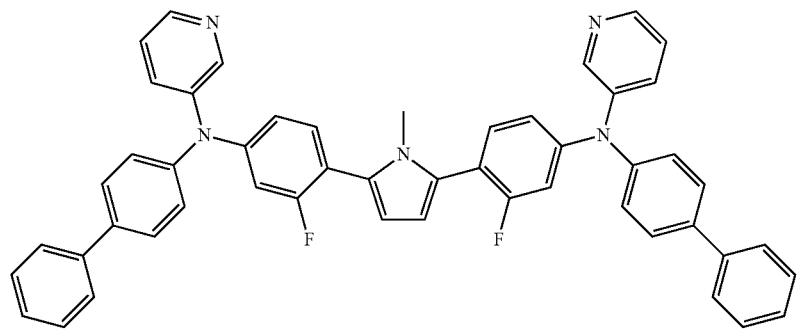
Cap142
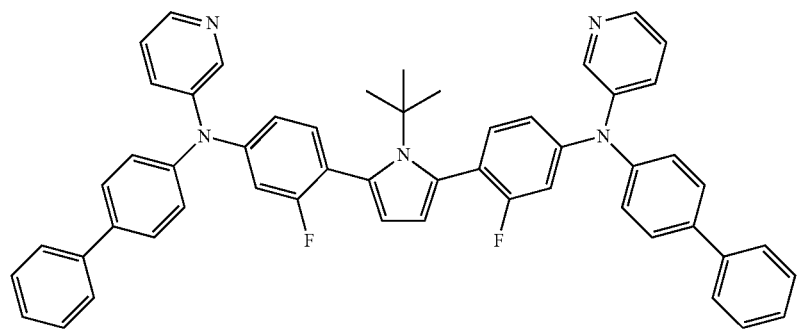
Cap143
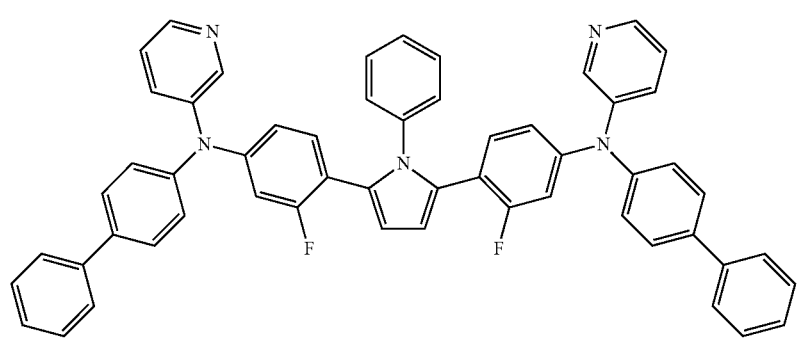
Cap144

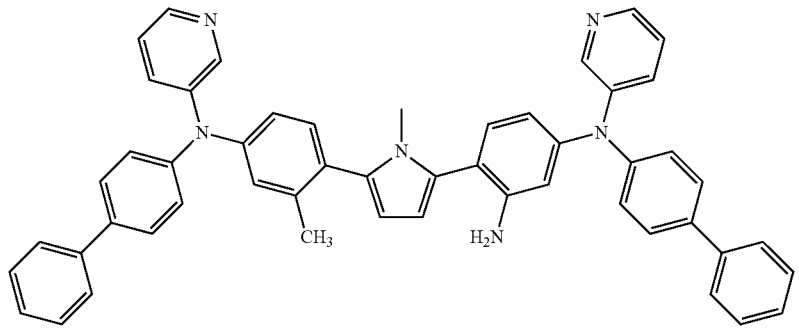
Cap145
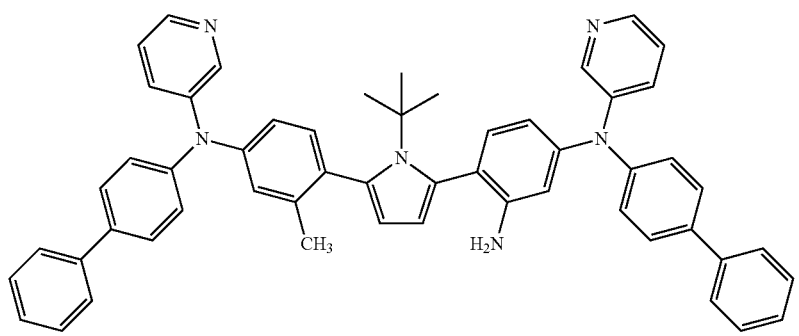
Cap146
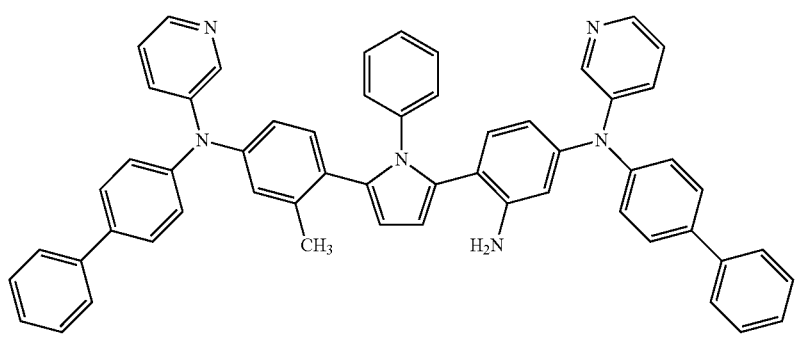
Cap147
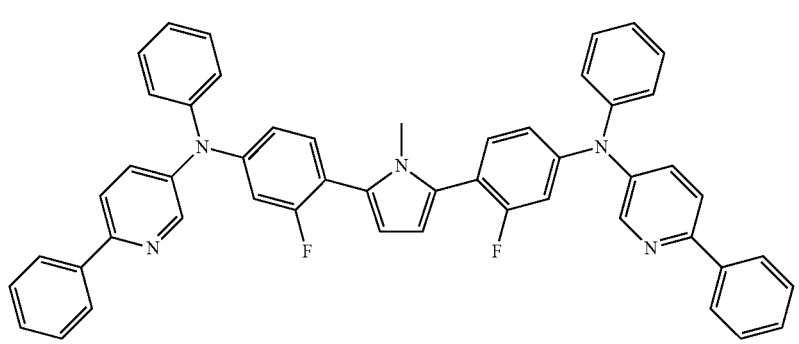
Cap148

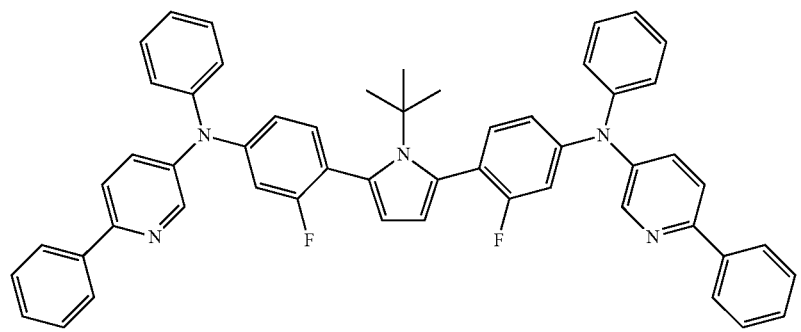
Cap149
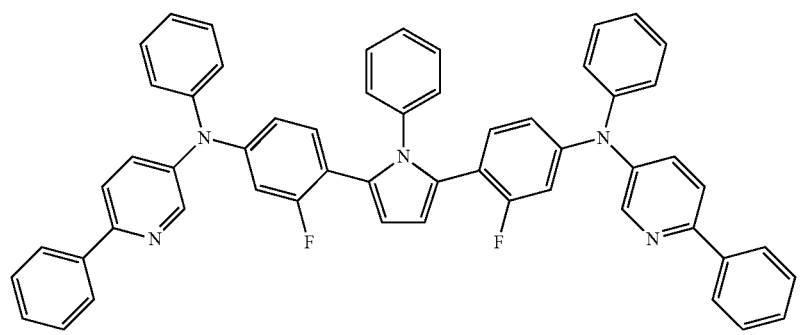
Cap150
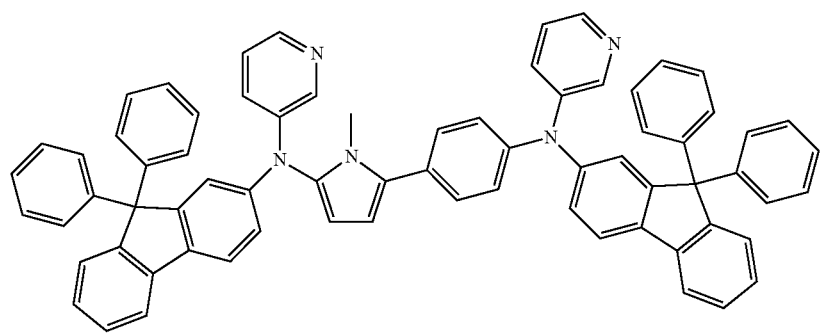
Cap151
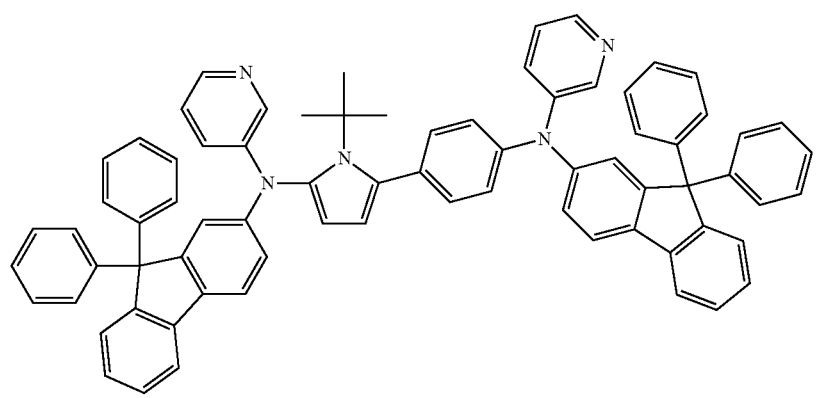
Cap152

-continued
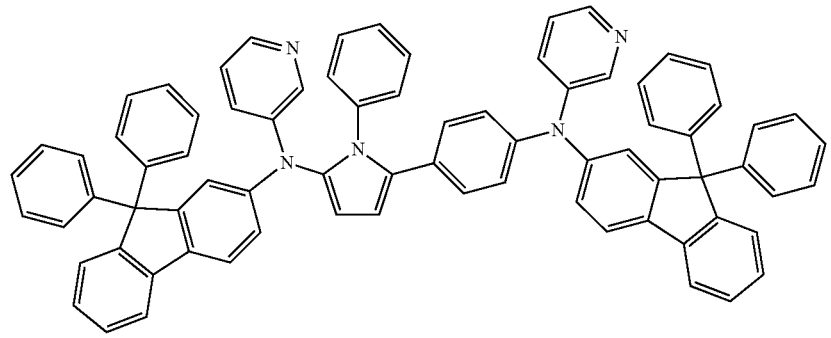
Cap153
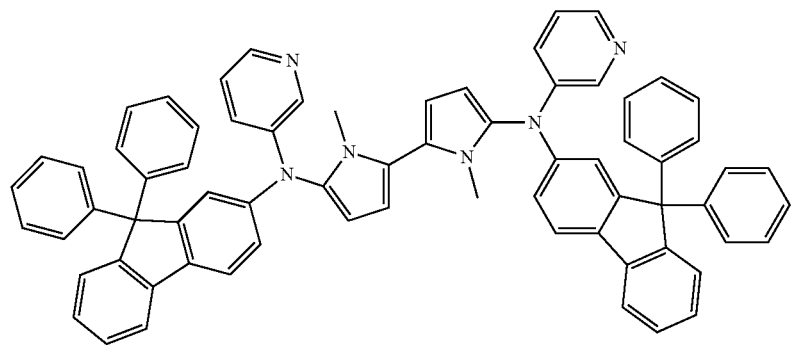
Cap154
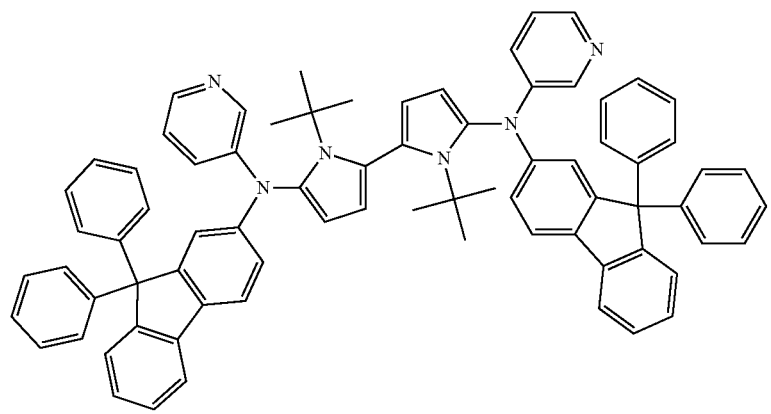
Cap155
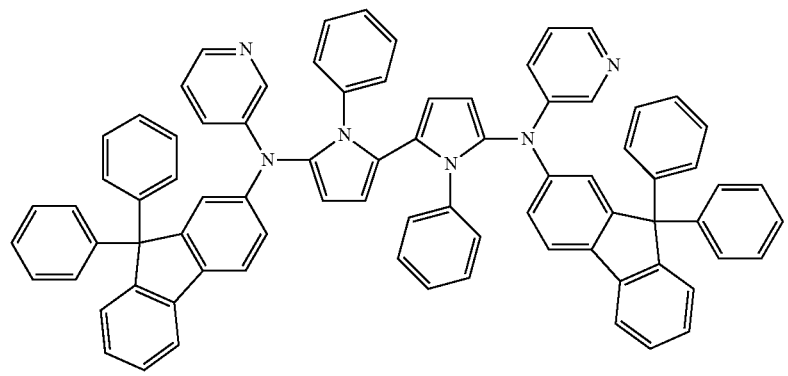
Cap156

Cap157
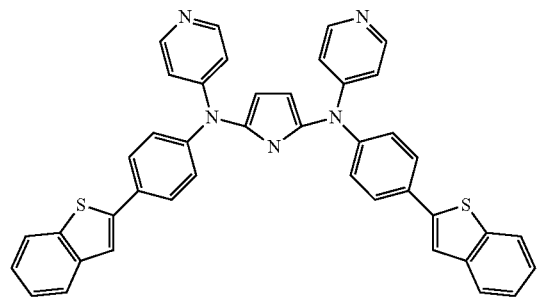
Cap158
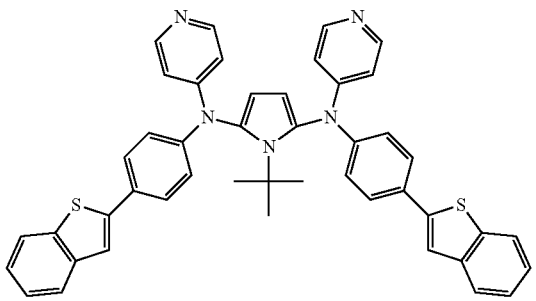
Cap159
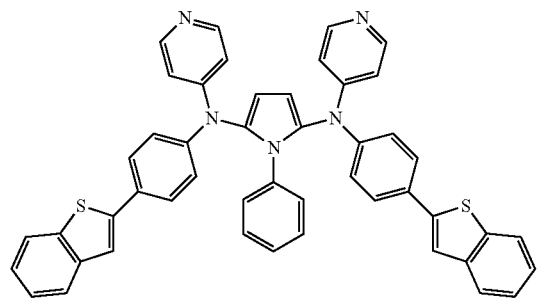
Cap160
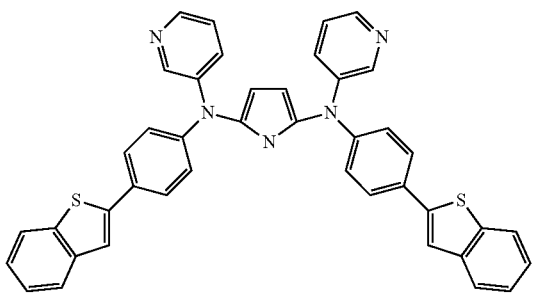
Cap161
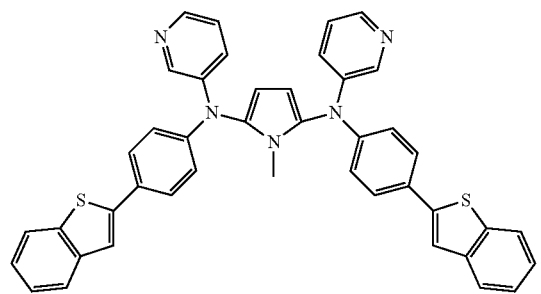
Cap162
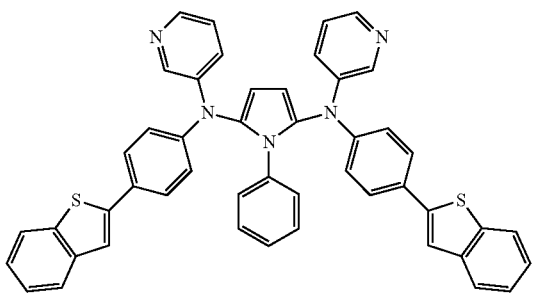
Cap163
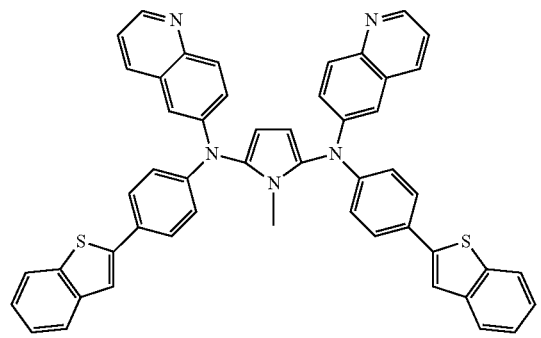
Cap164
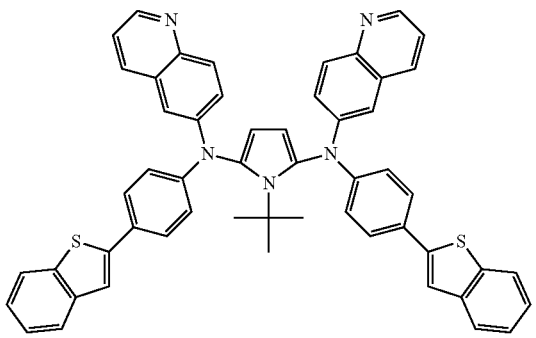

Cap165
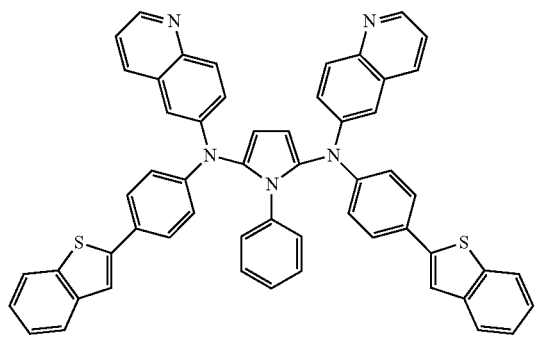
Cap166
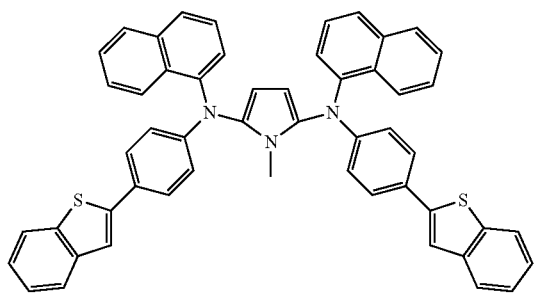
Cap167
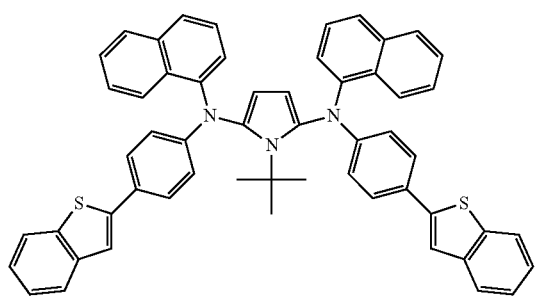
Cap168
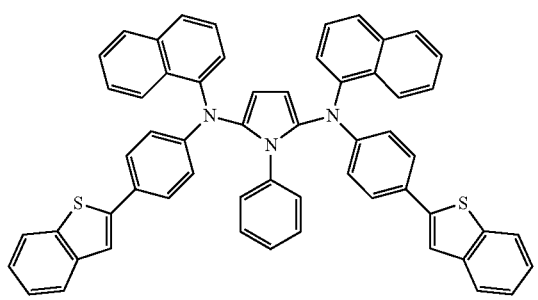
Cap169
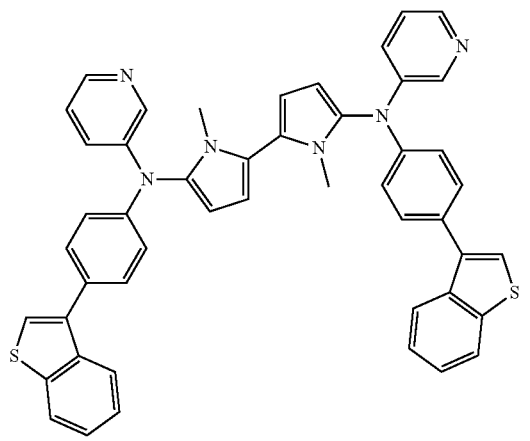
Cap170
Cap171
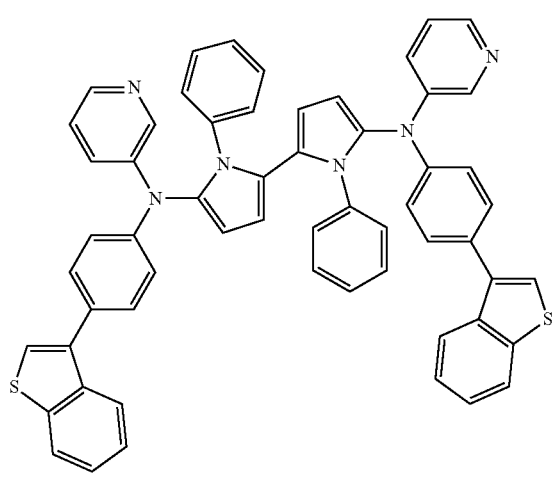

-continued
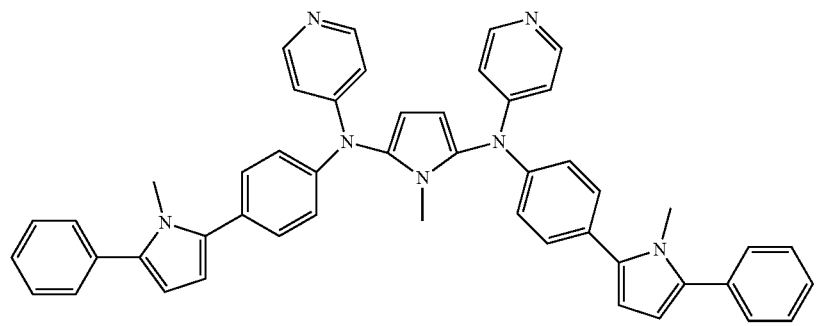
Cap172
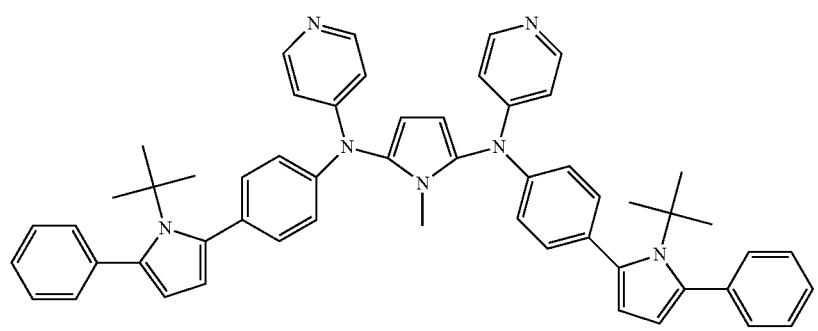
Cap173
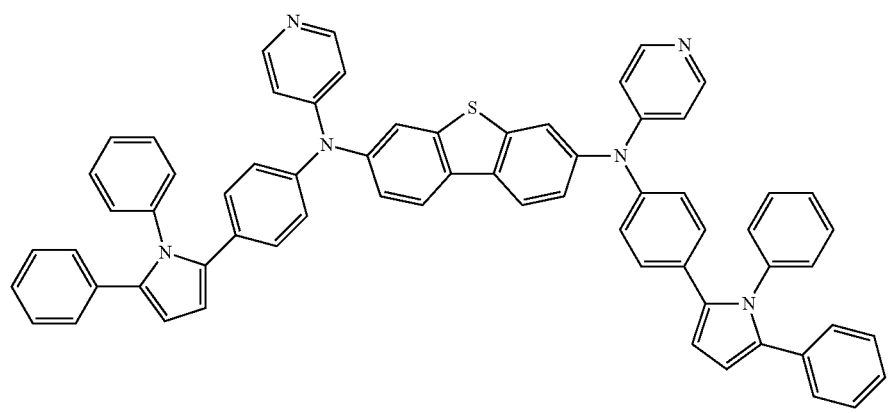
Cap174
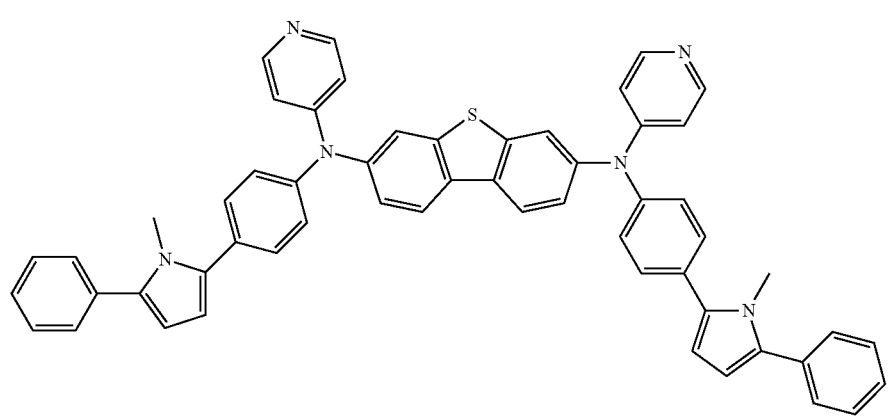
Cap175

Cap176
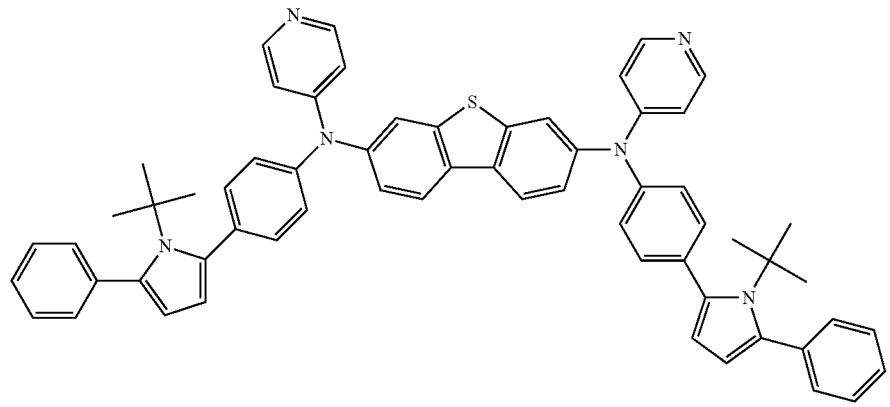
Cap177
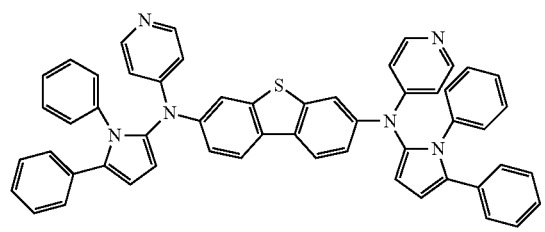
Cap178
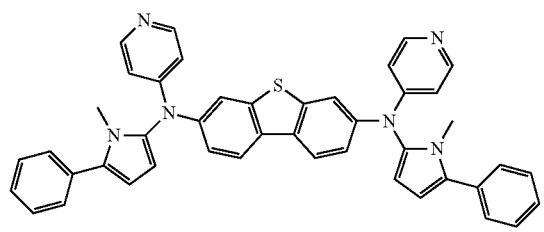
Cap179
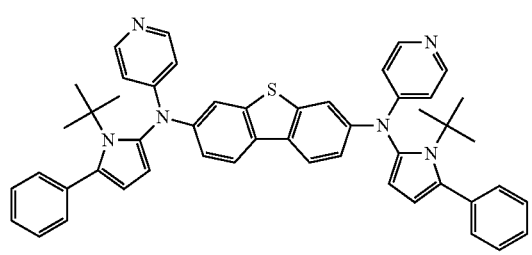
Cap180
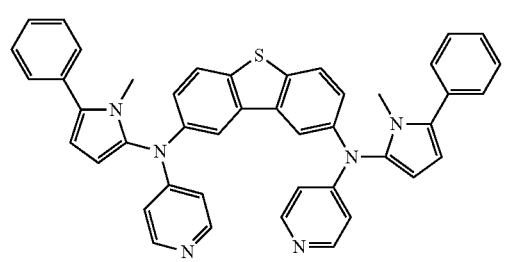
Cap181
Cap182
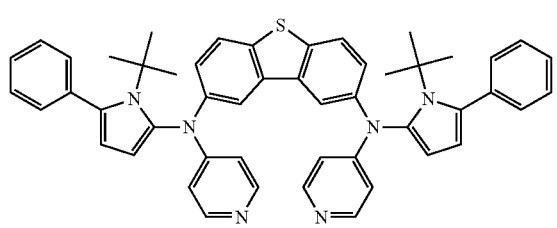
Cap183
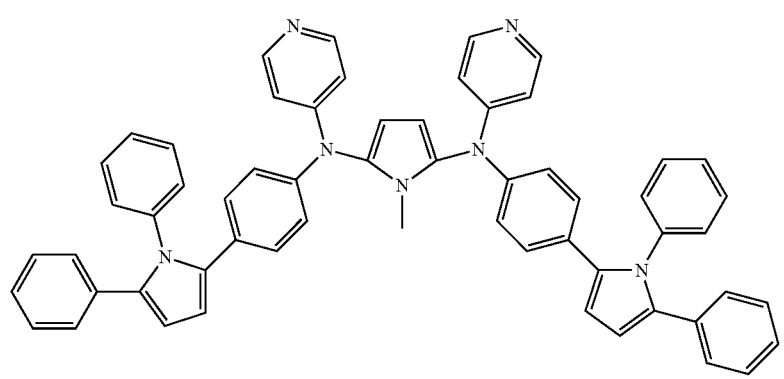

-continued
Cap184
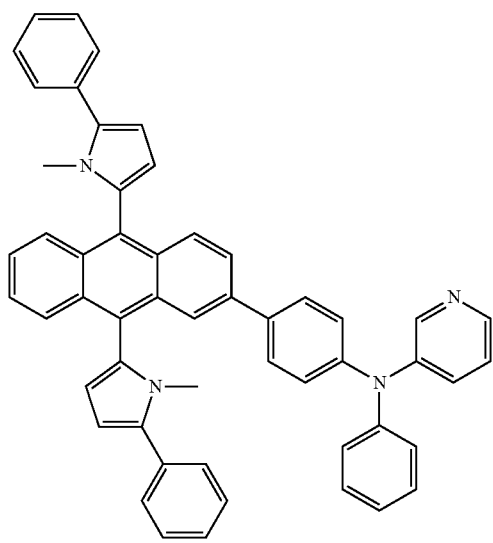
Cap185
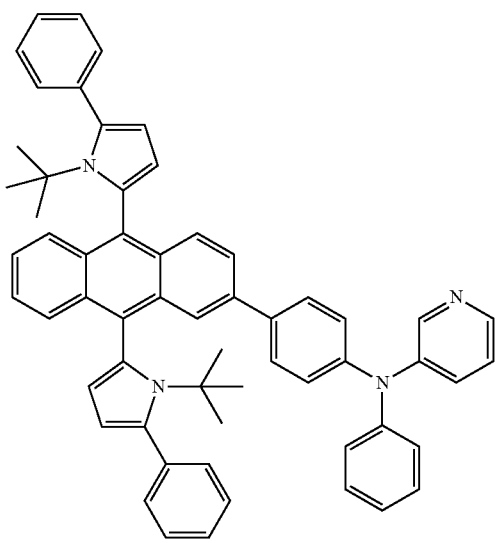
Cap186
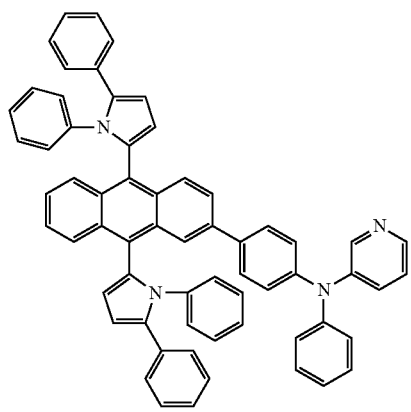
Cap187
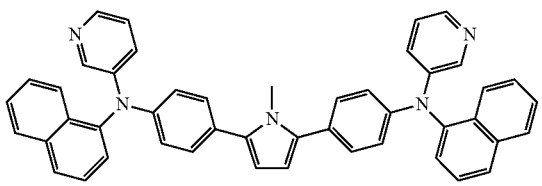
Cap188
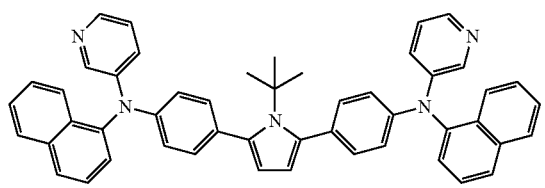
Cap189
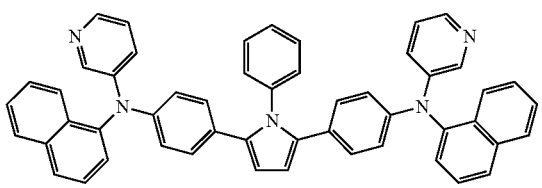
Cap190
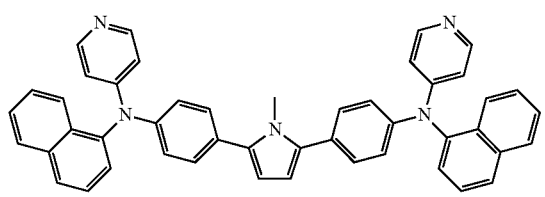
Cap191
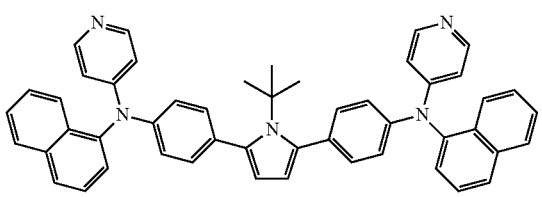
Cap192
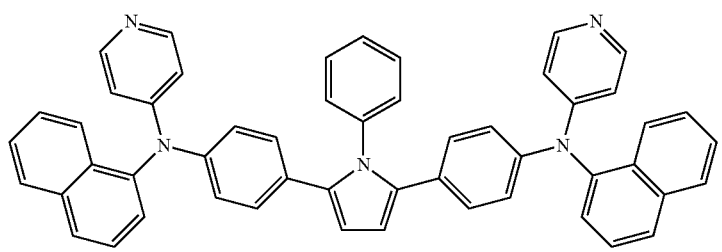

-continued
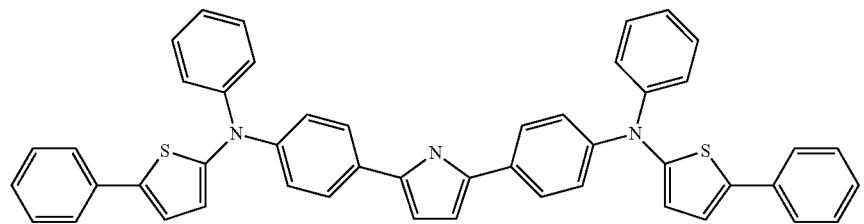
Cap193
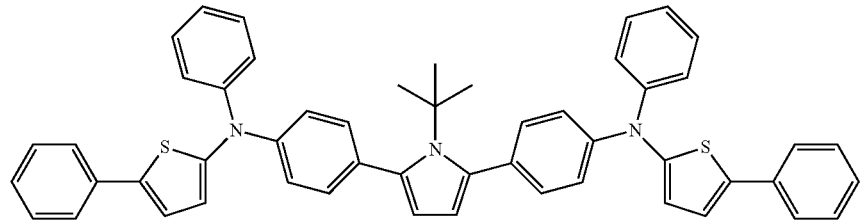
Cap194
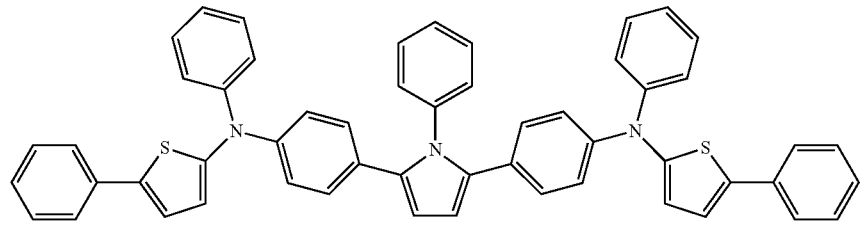
Cap195
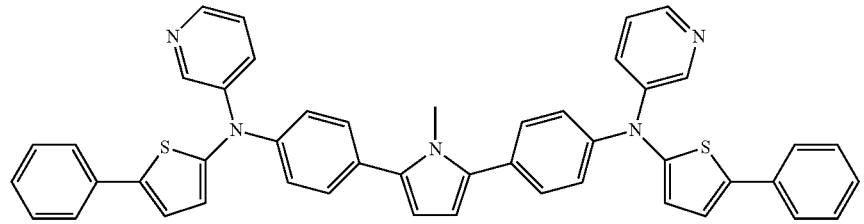
Cap196
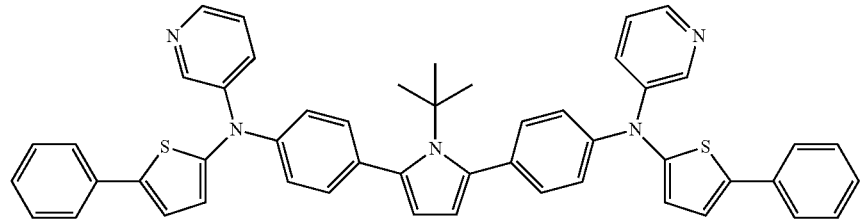
Cap197
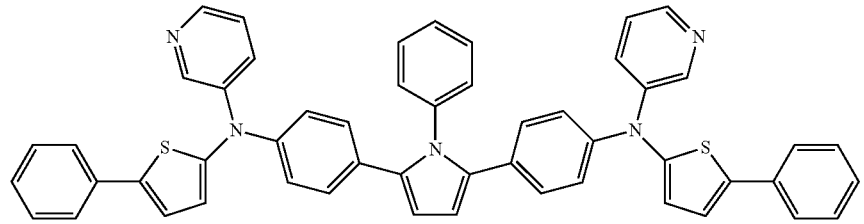
Cap198
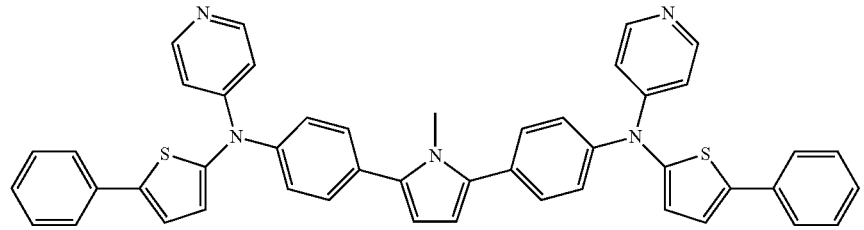
Cap199

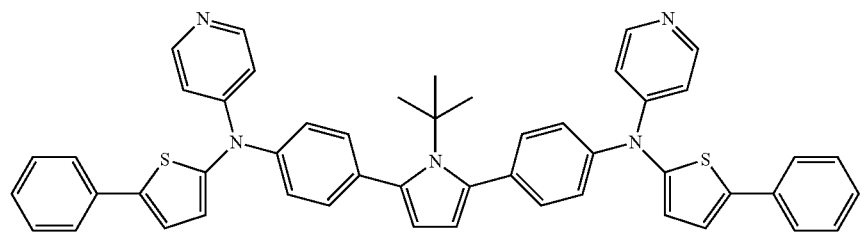
Cap200
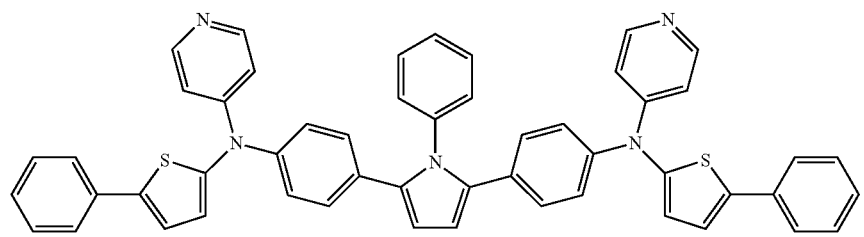
Cap201
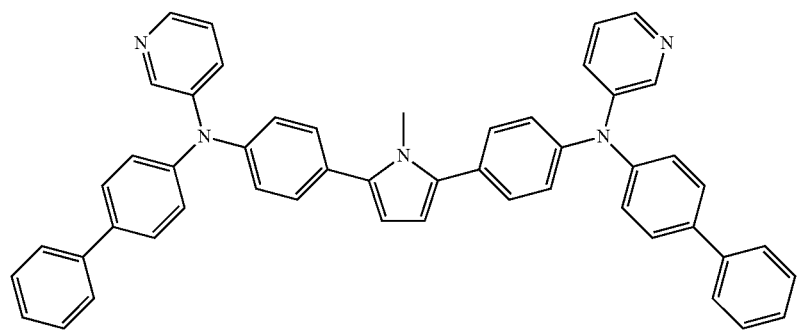
Cap202
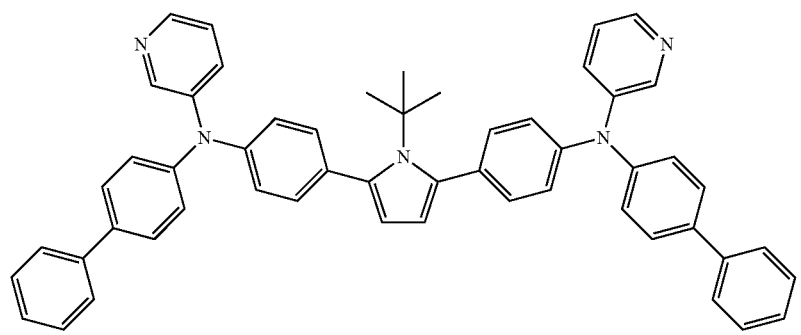
Cap203
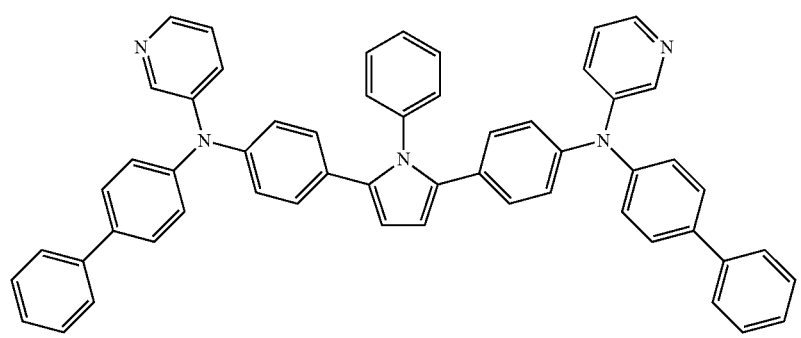
Cap204

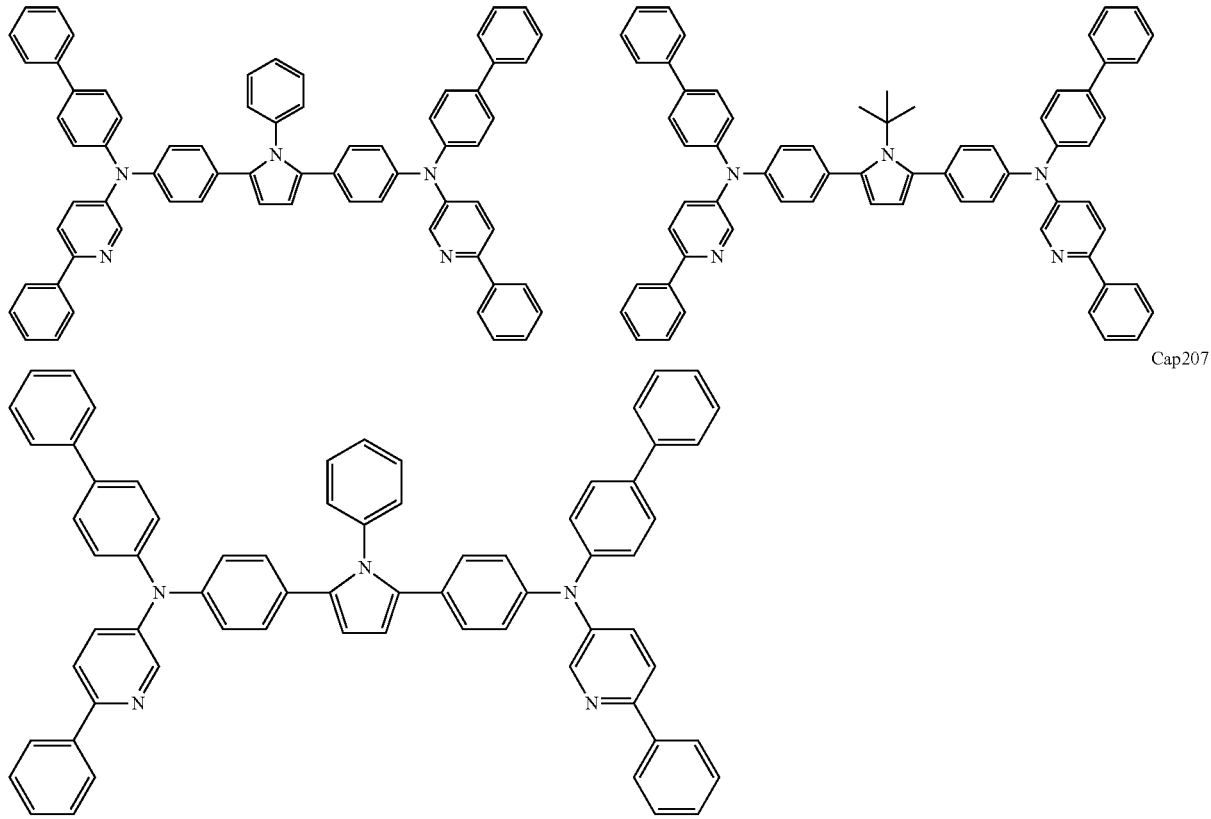

The compound that meets the parametric requirements and has pyrene-based structure is described below.

The relationship of the attenuation coefficient and the light-absorption coefficient is shown in Equation (A) below, where, α: light-absorption coefficient, k: attenuation coefficient, ω: light frequency, c: velocity of light:

$$\alpha = \frac{2k\omega}{c} \quad \text{(A)}$$

As shown in Equation (A), the attenuation coefficient is in direct proportion to the light-absorption coefficient. This means that a material having high light-absorption coefficient also has high attenuation coefficient. Compounds of pyrene-based structure have very high light-absorption coefficient due to the structural characteristics, and therefore high attenuation coefficient is obtained, and a high refractive index may be expected.

Further, compounds having pyrene-based structure are easily modified by substituents, therefore at least one point in the wavelength range of 430 nm to 460 nm the attenuation coefficient is easy to be greater than 0.10, and in the 460 nm to 500 nm, the attenuation coefficient is easy to be 0.10 or below. For this reason, the compound is preferably of a pyrene-based structure.

In the present invention, the compound having pyrene-based structure is represented by Formula (4):

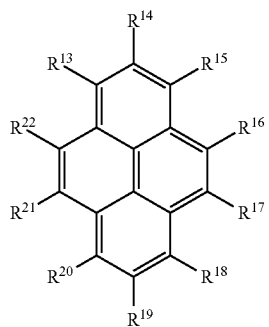

(4)

wherein, $R^{13}$ to $R^{22}$ may be identical or different, and each is one or more selected from the group consisting of hydrogen, deuterium, halogen, substitutable alkyl, cycloalkyl, heterocyclyl, alkenyl, cycloalkenyl, alkynyl, alkoxy, alkylthio, arylether, arylsulfide, aryl, heteroaryl, cyano, carbonyl, carboxyl, oxycarbonyl, carbamoyl, alkylamino and silyl, and may be bonded with an adjacent substituent to form a ring; when substitution is made, the substituent is one or more selected from the group consisting of deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C4-C55 aromatic heterocyclyl, carbonyl, carboxyl, oxycarbonyl, carbamoyl, C1-C40 alkylamino, and C3-C15 silyl that has 1 to 5 silicon atoms.

In the radical group represented by $R^{13}$ to $R^{22}$, the alkyl is preferably C1-C20 alkyl; and more preferably one or more saturated aliphatic hydrocarbyls such as methyl, ethyl, n-propyl, isopropyl, n-butyl, sec-butyl and tetra-butyl. The alkyl may be with or without a substituent.

The cycloalkyl is preferably C3-C20 cycloalkyl; and more preferably one or more saturated aliphatic cyclic hydrocarbyls such as cyclopropyl, cyclohexyl, norbornyl and adamantyl.

The cycloalkyl may be with or without a substituent.

The heterocyclyl is preferably C3-C20 heterocyclyl; and more preferably one or more aliphatic rings having atoms other than carbon in the ring, such as pyran ring, piperidine ring, and cyclic amide. The heterocyclyl may be with or without a substituent.

The alkenyl is preferably C2-C20 alkenyl; and more preferably one or more unsaturated aliphatic hydrocarbyls containing a double bond such as vinyl, allyl and butadienyl. The alkenyl may be with or without a substituent.

The cycloalkenyl is preferably C3-C20 cycloalkenyl; and more preferably one or more unsaturated aliphatic cyclic hydrocarbyl groups containing a double bond such as cyclopentenyl, cyclopentadienyl and cyclohexenyl. The cycloalkenyl may be with or without a substituent.

The alkynyl is preferably C2-C20 alkynyl; and more preferably an unsaturated aliphatic hydrocarbyl containing a triple bond such as ethynyl. The alkynyl may be with or without a substituent.

The alkoxy is preferably C1-C20 alkoxy; and more preferably one or more functional groups bonded with aliphatic hydrocarbyls via ether bonds such as methoxy, ethoxy and propoxy. The aliphatic hydrocarbyl may be with or without a substituent.

The alkylthio is a radical group in which oxygen atoms of alkoxy are replaced with sulfur atoms. It is preferably C1-C20 alkylthio; the alkyl of alkylthio may be with or without a substituent.

The arylether is preferably C6-C60 arylether; and more preferably a functional group bonded with aromatic hydrocarbon groups via ether bonds such as phenoxy. The arylether may be with or without a substituent.

The arylsulfide is a radical group in which oxygen atoms of ether bonds of arylether are replaced with sulfur atoms. It is preferably C6-C60 arylsulfide. The aromatic hydrocarbon groups in arylsulfide may be with or without a substituent.

The aryl is preferably C6-C60 aryl; and more preferably one or more aromatic hydrocarbon groups such as phenyl, naphthyl, biphenyl, phenanthryl, terphenyl and pyrene. The aryl may be with or without a substituent.

The heteroaryl is preferably C4-C60 aromatic heterocyclyl; and more preferably one or more from furyl, thienyl, pyrrole, benzofuranyl, benzothienyl, dibenzofuranyl, dibenzothienyl, pyridyl and quinolyl. The aromatic heterocyclyl may be with or without a substituent.

The halogen atom is selected from fluorine, chlorine, bromine and iodine.

The carbonyl, carboxyl, oxycarbonyl, carbamoyl, and alkylamino may be with or without a substituent. The number of carbon atoms in the alkylamino substituent is not limited, while it is usually in the range of 2 to 60.

The silyl is expressed as a functional group having bonds bonded to silicon atoms, such as trimethylsilyl. Silyl may be with or without a substituent. The number of carbon atoms in silyl is not limited, while it is usually in the range of 3 to 20. In addition, the number of silicon atoms is in the range of 1 to 6.

The siloxy is expressed as a functional group that bonds silicon atoms through ether bonds, such as trimethylsiloxy. Siloxy may be with or without a substituent.

The substituent is one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino, and C3-C15 silyl that has 1 to 5 silicon atoms.

The compound having pyrene-based structure as expressed by Formula (4), creates steric hindrance effects when having the same or different substituent substituted, thereby providing superior thin-film stability.

It is thus clear that when the covering layer is made of a compound having pyrene-based structure with high refractive index and superior thin-film stability, the problem of improving both the light extraction efficiency and ageing stability can be solved.

Since the compound of pyrene-based structure with substituted amino exhibits excellent light-absorption coefficient, high attenuation coefficient may be obtained, and high refractive index is expectable.

In the present invention, the compound having pyrene-based structure is represented by Formula (5):

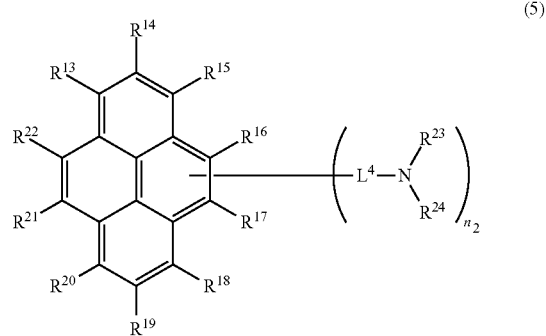

(5)

$R^{13}$ to $R^{22}$ may be identical or different, and each of $R^{13}$ to $R^{22}$ is one or more selected from the group consisting of hydrogen, deuterium, halogen, or substitutable alkyl, cycloalkyl, heterocyclyl, alkenyl, cycloalkenyl, alkynyl, alkoxy, alkylthio, arylether, arylsulfide, aryl, heteroaryl, cyano, carbonyl, carboxyl, oxycarbonyl, carbamoyl, alkylamino and silyl, and may be bonded with an adjacent substituent to form a ring;

$L^4$ is selected from arylene and heteroarylene and forms a single bond with one or more of $R^{13}$ to $R^{22}$;

$R^{23}$ and $R^{24}$ may be identical or different, and each of $R^{23}$ and $R^{24}$ is selected from substitutable alkyl, substitutable cycloalkyl, substitutable aryl, substitutable heteroaryl and substitutable heterocyclyl; $n_2$ is an integer from 1 to 4, and at least one of $R^{13}$ to $R^{22}$ is bonded with $L^4$; when substitution is made, the substituent is one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C4-C55 aromatic heterocyclyl, carbonyl, carboxyl, oxycarbonyl, carbamoyl, C1-C40 alkylamino, and C3-C15 silyl that has 1 to 5 silicon atoms.

The arylene is preferably C6-C60 aryl; and more preferably one or more from aromatic hydrocarbon groups such as phenylene, naphthylene, biphenylene, phenanthrylene, terphenylene and pyrenylene. Arylene may be with or without a substituent.

The heteroarylene is preferably C5-C60 aromatic heterocyclyl; and more preferably one or more from furylene, thienylene, pyrrolidinylidene, benzofuranylene, benzothienylene, dibenzofuranylene, dibenzothienylene, pyridylene and quinolylene. Aromatic heterocyclylic group may be with or without a substituent.

The other substituents are the same as substituents described above.

In addition, as shown in the Lorentz-Lorent equation, the refractive index is in direct proportion to polarizability and density. A material having higher polarizability and higher density has a greater refractive index.

$$\frac{n^2-1}{n^2+2} = \frac{4}{3}\pi\frac{P_\lambda}{V}$$

n: Refractive Index, λ: Light Wavelength, $P_\lambda$: Polarizability, V: Molecular Volume Heteroaryl helps to enhance polarizability, thereby contributing to high refractive index. Furthermore, since pyrene-based structure has high planarity, the reaction between molecules is strong. This makes pyrene derivatives have a tendency of increased density, and high refractive index is expectable on this aspect.

Further, considering from aspects of non-crystalline and thin-film stability, in Formula (5), at least one of $R^{23}$ to $R^{24}$ is heteroaryl, and preferably pyridyl or quinolyl.

Moreover, considering from aspects of easy synthesis and heat resistance during film formation in the process of resistive heating evaporation, $n_2$ is preferably 1 or 2.

In the present invention, a more preferably compound of pyrene-based structure is as expressed in Formula (6):

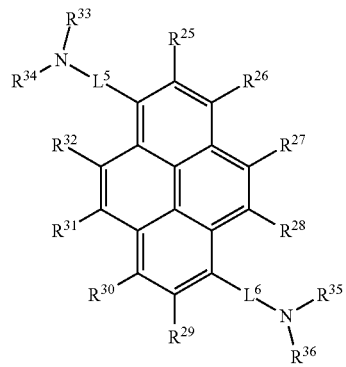

(6)

$R^{25}$ to $R^{32}$ may be identical or different, and each of $R^{25}$ to $R^{32}$ is one or more selected from the group consisting of hydrogen, deuterium, halogen, and substitutable alkyl, cycloalkyl, heterocyclyl, alkenyl, cycloalkenyl, alkynyl, alkoxy, alkylthio, arylether, arylsulfide, aryl, heteroaryl, cyano, carbonyl, carboxyl, oxycarbonyl, carbamoyl, alkylamino and silyl, and may be bonded with an adjacent substituent to form a ring;

Each of $L^5$ and $L^6$ is selected from arylene and heteroarylene; and $R^{33}$ to $R^{36}$ may be identical or different, and each of $R^{33}$ to $R^{36}$ is selected from substitutable alkyl, substitutable cycloalkyl, substitutable aryl, substitutable heteroaryl and substitutable heterocyclyl; when substitution is made, the substituent is one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C4-C55 aromatic heterocyclyl, carbonyl, carboxyl, oxycarbonyl, carbamoyl, C1-C40 alkylamino, and C3-C15 silyl that has 1 to 5 silicon atoms.

The compound of pyrene-based structure is not particularly limited, and the following are some examples.

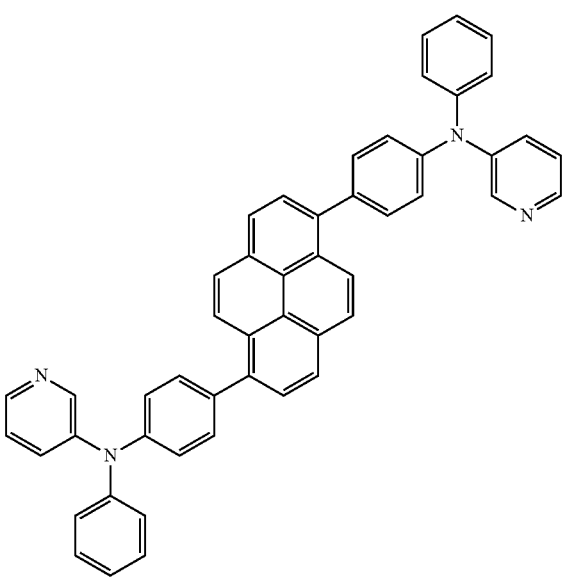

Cap208

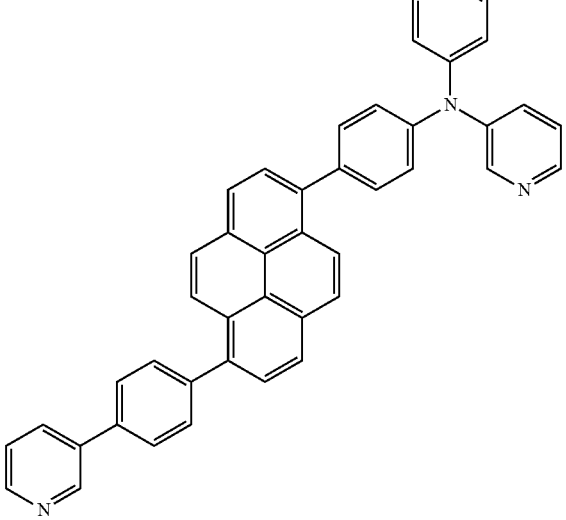

Cap209

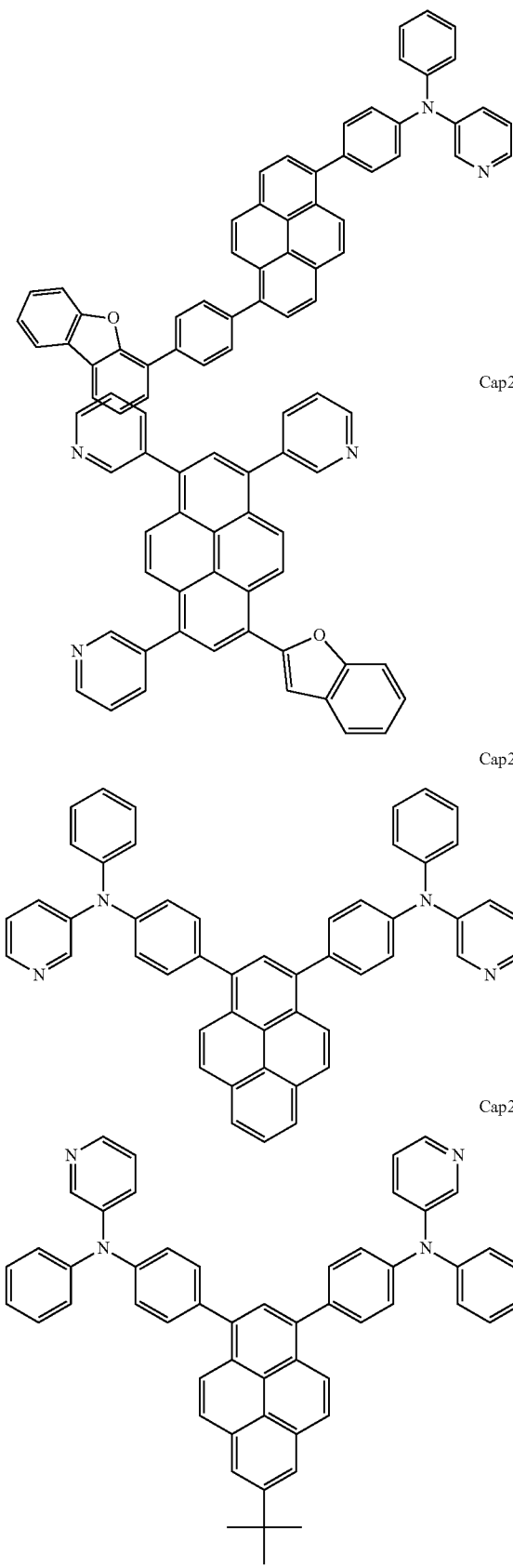
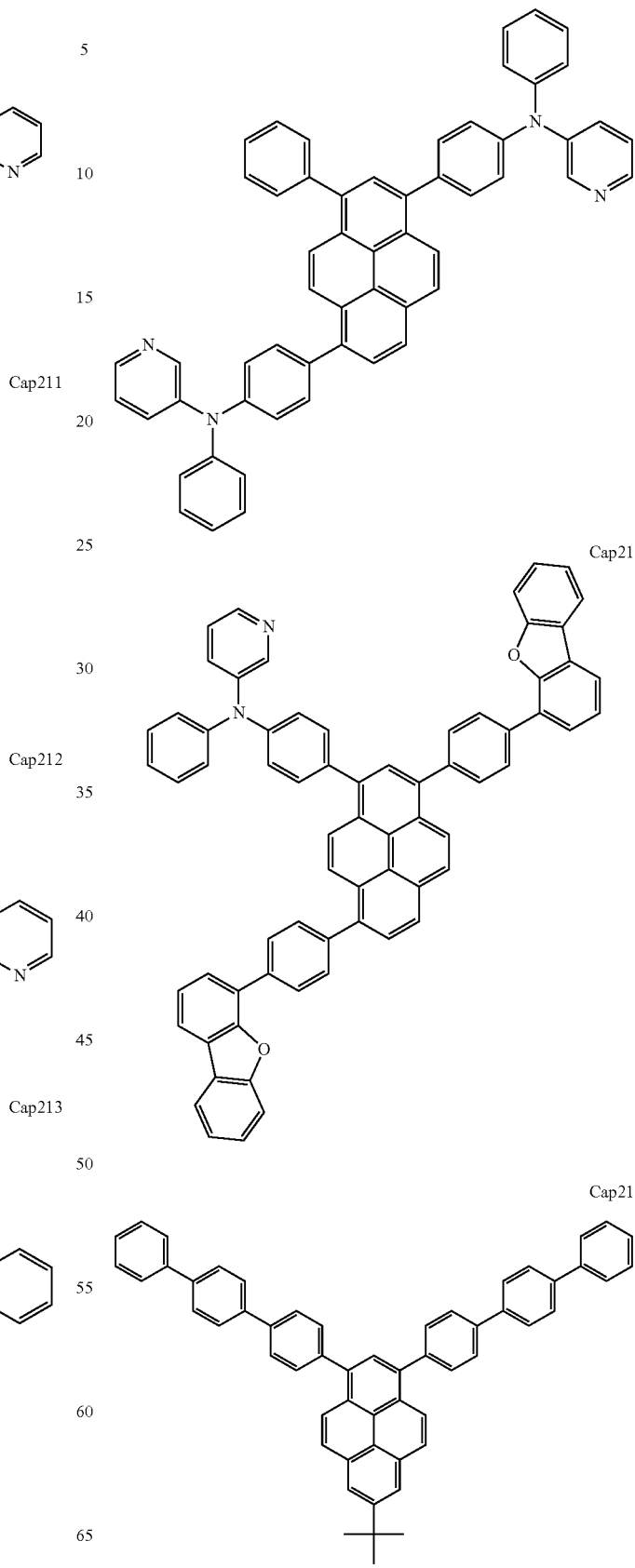

Cap217
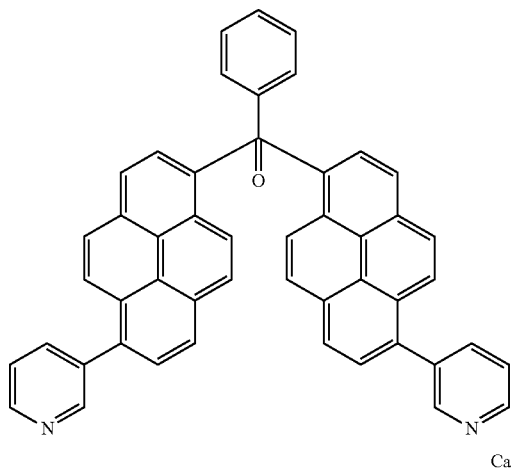
Cap218
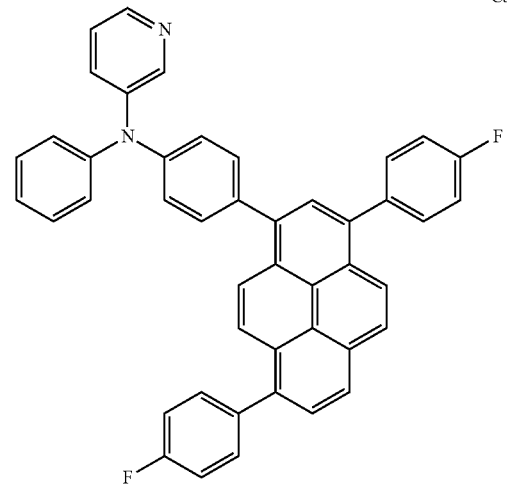
Cap219
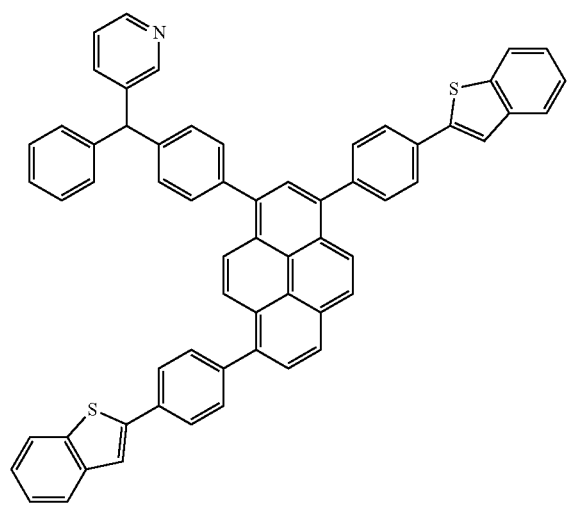
Cap220
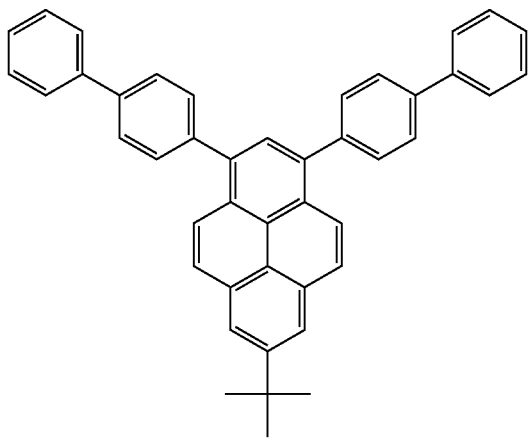
Cap221
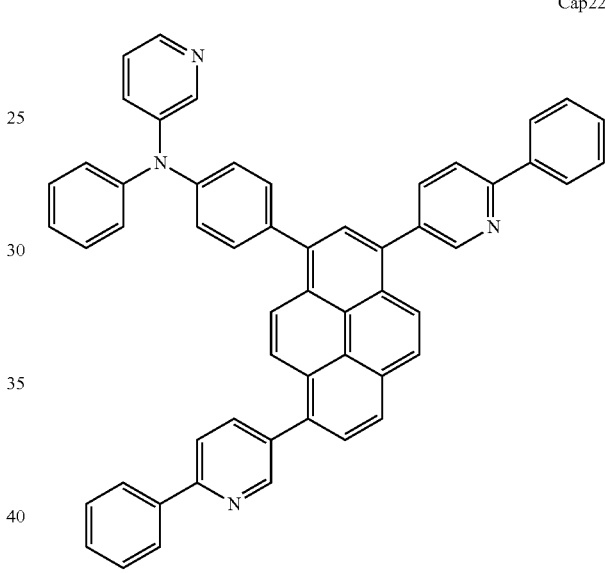
Cap222
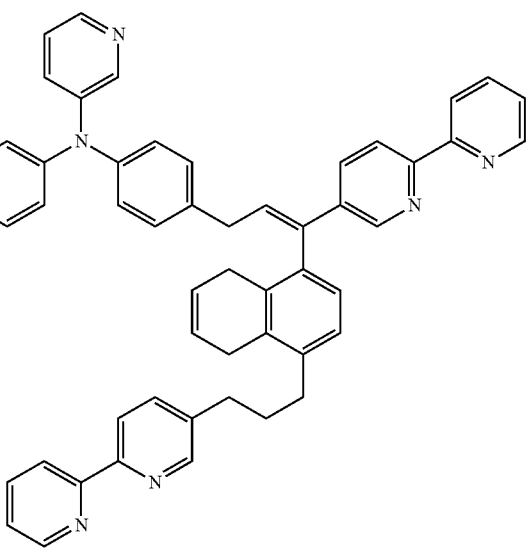

Cap223
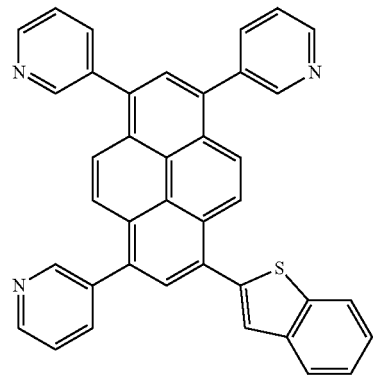
Cap224
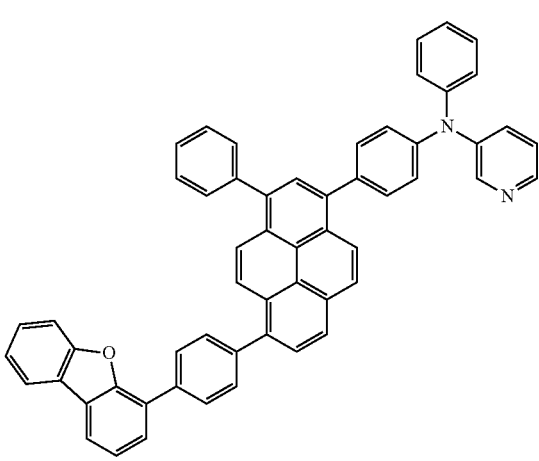
Cap225
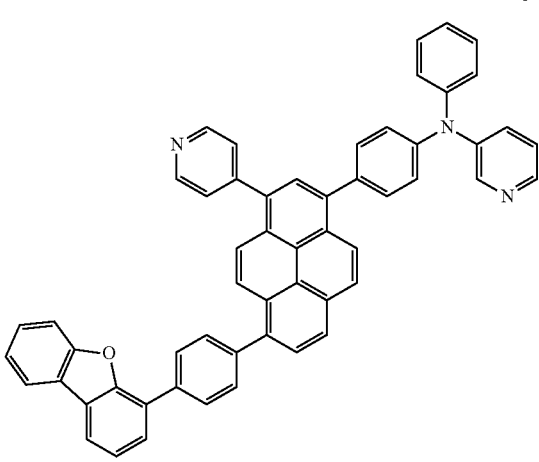
Cap226
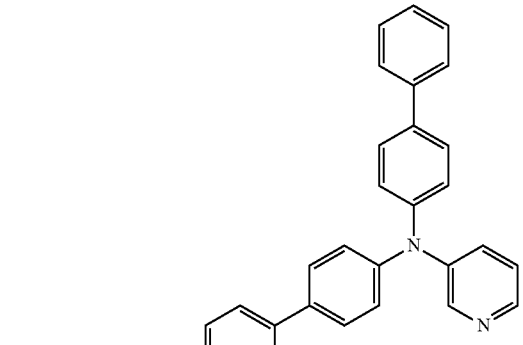
Cap227
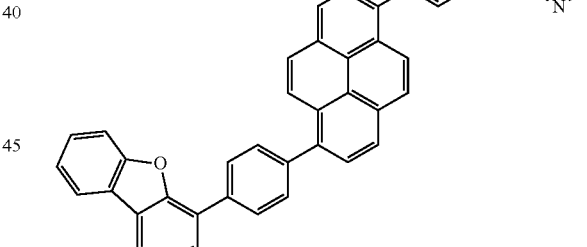

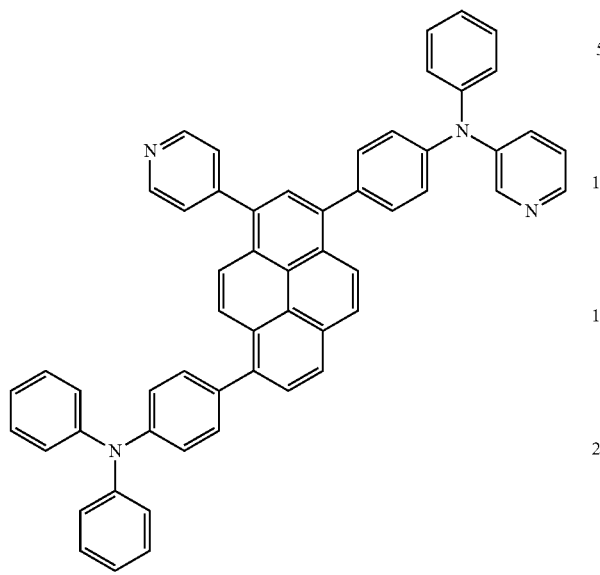
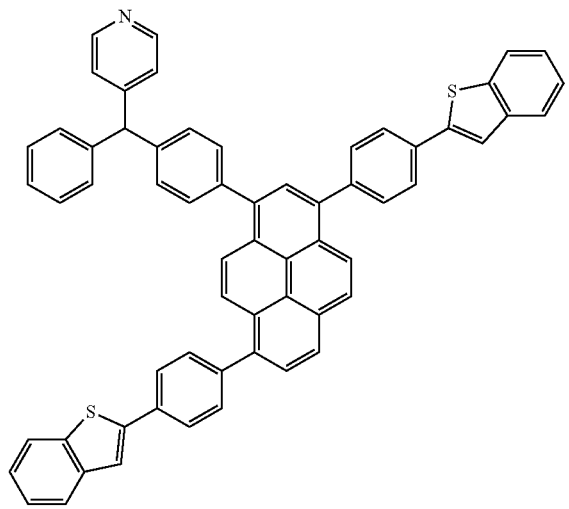

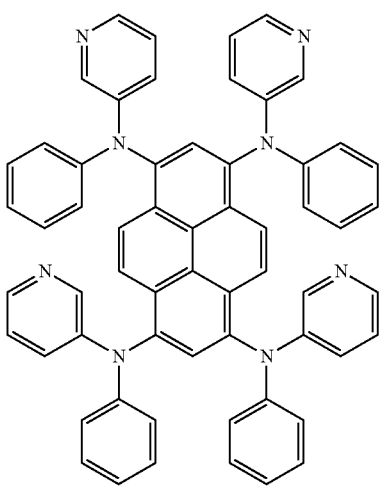

Cap233

The compound that meets the parametric requirements and has anthracene-based structure is described in detail below.

The attenuation coefficient and light-absorption coefficient has relation expressed in Equation (A) below, where, α: light-absorption coefficient, k: attenuation coefficient, ω: light frequency, c: velocity of light:

$$\alpha = \frac{2\kappa\omega}{c} \quad (A)$$

As shown in Equation (A), the compound's attenuation coefficient is in direct proportion to light-absorption coefficient. This means a material having high light-absorption coefficient also has high attenuation coefficient. Compounds of anthracene-based structure have very high light-absorption coefficient due to structural characteristics, and therefore high attenuation coefficient is obtained, so high refractive index may be expectable.

Further, compounds having anthracene-based structure are easily modified by substituents, so at least one point in the wavelength range of 430 nm to 460 nm the attenuation coefficient is easy to be greater than 0.10, and in the wavelength range of 430 nm to 500 nm, the attenuation coefficient is easy to be 0.10 or below. For this reason, the compound is preferably of anthracene-based structure.

In the present invention, the compound having anthracene-based structure is represented by Formula (7):

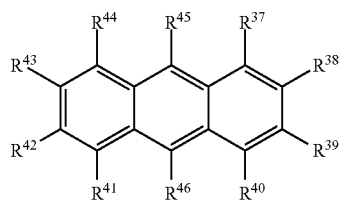

(7)

wherein, $R^{37}$ to $R^{46}$ may be identical or different, and each of $R^{37}$ to $R^{46}$ is one or more selected from the group consisting of hydrogen, deuterium, halogen, substitutable alkyl, cycloalkyl, heterocyclyl, alkenyl, cycloalkenyl, alkynyl, alkoxy, alkylthio, arylether, arylsulfide, aryl, heteroaryl, cyano, carbonyl, carboxyl, oxycarbonyl, carbamoyl, alkylamino and silyl, and may be bonded with an adjacent substituent to form a ring; when substitution is made, the substituent is one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C4-C55 aromatic heterocyclyl, carbonyl, carboxyl, oxycarbonyl, carbamoyl, C1-C55 alkylamino, and C3-C15 silyl that has 1 to 5 silicon atoms.

In the radical group represented by $R^{37}$ to $R^{46}$, the alkyl is preferably C1-C20 alkyl; and more preferably one or more saturated aliphatic hydrocarbon groups such as methyl, ethyl, n-propyl, isopropyl, n-butyl, sec-butyl and tetra-butyl. The alkyl may be with or without a substituent.

The cycloalkyl is preferably C3-C20 cycloalkyl; and more preferably one or more saturated aliphatic cyclic hydrocarbyls such as cyclopropyl, cyclohexyl, norbornyl and adamantyl.

The cycloalkyl may be with or without a substituent.

The heterocyclyl is preferably C3-C20 heterocyclyl; and more preferably one or more aliphatic rings having atoms other than carbon in the ring, such as pyran ring, piperidine ring, and cyclic amide. The heterocyclyl may be with or without a substituent.

The alkenyl is preferably C2-C20 alkenyl; and more preferably one or more unsaturated aliphatic hydrocarbyl groups containing a double bond such as vinyl, allyl and butadienyl. The alkenyl may be with or without a substituent.

The cycloalkenyl is preferably C3-C20 cycloalkenyl; and more preferably one or more unsaturated aliphatic cyclic hydrocarbyls containing a double bond such as cyclopentenyl, cyclopentadienyl and cyclohexenyl. The cycloalkenyl may be with or without a substituent.

The alkynyl is preferably C2-C20 alkynyl; and more preferably an unsaturated aliphatic hydrocarbyl containing a triple bond such as ethynyl. The alkynyl may be with or without a substituent.

The alkoxy is preferably C1-C20 alkoxy; and more preferably one or more functional groups bonded with aliphatic hydrocarbyls via ether bonds such as methoxy, ethoxy and propoxy. The aliphatic hydrocarbyl may be with or without a substituent.

The alkylthio is a radical group in which oxygen atoms of alkoxy are replaced with sulfur atoms. It is preferably C1-C20 alkylthio; the alkyl of alkylthio may be with or without a substituent.

The arylether is preferably C6-C60 arylether; and more preferably a functional group bonded with aromatic hydrocarbon groups via ether bonds such as phenoxy. The arylether may be with or without a substituent.

The arylsulfide is a radical group in which oxygen atoms of ether bonds of arylether are replaced with sulfur atoms. It is preferably C6-C60 arylsulfide. The aromatic hydrocarbon groups in arylsulfide may be with or without a substituent.

The aryl is preferably C6-C60 aryl; and more preferably one or more aromatic hydrocarbon groups such as phenyl, naphthyl, biphenyl, phenanthryl, terphenyl and pyrene. The aryl may be with or without a substituent.

The heteroaryl is preferably C4-C60 aromatic heterocyclyl; and more preferably one or more from furyl, thienyl, pyrrole, benzofuranyl, benzothienyl, dibenzofuranyl, dibenzothienyl, pyridyl and quinolyl. The aromatic heterocyclyl may be with or without a substituent.

The halogen atom is selected from fluorine, chlorine, bromine and iodine.

The carbonyl, carboxyl, oxycarbonyl, carbamoyl, and alkylamino may be with or without a substituent. The number of carbon atoms in the alkylamino substituent is not limited, while it is usually in the range of 2 to 60.

The silyl is expressed as a functional group having bonds bonded to silicon atoms, such as trimethylsilyl. Silyl may be with or without a substituent. The number of carbon atoms in silyl is not limited, while it is usually in the range of 3 to 20. In addition, the number of silicon atoms is in the range of 1 to 6.

The siloxy is expressed as a functional group that bonds silicon atoms through ether bonds, such as trimethylsiloxy. Siloxy may be with or without a substituent.

The substituent is one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino, and C3-C15 silyl that has 1 to 5 silicon atoms.

The compound having anthracene-based structure as expressed by Formula (7), may create steric hindrance effects when having the same or different substituents substituted, thereby providing superior thin-film stability.

It is thus clear that when the covering layer is made of a compound having anthracene-based structure with high refractive index and superior thin-film stability, light extraction efficiency and ageing stability can be improved.

Since the compound of anthracene-based structure with substituted amino exhibits excellent light-absorption coefficient, high attenuation coefficient may be obtained, and high refractive index is expectable.

In the present invention, the compound having anthracene-based structure is represented by Formula (8):

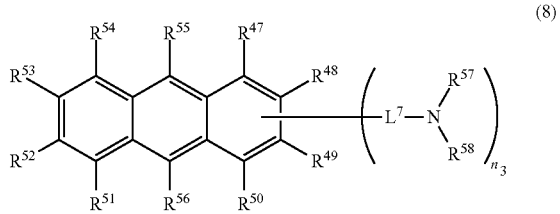

(8)

$R^{47}$ to $R^{56}$ may be identical or different, and each of $R^{47}$ to $R^{56}$ is one or more selected from the group consisting of hydrogen, deuterium, halogen, and substitutable alkyl, cycloalkyl, heterocyclyl, alkenyl, cycloalkenyl, alkynyl, alkoxy, alkylthio, arylether, arylsulfide, aryl, heteroaryl, cyano, carbonyl, carboxyl, oxycarbonyl, carbamoyl, alkylamino and silyl, and may be bonded with an adjacent substituent to form a ring;

$L^7$ is selected from arylene and heteroarylene and forms a single bond with one or more of $R^{47}$ to $R^{56}$;

$R^{57}$ and $R^{58}$ may be identical or different, and each of $R^{57}$ and $R^{58}$ is selected from substitutable alkyl, substitutable cycloalkyl, substitutable aryl, substitutable heteroaryl and substitutable heterocyclyl; and $n_3$ is an integer from 1 to 4, while at least one of $R^{47}$ to $R^{56}$ is bonded with $L^7$; when substitution is made, the substituent is one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C4-C55 aromatic heterocyclyl, carbonyl, carboxyl, oxycarbonyl, carbamoyl, C1-C40 alkylamino, and C3-C15 silyl that has 1 to 5 silicon atoms.

The arylene is preferably C6-C60 aryl; and more preferably one or more from aromatic hydrocarbon groups such as phenylene, naphthylene, biphenylene, phenanthrylene, terphenylene and pyrenylene. Arylene may be with or without a substituent.

The heteroarylene is preferably C4-C60 aromatic heterocyclyl; and more preferably one or more form furylene, thienylene, pyrrolidinylidene, benzofuranylene, benzothienylene, dibenzofuranylene, dibenzothienylene, pyridylene and quinolylene. Aromatic heterocyclylic group may be with or without a substituent.

The other substituents are the same as substituents described above.

In addition, as shown in the Lorentz-Lorent equation, refractive index is in direct proportion to polarizability and density. A material having higher polarizability and higher density has a greater refractive index.

$$\frac{n^2-1}{n^2+2} = \frac{4}{3}\pi\frac{P_\lambda}{V}$$

n: Refractive Index, λ: Light Wavelength, $P_\lambda$: Polarizability, V: Molecular Volume Heteroaryl helps to enhance polarizability, thereby contributing to high refractive index. Furthermore, since anthracene-based structure has high planarity, the reaction between molecules is strong. Thus, the anthracene derivatives have the tendency of increased density, and high refractive index is expectable on this aspect.

Further, considering from aspects of non-crystalline and thin-film stability, in Formula (8), at least one of $R^{57}$ to $R^{58}$ is heteroaryl, and preferably pyridyl or quinolyl.

Moreover, considering from aspects of easy synthesis and heat resistance during film formation in the process of heating evaporation, $n_3$ is preferably 1 or 2.

In the present invention, a more preferably compound of anthracene-based structure is as expressed in Formula (9).

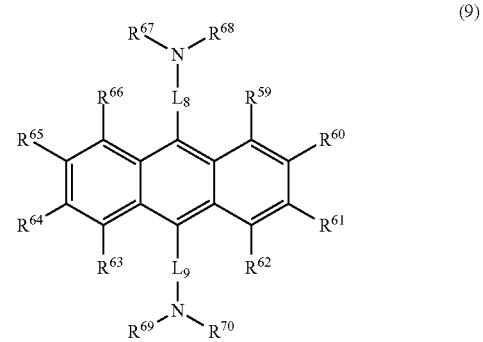

(9)

$R^{59}$ to $R^{66}$ may be identical or different, and each of $R^{59}$ to $R^{66}$ is one or more selected from the group consisting of hydrogen, deuterium, halogen, and substitutable alkyl, cycloalkyl, heterocyclyl, alkenyl, cycloalkenyl, alkynyl, alkoxy, alkylthio, arylether, arylsulfide, aryl, heteroaryl, cyano, carbonyl, carboxyl, oxycarbonyl, carbamoyl, alkylamino and silyl, and may be bonded with an adjacent substituent to form a ring;

Each of $L^8$ and $L^9$ is selected from arylene and heteroarylene; and $R^{67}$ to $R^{70}$ may be identical or different, and each of $R^{67}$ to $R^{70}$ is selected from substitutable alkyl, substitutable cycloalkyl, substitutable aryl, substitutable heteroaryl and substitutable heterocyclyl; when substitution is made, the substituent is one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C4-C55 aromatic heterocyclyl, carbonyl, carboxyl, oxycarbonyl, carbamoyl, C1-C40 alkylamino, and C3-C15 silyl that has 1 to 5 silicon atoms.

The compound of anthracene-based structure is not particularly limited, and the following are some examples.

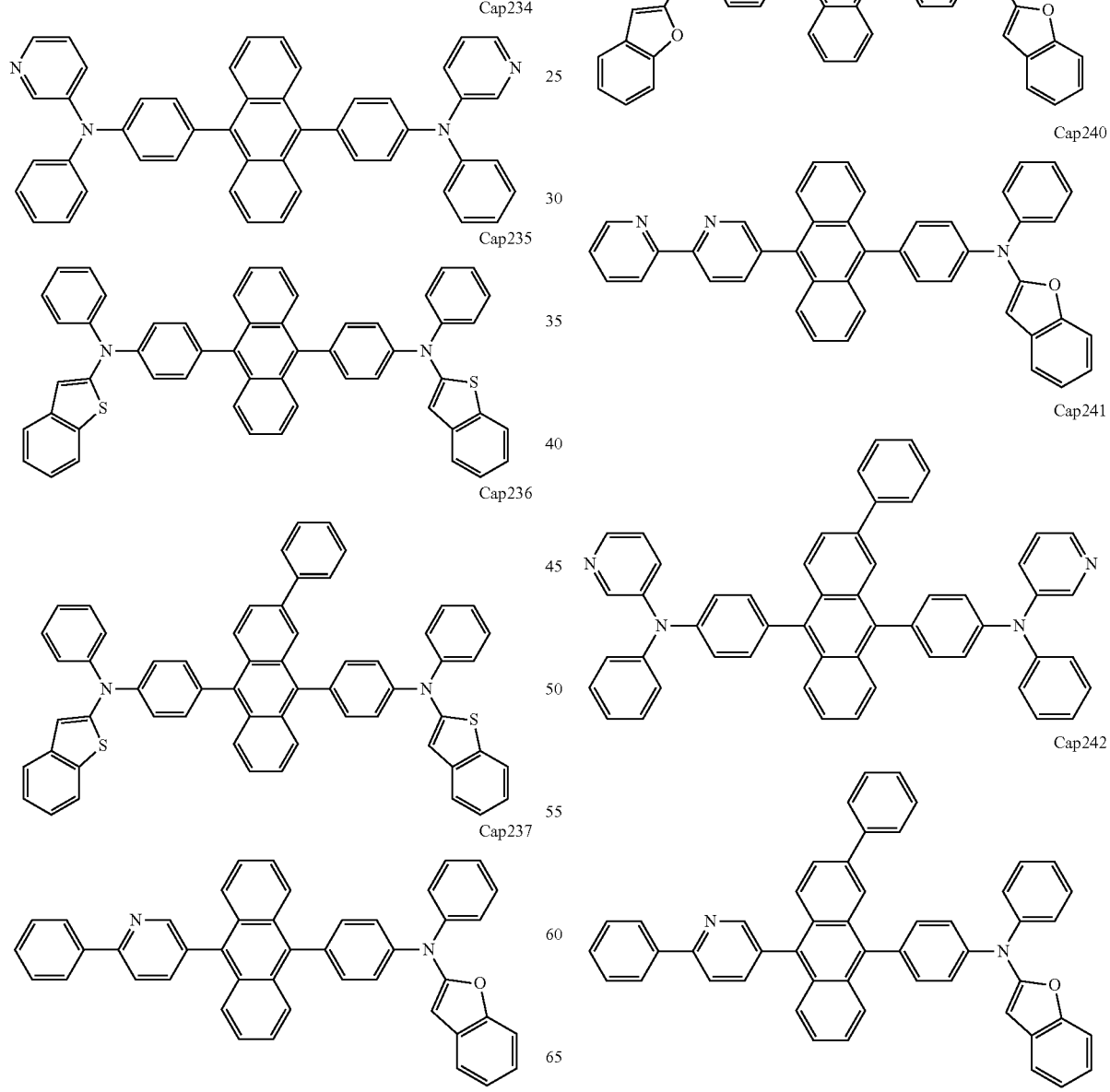

Cap243
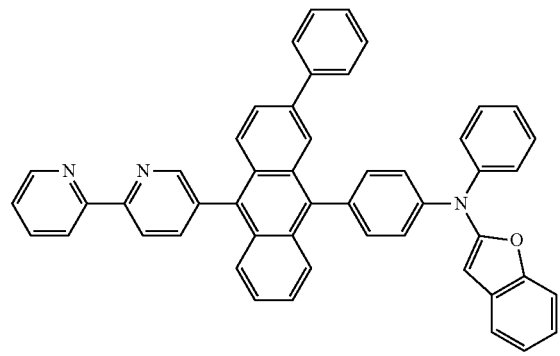
Cap244
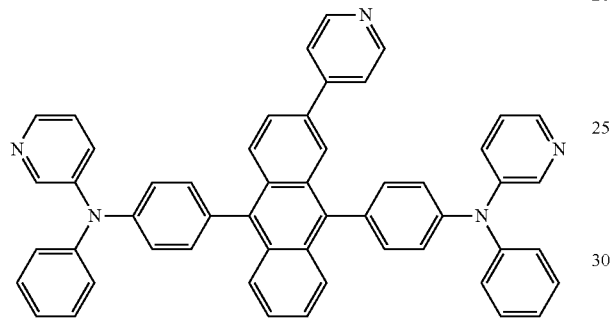
Cap245
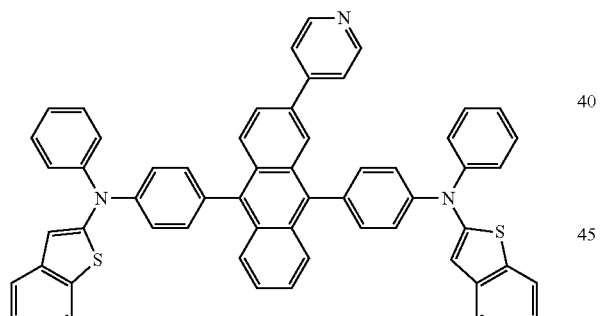
Cap246
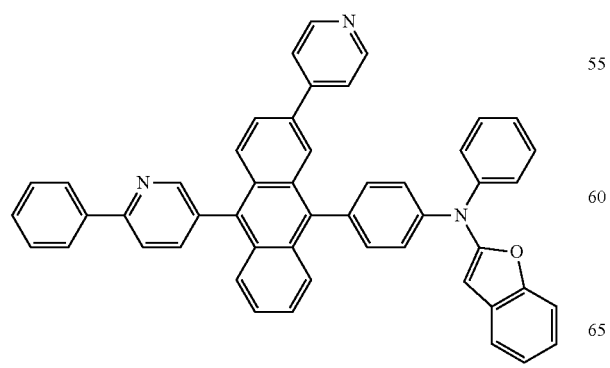
Cap247
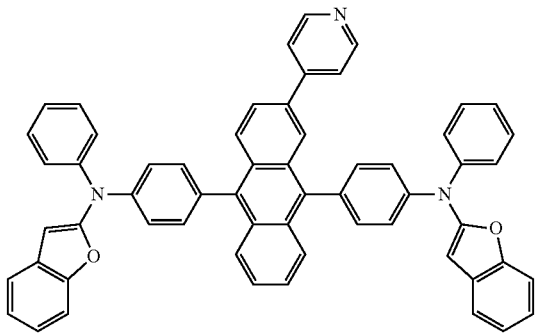
Cap248
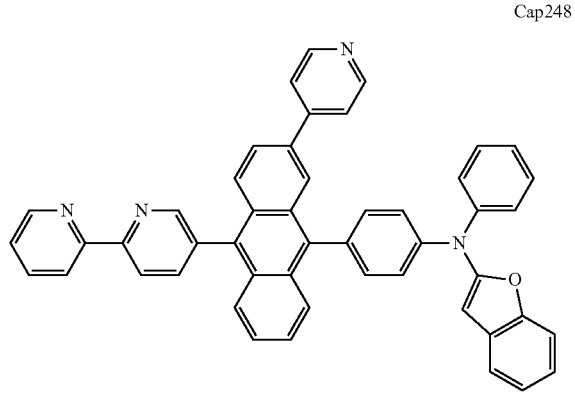
Cap249
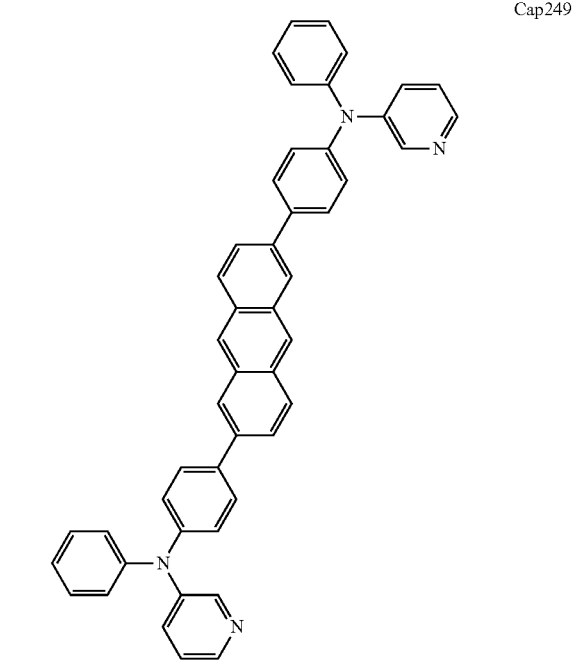

Cap250
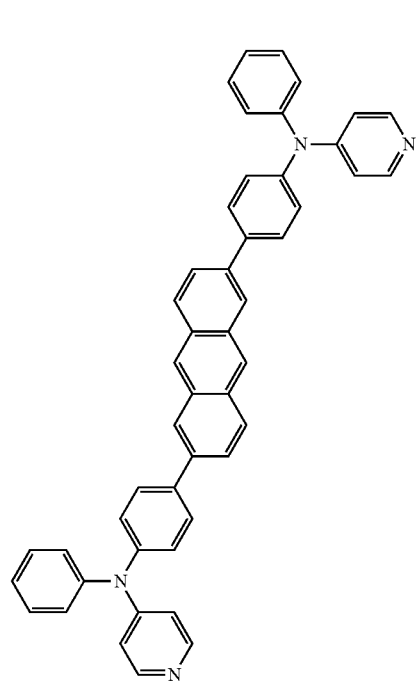
Cap252
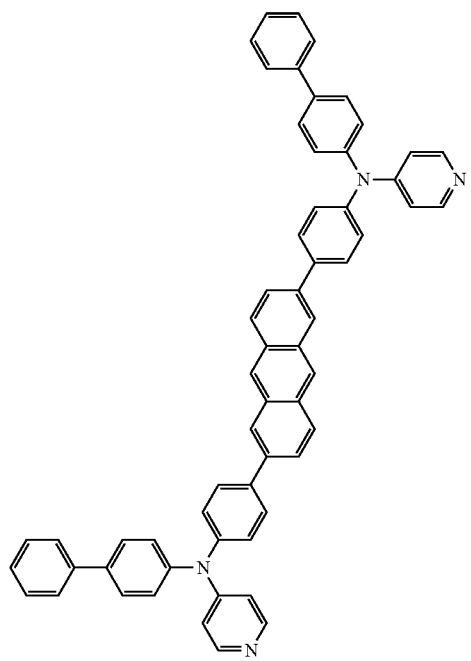
Cap251
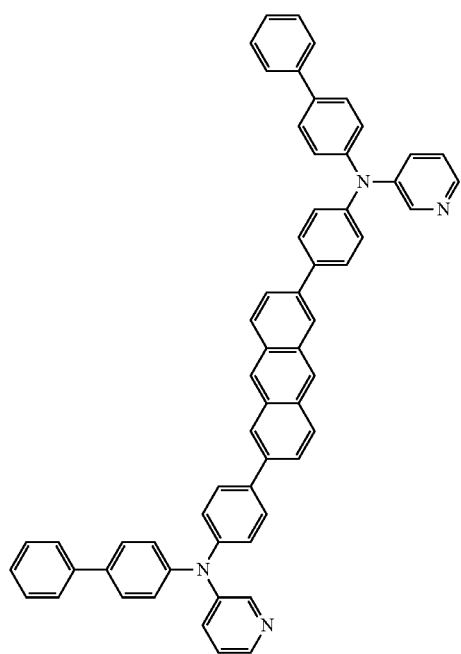
Cap253
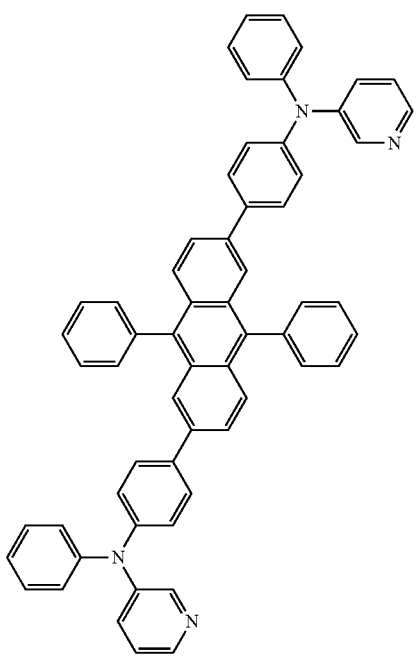

-continued
Cap254
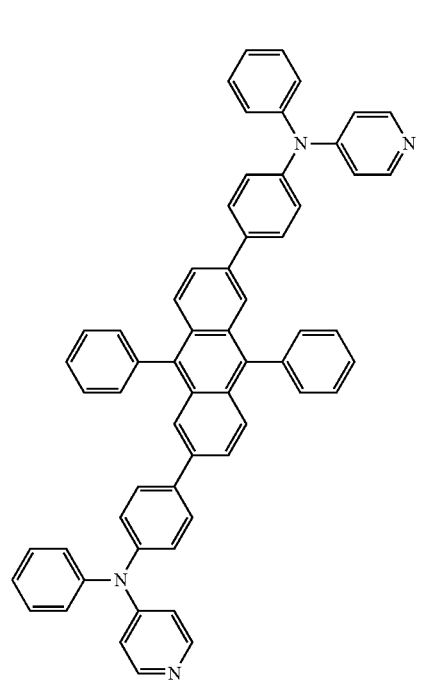
Cap255
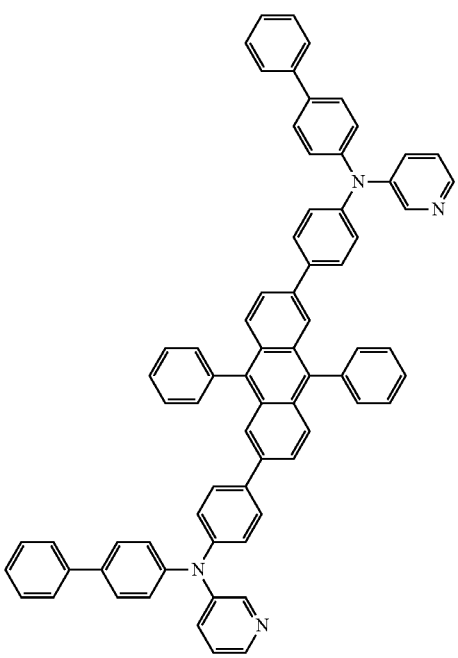
-continued
Cap256
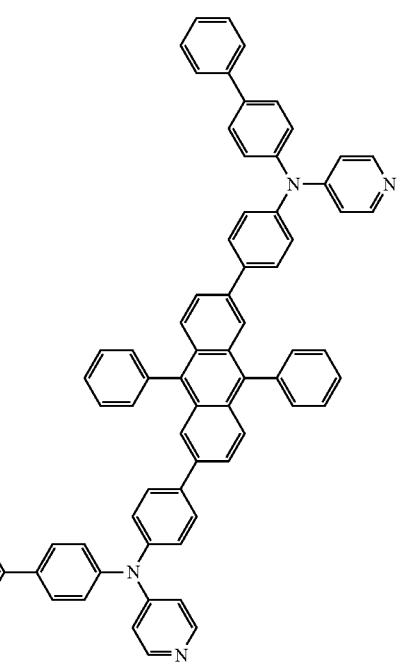
Cap257
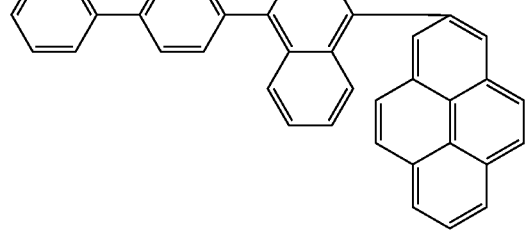
Cap258
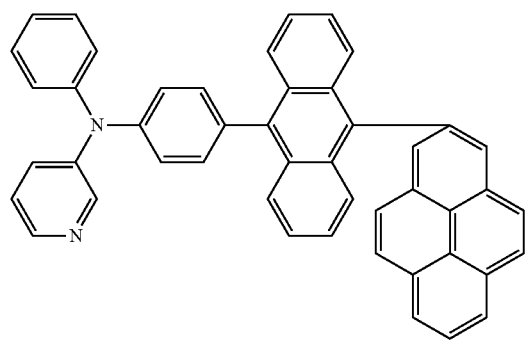

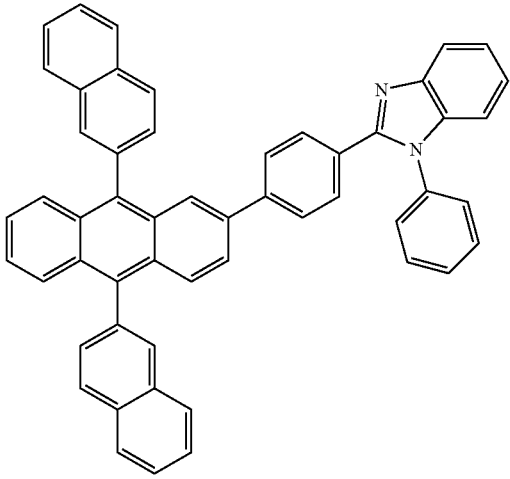

Cap259

The materials for the covering layer as expressed in Formulas (1), (4), and (7) may be synthesized using any known methods, such as coupling reaction between halogenated pyrene and arylboronic acid in the presence of a palladium catalyst, and coupling reaction between halogenated pyrene and a diamino compound, however, the synthesizing methods are not limited to the above methods.

The implementation of the disclosed organic light-emitting element will be described below. According to the present invention, the organic light-emitting element comprises a substrate, a first electrode, one layer or more of organic film in which a light-emitting layer is included, a second electrode allowing the light emitted by the light-emitting layer to pass through and a covering layer in order. The light-emitting layer emits light when energized.

In the disclosed light-emitting element of the present invention, the substrate used is preferably a glass substrate such as soda glass, alkali-free glass, etc. The thickness of the glass substrate is not limited as long as it is enough to maintain the mechanical strength of the substrate, such as, for example, 0.5 mm or more. The glass material for the substrate having fewer ions dissolved therefrom is better, and thus the alkali-free glass is preferred. Alternatively, glass with protective coating made of $SiO_2$ sold in the market may be used. If the first electrode functions stably, the substrate may not necessarily be made of glass. For example, an anode may be formed on a plastic substrate.

The material of the first electrode is preferably made of metals having high refractive index, such as gold, silver, aluminum and metallic alloys such as APC alloys. These metals and metallic alloys may be stacked into multiple layers. Additionally, one or more transparent conducting metallic oxides such as tin oxide, indium oxide and indium tin oxide (ITO), indium zinc oxide (IZO) may be used to cover the upper surface and/or lower surface of theses metals, metallic alloys or their laminate.

The material of the second electrode is preferably made of a material that can form translucent or transparent film pervious to light, such as silver, magnesium, aluminum, calcium or alloys thereof and transparent conducting metallic oxides, such as tin oxide, indium oxide, indium tin oxide (ITO), and indium zinc oxide (IZO). These metals, alloys or metallic oxides may be stacked into multiple layers.

The foregoing electrodes may be made through resistive heating evaporation, electron-beam evaporation, sputtering, ion plating, or adhesive coating, without particular limitation. Moreover, according to the work functions of the material used in the first electrode and the second electrode, one acts as an anode relative to the organic film layer, and the other acts as a cathode.

In addition to the light-emitting layer, the organic layer may have 1) a hole transport layer/a light-emitting layer, 2) a light-emitting layer/an electron transport layer, 3) a hole transport layer/a light-emitting layer/an electron transport layer, 4) a hole injection layer/a hole transport layer/a light-emitting layer/an electron transport layer, or 5) a hole injection layer/a hole transport layer/a light-emitting layer/ an electron transport layer/an electron injection layer that form a stacked structure. In addition, each of the layers may be a single layer or multiple layers. When the structures of 1) to 5) are used, the anode side electrode is connected to the hole injection layer or the hole transport layer, and the cathode side electrode is connected to the electron injection layer or the electron transport layer. The hole transport layer may be formed by staking or mixing one or more hole transport materials, or by using mixture of a hole transport material and a high molecular adhesive. The hole transport material needs to efficiently transport holes from the anode between electrodes with electric field applied, so it is desired that the efficiency of hole injection is high, and the injected holes can be efficiently transported. For this reason, the hole transport material should have appropriate ionic potential and high hole mobility, therefore the material displays superior stability and prevents generation of impurities that may form traps during manufacturing and use. Any material satisfying such requirement may be used, including but not limited to benzidines, such as 4,4'-bis(N-(3-methylphenyl)-N-phenyl amino) biphenyl (TPD); 4,4'-bis(N-(1-naphthyl)-N-phenyl amino)biphenyl (NPD); 4,4'-bis(N,N-bis(4-biphenyl)amino)biphenyl (TBDB); bis(N,N-diphenyl-4-phenylamino)-N, N-diphenyl-4, 4'-diamino-1, 1'-biphenyl (TPD232); and material sets that are so-called star-shaped triarylamines, such as 4, 4', 4"-tris(3-methylphenyl (phenyl) amino)triphenylamine (m-MTDATA), 4, 4', 4"-tris(1-naphthyl (phenyl)amino)triphenylamine (1-TNATA), materials having carbazole-based structure, which are preferably carbazole-based polymers, including dicarbazole derivatives such as bis(N-aryl carbazole) and bis(N-alkyl carbazole), triscarbazole derivatives and tetracarbazole derivatives, heterocyclic compounds such as triphenyl compounds, pyrazoline derivatives, stilbene-containing compounds, hydrazine-containing compounds, benzofuran derivatives, thiophene derivatives, oxadiazole derivatives, phthalocyanine derivatives and porphyrin derivatives and fullerene derivatives. In polymers, more preferable are polycarbonates whose side chain has the foregoing monomers or styrene derivatives, polythiophene, polyaniline, polyfluorene, poly vinyl carbazole and polysilane. Also, inorganic compounds such as P-type Si and P-type SiC may be used.

A hole injection layer may be provided between the anode and the hole transport layer. Setting the hole injection layer helps to reduce driving voltage and improve durability life of the resultant organic light-emitting element. The hole injection layer is preferably made of a material whose ionic potential is lower than the hole transport layer.

Particularly, the material may be a biphenyl amine derivative like TPD232, or a star-shaped triarylamine material set. A phthalocyanine derivative may be also used. In addition, it is preferable that the hole injection layer is made of a receptor compound alone, or the receptor compound is doped into other hole transport layers. The receptor compounds may be, for example, metallic chlorides such as ferric trichloride (III), aluminum chloride, gallium chloride, indium chloride, and antimony chloride; metallic oxides such as molybdenum oxide, vanadium oxide, tungsten oxide, and ruthenium oxide; and charge-transfer ligands such as tris(4-bromophenyl) aminium hexachloroantimonate (TBPAH). Also, the receptor compounds may be organic compounds whose molecules contain nitryl, cyano, halogen or trifluoromethyl; quinone-containing compounds; estolide-containing compounds; and fullerene.

In the present invention, the light-emitting layer may be a single layer or multiple layers, and may be individually made of light-emitting materials (a host material and a doping material). It may either be a mixture of the host material and the doping material, or it may be the host material itself, either case may work. In other words, in the light-emitting layer of the disclosed light-emitting element, it may be that only the host material emits light or only the doping material emits light, or the host material and the doping material emitting light together. Considering from using the power efficiently and obtaining the light of high color purity, it is preferable that the light-emitting layer is made by mixing the host material and the doping material. Furthermore, the host material and the doping material may be a single material or a combination of multiple materials, either case may work. The doping material may be added into the whole host material, or may be added into one part of the host material, either case may work. Doping materials may be stacked into layers, or may be dispersed, either case may work. The doping material may control the color of light emitted. Excess addition of the doping material may lead to concentration quenching. Therefore, the use of the doping material with respect to the host material is preferably 20 weight %, more preferably is 10 weight % or below. Doping methods may be achieved by evaporation together with the host material, or may be processed by evaporation after being mixed with the host material.

The light-emitting material, particularly, may use condensed nucleus derivatives conventionally known as light-emitting element, including anthracene and pyrene; metal-chelating hydroxyquinoline compounds, including tris(8-hydroxyquinoline)aluminum; dibenzofuran derivatives; carbazole derivatives; indolocarbazole derivatives; and polymers, including polyphenylene vinylidene derivatives, poly(p-phenylene) derivatives, and polythiophene derivatives, without particular limitation. The host material included in the light-emitting material is not limited herein, and may be compounds having condensed arylcyclic structure or derivatives thereof such as anthracene, phenanthrene, pyrene, benzophenanthrene, tetracene, perylene, benzo[9,10]phenanthrene, fluoranthene, fluorene, and indene; aromatic amine derivatives, such as N, N'-dinaphthyl-N, N'-diphenyl-4, 4'-diphenyl-1, 1'-diamine; metal-chelating hydroxyquinoline compounds such as tris(8-hydroxyquinoline)aluminum; pyrrolopyrrole derivatives, dibenzofuran derivatives; carbazole derivatives; indolocarbazole derivatives; and triazine derivatives.

In these polymers, poly phenylene vinylidene derivatives, poly(p-phenylene) derivatives, polyfluorene derivatives, polyvinyl carbazole derivatives, and polythiophene derivatives may be used without particular limitation.

In addition, the doping material is not limited herein, and may be compounds having condensed arylcyclic structure such as naphthalene, anthracene, phenanthrene, pyrene, benzophenanthrene, perylene, benzo[9, 10]phenanthrene, fluoranthene, fluorene, and indene, or derivatives thereof (e.g. 2-(benzothiazole-2-yl)-9, 10-diphenyl anthracene); and compounds having heteroaromatic rings such as furan, pyrrole, thiophene, silole, 9-silicon heterofluorene, 9, 9'-spiro two silicon heterofluorene, benzothiophene, benzofuran, indole, dibenzothiophene, dibenzofuran, imidazolopyridine, phenanthroline, pyridine, pyrazine, naphthyridine, quinoxaline, pyrrolopyridine, and thixol, or derivatives thereof; zole derivatives such as borane derivatives, distyryl benzene derivatives, aminostyryl derivatives, pyrromethene derivatives, diketone pyrrolo[3, 4-c]pyrrole derivatives, coumarin derivatives, imidazole, thiazole, thiadiazole, carbazole, oxazole, oxadiazole, and triazole; and aromatic amine derivatives.

Moreover, the light-emitting layer may dope a phosphorescent material therein. The phosphorescent material is a material that phosphoresces at room temperature. When a phosphorescent material is used as a doping agent, there is no particular limitation as long as it phosphoresces at room temperature. The material is preferably an organic metallic complex containing at least one selected from indium, ruthenium, rhodium, palladium, platinum, osmium and rhenium. Considering from achieving high efficiency of phosphorescence at room temperature, it contains more preferably an organic metallic clathrate of indium or platinum. The host material used with such phosphorescent doping agent, below compounds may be well used. The compounds and derivatives include indole derivatives, carbazole derivatives, indolocarbazole derivatives, nitrogen-containing aromatic compound derivatives containing pyridine-, pyrimidine- or triazine structure, aromatic compound derivatives such as polyaryl benzene derivatives, spirofluorene derivatives, truxene, benzo[9, 10]phenanthrene, compounds containing chalcogens such as dibenzofuran derivatives and dibenzothiophene, and organic metallic clathrates such as hydroxyquinolineberyllium clathrate. Basically, there is no additional limitation, as long as the triplet energy level of these materials is higher than that of the selected doping agent, electrons and holes can be successfully injected or transported from the layers where they are in. Besides, the light-emitting layer may contain two or more triplet-state light-emitting doping agents, and/or two or more host materials. Alternatively, the light-emitting layer may contain one or more triplet-state light-emitting doping agents and one or more fluorescence doping agents.

In the present invention, the electron transport layer is a layer where electrons are injected from the cathode and then transported. The electron transport layer preferably has high efficiency of electron injection and may transport the injected electrons efficiently. Therefore, the electron transport layer is preferably made of a material that has high electron affinity, high electron mobility, and superior stability, and is unlikely to generate impurities that may form traps during manufacturing and use. However, in the consideration of transport balance of holes and electrons, if the electron transport layer is mainly used to effectively prevent the holes from the anode from getting combined and flowing to the cathode side. Even if the electron transport layer is made of a material which the electron transport capability is not so high, the effect of improving light-emitting efficiency is the same as that where a material having high electron transporting ability is used. Hence, in the electron transport layer of the present invention, a hole blocking layer that prevents holes from hole migration is also included as an equivalent.

The electron transport material used in the electron transport layer is not limited herein, and may be condensed arylcyclic derivatives such as naphthalene and anthracene;

styryl-based aromatic cyclic derivatives such as 4, 4'-bis (diphenyl vinyl)biphenyl; quinone derivatives such as anthraquinone and biphenyl quinone; phosphine oxide derivatives; hydroxyquinoline clathrates such as tris(8-hydroxyquinoline)aluminum; benzohydroxy quinoline clathrates, hydroxyzole clathrates, azomethine clathrates, tropolone metallic clathrates or flavonol metallic clathrates. For reducing the driving voltage and obtaining a high efficient light-emitting, it is preferably a compound having heteroaromatic-ring structure. The heteroaromatic-ring structure is composed of elements selected from carbon, hydrogen, nitrogen, oxygen, silicon, and phosphorous, and containing electron-withdrawing nitrogen.

Electron-withdrawing nitrogen containing heteroaromatic rings have high electron affinity. An electron transport material containing electron-withdrawing nitrogen tends to receive electrons coming from the cathode having high electron affinity, thereby reducing the driving voltage required by the light-emitting element. In addition, since supply of electrons to the light-emitting layer increases, the probability of recombination in the light-emitting layer is increased, therefore the light-emitting efficiency is improved. Heteroaromatic rings containing electron-withdrawing nitrogen include, for example, pyridine ring, pyrazin ring, pyrimidine ring, quinoline ring, quinoxaline ring, naphthyridine ring, pyrimidopyrimidine ring, benzoquinoline ring, phenanthroline ring, imidazole ring, oxazole ring, oxadiazole ring, triazole ring, thiazole ring, thiadiazole ring, benzooxazole ring, benzothiazole ring, benzoimidazole ring, and phenanthroimidazole ring.

Besides, compounds having theses heteroaromatic rings include, for example, low polypyridine derivatives such as benzoimidazole derivatives, benzooxazole derivatives, benzothiazole derivatives, oxadiazole derivatives, thiadiazole derivatives, triazole derivatives, pyrazine derivatives, phenanthroline derivatives, quinoxaline derivatives, quinoline derivatives, benzoquinoline derivatives, bipyridine, terpyridine. Where the derivative has condensed arylcyclic structure, glass transition temperature is raised and electron mobility increases. Thereby, the driving voltage of the light-emitting element can be significantly reduced, so it is preferred. In addition, in view of improving of the durability life, fabrication easiness and material availability of the resultant light-emitting element, it is preferable that the foregoing condensed arylcyclic structure is anthracene-based structure, pyrene-based structure or phenanthroline-based structure.

The aforementioned electron transport materials may be used alone, or may be used in a combination of two or more thereof, or may be used having one or more other electron transport materials mixed thereto. In addition, a donor compound may be added thereto. Herein, the donor compound refers to a compound that the electric conductivity of the electron transport layer is improved by improving electron-injection energy barrier and making electrons easily enter the electron transport layer from the cathode or the electron injection layer. In the present invention, such a donor compound is preferably, for example, an alkaline metal, an inorganic salt containing alkaline metal, a clathrate of an alkaline metal and an organic substance, an alkaline earth metal, an inorganic salt containing alkaline earth metal and a clathrate of an alkaline earth metal and an organic substance. Preferable alkaline metal or alkaline earth metal may be alkaline metal having low work function and effectively improved electron transport capability, such as lithium and sodium and cesium and alkaline earth metals such as magnesium and calcium.

In the present invention, an electron injection layer may be provided between the cathode and the electron transport layer. Typically, the electron injection layer is inserted for moving electrons from the cathode to the electron transport layer. When it is inserted, the electron injection layer may be made of a compound of heteroaromatic-ring structure containing electron-withdrawing nitrogen, and may be a layer containing the foregoing donor compounds. Moreover, in the electron injection layer, inorganic substances such as insulators or semiconductors may be used.

Use of these materials effectively prevents the light-emitting element from short circuit, and improves electron injection, thus it is preferred. The insulator may be at least one metallic compound selected from alkaline metal chalcogenides, alkaline earth metal chalcogenides, alkaline metal halides and alkaline earth metal halides. In addition, clathrates of organic substances and metals may be used well.

The method for making the layers of the light-emitting element as described above, may be resistive heating evaporation, electron-beam evaporation, sputtering, molecular stacking, or coating, without particular limitation. However, for better properties of the resultant element, resistive heating evaporation or electron-beam evaporation is more preferable.

The thickness of the organic layer depends on the resistance of the light-emitting substances and it is not limited herein, thickness of 1 to 1000 nm may be preferable. The light-emitting layer, the electron transport layer, and the hole transport layer each has film thickness of preferably 1 nm or more and 200 nm or less, more preferably 5 nm or more and 100 nm or less.

The covering layer used in the present invention contains at least one of a compound of a thiophene-based structure, a furan-based structure or a pyrrole-based structure, a compound having a pyrene-based structure, and a compound having an anthracene-based structure as described above, so to the covering layer has a high light-emitting efficiency. The compound of a thiophene-based structure, a furan-based structure or a pyrrole-based structure has very high light-absorption coefficient, and therefore has a high refractive index. Further, due to superior film-forming capability in evaporation, the substrate such as glass or metal, may both have a stable refractive index and an extinction coefficient. When the substrate of a material having poor film-forming capability in evaporation changes, the refractive index and the extinction coefficient tend to vary significantly with the substrate. For maximizing light-emitting efficiency and realizing the color reproducibility, it is preferable that layers of phosphine oxide derivatives are stacked in a thickness of 20 nm to 120 nm, more preferably in a thickness of 40 nm to 80 nm. Also for maximizing light-emitting efficiency, it is even more preferably the layer for improving light extraction efficiency has thickness of 50 nm to 70 nm.

The method for forming the covering layer is not limited, may be resistive heating evaporation, electron-beam evaporation, sputtering, molecular stacking, coating, ink-jet, dragging, or laser transfer.

The disclosed light-emitting element converts electricity into light. Herein, the electricity may use direct current or pulse current or alternating current. The current and voltage used are not limited, for better power consumption and service life of the resultant element, selection shall be made to achieve maximum illumination with minimum energy.

The disclosed light-emitting element is very suitable for flat-panel displays that display information in the form of a matrix and/or as columns.

In matrix-based displays, congregation of pixels for presenting texts or images are arranged in two-dimensional configuration, such as a grid or a mosaic. The pixel has a shape and a size depending on its applications. For example, for presenting texts and images in computers, monitors, and TV sets, quadrilateral pixels are used, and each of the pixels has a side-length of 300 um or less. In addition, for large-sized displays such as billboards, pixels used may have a side-length of the mm scale. For monochromatic display, all the arranged pixels are of the same color. For chromatic display, red, green, and blue pixels are arranged in a certain pattern. In this case, a triangular pattern or a stripe pattern is typically used. Moreover, the matrix may be driven by a line-by-line method or using an active matrix. While a line-by-line method is structurally simple, its operational properties in some cases may be inferior to those of an active matrix. Thus, it is important to use the two approaches flexibly according to the practical use.

As mentioned in the present invention, column-based display involves arranging pixels into a pattern and making areas defined by the pattern emit light, to show the predetermined information. Such applications may include time and temperature indications in digital clocks and thermometers, working state indications for audio systems and electromagnetic stoves, and indications of in-car information modules. The aforementioned matrix display and column display may be incorporated in a single panel.

The disclosed light-emitting element is a perfect light source for illumination, as it is thinner and lighter than the existing devices, and capable of planar light-emitting.

EXAMPLES

In the described Examples and Comparative Examples below, the following compounds were used:

Cap007 (2, 5-bis(4-(N-4-biphenyl)-(N-3-pyridyl)aminophenyl)thiophene),
Cap010 (2, 5-bis(4-(N-4-biphenyl)-(N-4-pyridyl)aminophenyl)thiophene),
Cap018 (2, 5-bis(4-(N-3-biphenyl)-(N-3-pyridyl)aminophenyl)thiophene),
Cap208 (1, 6-bis(4-(N-3-pyridyl)-(N-phenyl)aminophenyl) pyrene,
Cap259 (2-((4-(1-phenyl-1H-benzo[d] imidazolyl))phenyl)-9, 10-bis(2-naphthyl)anthracene),
Cap011 (2, 5-bis(4-(N-4-biphenyl)-(N-2-pyridyl)aminophenyl)thiophene),
Cap052 (2, 5-bis(4-(N-4-biphenyl)-(N-3-pyridyl)aminophenyl)furan),
Cap260 (N, N'-biphenyl-N, N'-bis(6-quinolyl)-1, 1'-phenyl-4, 4'-diamine),
Cap261 (N, N'-biphenyl-N, N'-bis(3-pyridyl)-diphenyl vinyl-4, 4'-diamine),
Com-1 (NPD),
Com-2 (N, N, N', N'-tetra(4-biphenyl) diaminobiphenylene),
Com-3 (9-phenyl-9'-(3, 5-diphenyl)phenyl-3, 3'-9H-bicarbazole),
Com-4 (9-(2-naphthyl)-10-(4-(1-naphthyl)phenyl)anthracene),
Com-5 (1-[4-(9H-carbazoyl)phenyl]-6-phenyl pyrene),
Com-6 (2,5-bis(4-(N-4-biphenyl)-(N-3-pyridineamino)) naphthalene),
NPD (N, N'-diphenyl-N, N'-bis(1-naphthyl)-1, 1'-biphenyl-4,4'-diamine),
F4-TCNQ (2, 3, 5, 6-tetrafluoro-7, 7', 8, 8'-tetracyanodimethyl p-benzoquinone),
BH (9-(2-naphthyl)-10-(4-(1-naphthyl)phenyl)anthracene),
BD (E-7-(4-(diphenyl amino)styryl)-N, N-diphenyl-9, 9'-dimethylfluorenyl-2-amine),
Alq$_3$ (tris(8-hydroxyquinoline)aluminum).

For each compound described herein, in case the chemical denomination and the structural formula of the compound are both given herein, the structure of the compound is subject to the structural formula.

Preparation of Thin-Film Samples

An alkali-free glass substrate (Asahi Glass Co., Ltd., AN100) was washed by UV ozone for 20 minutes and placed into a vacuum evaporator. Air exhaust was performed until the degree of vacuum in the evaporator became higher than $1 \times 10^{-3}$ Pa. Under this condition, thin film of 50 nm was deposited on the substrate through resistive heating evaporation.

The speed for evaporation was 1 nm/s.

The refractive index and attenuation coefficient of the thin-film sample were measured in Toray Research Center Inc. by using an ellipsometer (J.A. Woollam Co, Inc., M-2000).

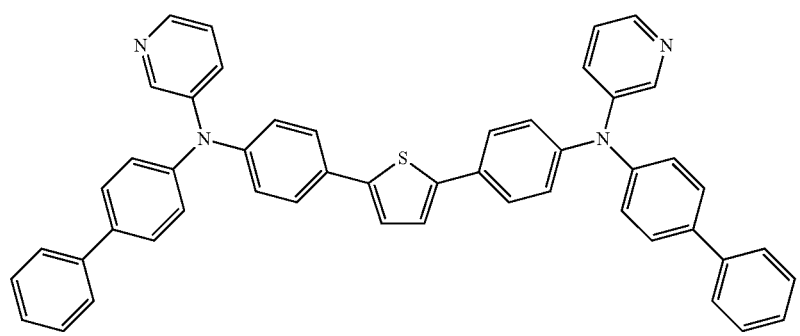

(Cap007)

Optical Constants of Cap007 Shown in Table 1

TABLE 1

| | $\lambda = 430$ nm | | $\lambda = 460$ nm | | $\lambda = 500$ nm | |
|---|---|---|---|---|---|---|
| | n | k | n | k | n | k |
| Cap007 | 2.45 | 0.39 | 2.29 | 0.03 | 2.10 | 0.00 |

·✗·Optical constants (refractive index: n, attenuation coefficient: k) were rounded off to second decimal place.

Evaluation of Light-Emitting Elements

Example 1

Alkali-free glass was ultrasonically washed in isopropanol for 15 minutes, and washed by UV ozone for 30 minutes in the atmosphere. Vacuum evaporation was performed. The anode was first made by depositing 100 nm aluminum through evaporation. Then on the anode, a hole injection layer (NPD and F4-TCNQ (with a weight ratio of 97:3), 50 nm), a hole transport layer (NPD, 80 nm), a blue light-emitting layer (BH and BD (with a weight ratio of 97:3, 20 nm), an electron transport layer ($Alq_3$, 30 nm), an electron injection layer (LiF, 1 nm) were stacked in order through evaporation. And then, a translucent cathode was made of Mg and Ag (with a weight ratio of 10:1, 15 nm) through co-evaporation.

The compounds used are shown below.

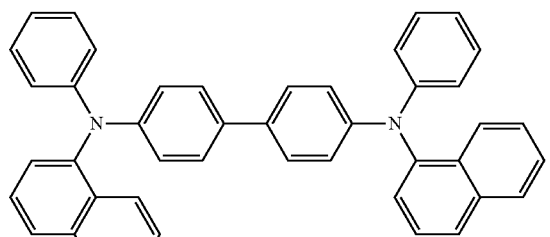

(NPD)

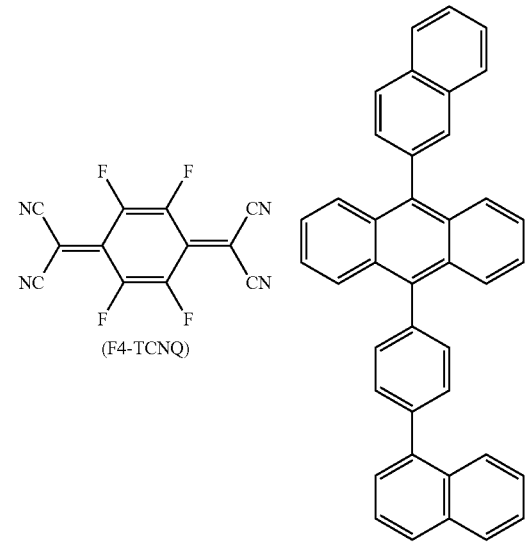

(F4-TCNQ)

(BH)

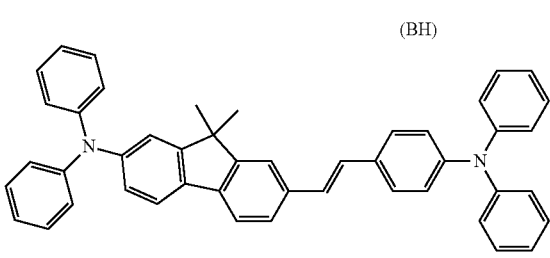

(BD)

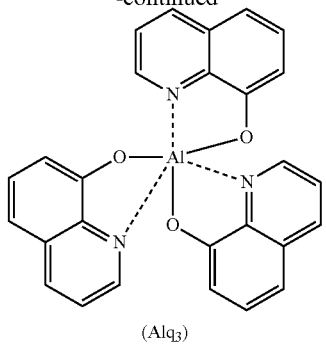

($Alq_3$)

Cap007 (60 nm) was then deposited through evaporation to form a covering layer.

At last, under dry nitrogen atmosphere in a glove box, a sealing plate made of alkali-free glass was adhered to the light-emitting element using an epoxy binder.

At room temperature and at ambient atmosphere, direct current was applied to the light-emitting element at 10 $mA/cm^2$. A spectroradiometer (CS1000, Konica Minolta, Inc.) was used to test light coming out from the sealing plate in terms of illumination and color purity. The measurements were luminosity rate of 6.5 cd/A and color purity of CIE (x, y)=(0.139, 0.051). It was proven that using the covering layer made of Cap007 may obtain a high performance light-emitting element with high light-emitting efficiency and high color purity.

The organic light-emitting element was evaluated. The results are shown in Table 2.

Example 2

Excepting that the covering layer material was Cap010 instead, all the other conditions were the same as Example 1.

The organic light-emitting element was evaluated. The results are shown in Table 2.

Example 3

Excepting that the covering layer material was Cap018 instead, all the other conditions were the same as Example 1.

The organic light-emitting element was evaluated. The results are shown in Table 2.

Example 4

Excepting that the covering layer material was Cap208 instead, all the other conditions were the same as Example 1.

The organic light-emitting element was evaluated. The results are shown in Table 2.

Example 5

Excepting that the covering layer material was Cap259 instead, all the other conditions were the same as Example 1.

The organic light-emitting element was evaluated. The results are shown in Table 2.

Example 6

Excepting that the covering layer material was Cap011 instead, all the other conditions were the same as Example 1.

The organic light-emitting element was evaluated. The results are shown in Table 2.

Example 7

Excepting that the covering layer material was Cap052 instead, all the other conditions were the same as Example 1.

The organic light-emitting element was evaluated. The results are shown in Table 2.

Example 8

Excepting that the covering layer material was Cap260 instead, all the other conditions were the same as Example 1.

The organic light-emitting element was evaluated. The results are shown in Table 2.

Example 9

Excepting that the covering layer material was Cap261 instead, all the other conditions were the same as Example 1.

The organic light-emitting element was evaluated. The results are shown in Table 2.

Comparative Example 1

Excepting that the covering layer material was Com-1 instead, all the other conditions were the same as Example 1.

The organic light-emitting element was evaluated. The results are shown in Table 2.

Comparative Example 2

Excepting that the covering layer material was Com-2 instead, all the other conditions were the same as Example 1.

The organic light-emitting element was evaluated. The results are shown in Table 2.

Comparative Example 3

Excepting that the covering layer material was Com-3 instead, all the other conditions were the same as Example 1.

The organic light-emitting element was evaluated. The results are shown in Table 2.

Comparative Example 4

Excepting that the covering layer material was Com-4 instead, all the other conditions were the same as Example 1.

The organic light-emitting element was evaluated. The results are shown in Table 2.

Comparative Example 5

Excepting that the covering layer material was Com-5 instead, all the other conditions were the same as Example 1.

The organic light-emitting element was evaluated. The results are shown in Table 2.

Comparative Example 6

Excepting that the covering layer material was Com-6 instead, all the other conditions were the same as Example 1.

The organic light-emitting element was evaluated. The results are shown in Table 2.

The chemical structural formulas of the covering layer materials used in Examples and Comparative Examples are given below.

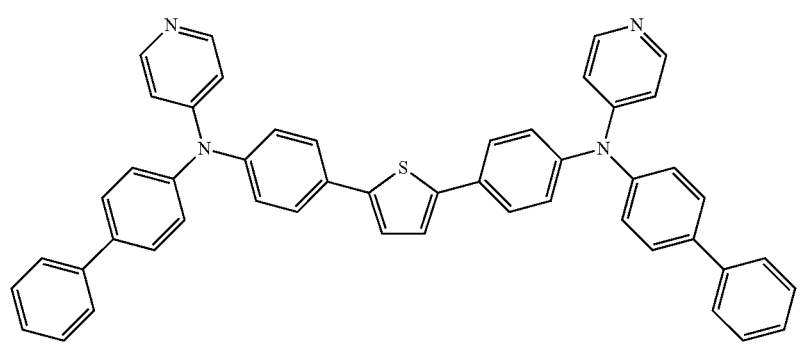

(Cap010)/Example 2

(Cap018)/Example 3
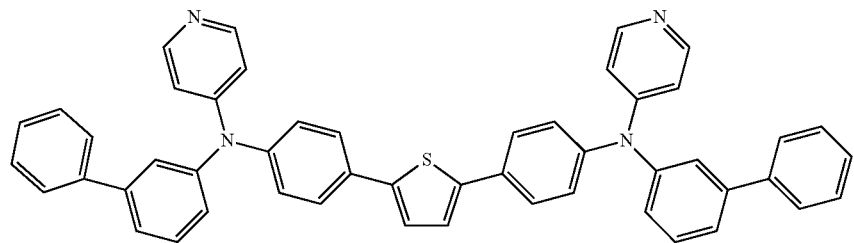
(Cap208)/Example 4
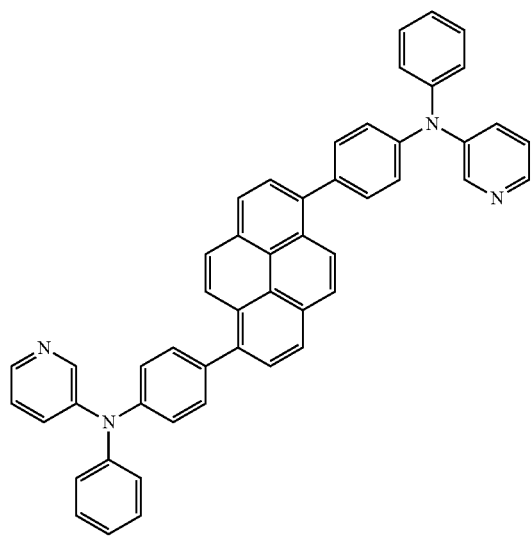
(Cap259)/Example 5
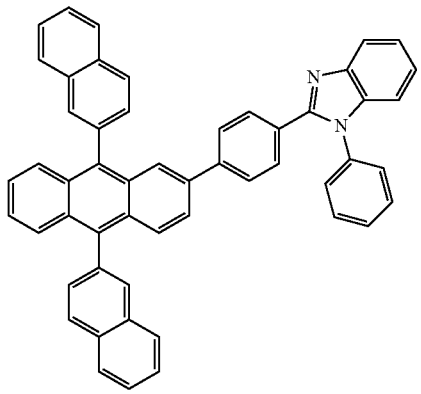
(Cap011)/Example 6
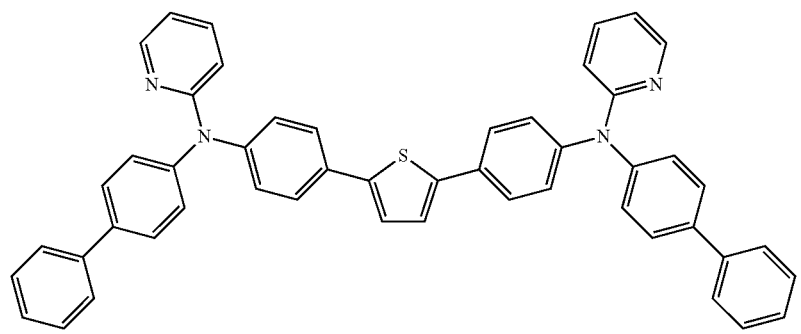
(Cap052)/Example 7
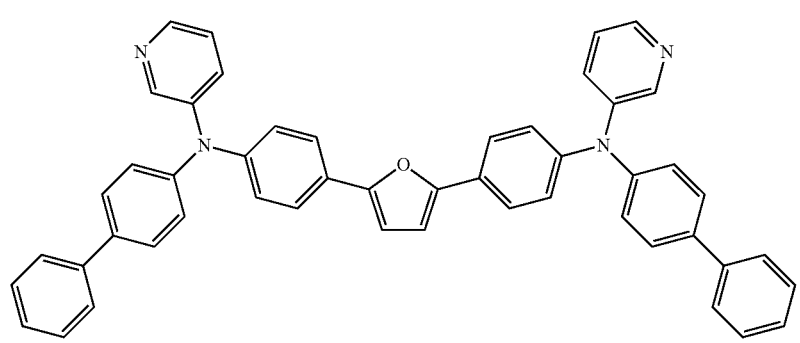

(Cap260)/Example 8
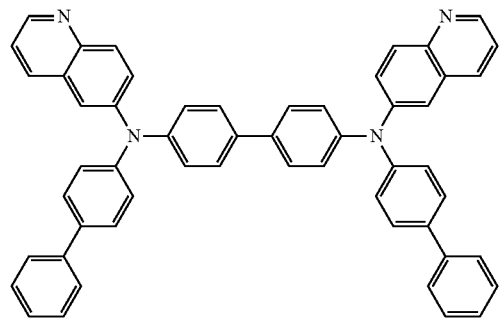
(Cap261)/Example 9
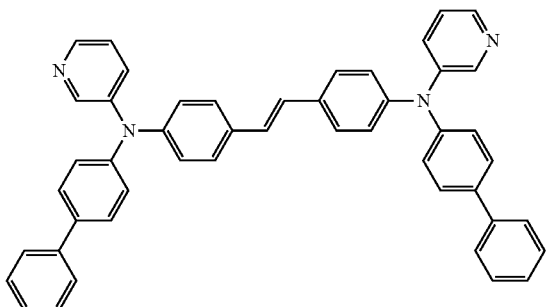
(Com-1)/Comparative Example 1
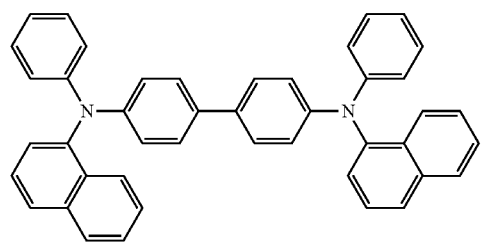
(Com-2)/Comparative Example 2
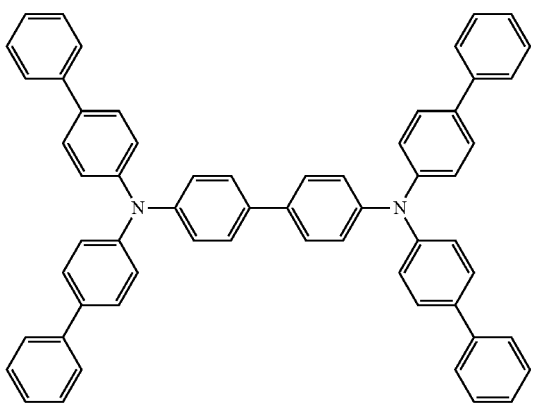
(Com-3)/Comparative Example 3
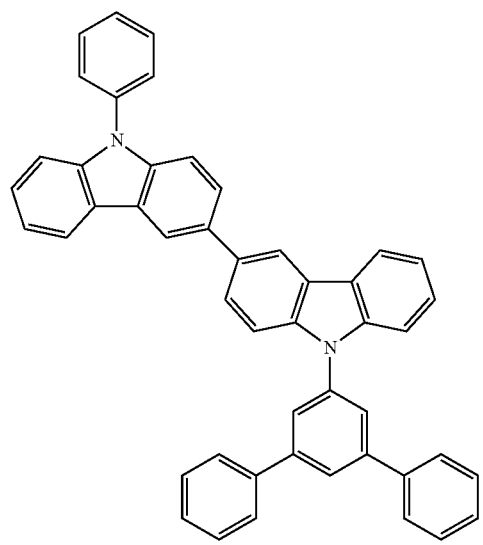
(Com-4)/Comparative Example 4
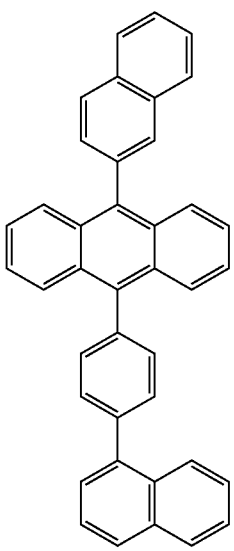

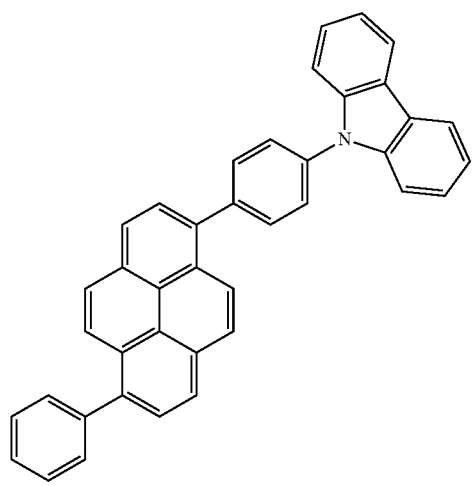

(Com-5)/Comparative Example 5

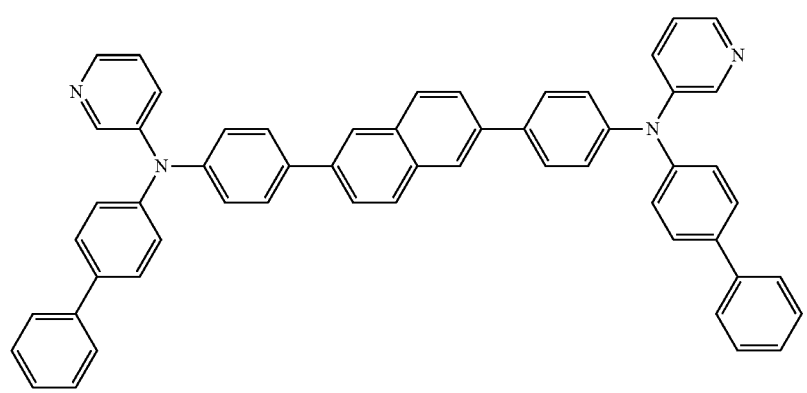

(Com-6)/Comparative Example 6

TABLE 2

| | | λ = 430 nm | | λ = 460 nm | | λ = 500 nm | | Light-Emitting Element Performance | |
|---|---|---|---|---|---|---|---|---|---|
| | | | | | | | | Light-Emitting | Color Purity |
| | | n(430) | k(430) | n(460) | k(460) | n(500) | k(500) | Efficiency | CIE(x, y) |
| Example 1 | Cap007 | 2.45 | 0.39 | 2.29 | 0.03 | 2.10 | 0.00 | 6.5 cd/A | 0.139, 0.051 |
| Example 2 | Cap010 | 2.48 | 0.18 | 2.25 | 0.01 | 2.12 | 0.00 | 6.8 cd/A | 0.139, 0.050 |
| Example 3 | Cap018 | 2.37 | 0.27 | 2.17 | 0.03 | 2.01 | 0.00 | 6.1 cd/A | 0.139, 0.048 |
| Example 4 | Cap208 | 2.35 | 0.12 | 2.13 | 0.00 | 2.02 | 0.00 | 5.8 cd/A | 0.138, 0.049 |
| Example 5 | Cap259 | 2.27 | 0.11 | 2.13 | 0.00 | 2.05 | 0.00 | 5.5 cd/A | 0.139, 0.047 |
| Example 6 | Cap011 | 2.40 | 0.38 | 2.24 | 0.03 | 2.06 | 0.00 | 6.2 cd/A | 0.138, 0.049 |
| Example 7 | Cap052 | 2.39 | 0.40 | 2.25 | 0.04 | 2.06 | 0.00 | 6.0 cd/A | 0.138, 0.047 |
| Example 8 | Cap0260 | 2.24 | 0.24 | 2.03 | 0.01 | 1.90 | 0.00 | 5.5 cd/A | 0.138, 0.049 |
| Example 9 | Cap0261 | 2.41 | 0.48 | 2.35 | 0.07 | 2.12 | 0.00 | 5.4 cd/A | 0.139, 0.051 |
| Comparative Example 1 | Com-1 | 1.99 | 0.00 | 1.92 | 0.00 | 1.87 | 0.00 | 4.5 cd/A | 0.139, 0.048 |
| Comparative Example 2 | Com-2 | 2.18 | 0.00 | 2.06 | 0.00 | 1.99 | 0.00 | 4.5 cd/A | 0.137, 0.051 |
| Comparative Example 3 | Com-3 | 1.95 | 0.00 | 1.91 | 0.00 | 1.88 | 0.00 | 4.2 cd/A | 0.138, 0.049 |
| Comparative Example 4 | Com-4 | 2.08 | 0.00 | 1.99 | 0.00 | 1.94 | 0.00 | 4.3 cd/A | 0.140, 0.046 |
| Comparative Example 5 | Com-5 | 2.14 | 0.00 | 2.04 | 0.00 | 1.98 | 0.00 | 4.6 cd/A | 0.139, 0.048 |
| Comparative Example 6 | Cora-6 | 2.27 | 0.07 | 2.07 | 0.01 | 1.97 | 0.00 | 4.2 cd/A | 0.139, 0.051 |

※Optical constants (refractive index: n, attenuation coefficient: k) were rounded off to second decimal place.

As shown in Table 2, the light-emitting elements of Example 1 to Example 9 exhibited both high light-emitting efficiency and high color purity. On the other hand, while the light-emitting elements of Comparative Example 1 to Comparative Example 6 seemed comparable with Examples in terms of color purity, their light-emitting efficiency was inferior to that of Examples. That is, Comparative Examples failed to provide both high light-emitting efficiency and high color purity.

All the patent documents and non-patent documents mentioned herein are incorporated into this application by reference. In the description, where "plural" is used it includes all cases which are greater than one. Also, where "one or more" is used it includes one, two, three and so on. For a range of number defined by having its upper and lower limits or a combination of its upper and lower limits stated herein, each of the upper and lower limits may be combined in any ways to form different ranges of number, and these combinations shall be formally deemed as effective as the range of number defined by the explicitly stated numbers. Without deviation from the gist of the present invention, people skilled in the art may perform modifications and variations of the present invention, these shall all be included in the scope of the present invention.

What is claimed is:

1. An organic light-emitting element, comprising a substrate, a first electrode, one layer or more of organic film including a light-emitting layer, and a second electrode element; the light-emitting element comprising a covering layer; the covering layer containing an organic material; at least one point in the wavelength range between 430 nm and 460 nm the attenuation coefficient being greater than 0.10 while in the wavelength range of 460 nm to 500 nm its attenuation coefficient being 0.10 or below.

2. The organic light-emitting element of claim 1, wherein at least one point in the wavelength range between 430 nm and 460 nm its attenuation coefficient is greater than 0.12 while in the wavelength range of 460 nm to 500 nm its attenuation coefficient is 0.10 or below.

3. The organic light-emitting element of claim 1, wherein the organic material contained in the covering layer is one or more compounds that have thiophene-based structure, furan-based structure or pyrrole-based structure.

4. The organic light-emitting element of claim 3, wherein the compound having thiophene-based structure, furan-based structure or pyrrole-based structure is as expressed in Formula (1):

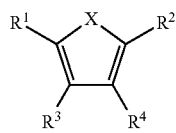

(1)

where, X is selected from a sulfur atom, an oxygen atom and N—R; and R is selected from hydrogen, deuterium, substitutable alkyl, substitutable cycloalkyl, substitutable heterocyclyl, substitutable alkenyl, substitutable cycloalkenyl, substitutable alkynyl, substitutable alkoxy, substitutable alkylthio, substitutable arylether, substitutable arylsulfide, substitutable aryl, substitutable heteroaryl, substitutable carbonyl, substitutable carboxyl, substitutable oxycarbonyl, substitutable carbamoyl, substitutable alkylamino and substitutable silyl;

where, $R^1$ to $R^4$ are identical or different, and each of $R^1$ to $R^4$ is independently selected from hydrogen, deuterium, halogen, substitutable alkyl, substitutable cycloalkyl, substitutable heterocyclyl, substitutable alkenyl, substitutable cycloalkenyl, substitutable alkynyl, substitutable alkoxy, substitutable alkylthio, substitutable arylether, substitutable arylsulfide, substitutable aryl, substitutable heteroaryl, substitutable cyano, substitutable carbonyl, substitutable carboxyl, substitutable oxycarbonyl, substitutable carbamoyl, substitutable alkylamino and substitutable silyl, and are optionally bonded with an adjacent substituent to form a ring;

wherein when substitution is made, the substituents are independently one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino and C3-C15 silyl that has 1 to 5 silicon atoms.

5. The organic light-emitting element of claim 3, wherein the compound having thiophene-based structure, furan-based structure or pyrrole-based structure is as expressed in Formula (2):

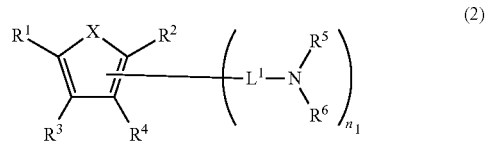

(2)

where, X is selected from a sulfur atom, an oxygen atom and N—R; and R is selected from hydrogen, deuterium, substitutable alkyl, substitutable cycloalkyl, substitutable heterocyclyl, substitutable alkenyl, substitutable cycloalkenyl, substitutable alkynyl, substitutable alkoxy, substitutable alkylthio, substitutable arylether, substitutable arylsulfide, substitutable aryl, substitutable heteroaryl, substitutable carbonyl, substitutable carboxyl, substitutable oxycarbonyl, substitutable carbamoyl, substitutable alkylamino and substitutable silyl;

where, $R^1$ to $R^4$ are identical or different, and each of $R^1$ to $R^4$ is independently selected from hydrogen, deuterium, halogen, substitutable alkyl, substitutable cycloalkyl, substitutable heterocyclyl, substitutable alkenyl, substitutable cycloalkenyl, substitutable alkynyl, substitutable alkoxy, substitutable alkylthio, substitutable arylether, substitutable arylsulfide, substitutable aryl, substitutable heteroaryl, substitutable carbonyl, substitutable carboxyl, substitutable oxycarbonyl, substitutable carbamoyl, substitutable alkylamino and substitutable silyl, and are optionally bonded with an adjacent substituent to form a ring;

$L^1$ is selected from arylene and heteroarylene, and forms a single bond with one or more of $R^1$ to $R^4$; and $R^5$ and $R^6$ are identical or different, and each of $R^5$ and $R^6$ is independently selected from substitutable alkyl, cycloalkyl, aryl, heteroaryl and heterocyclyl, and $n_1$ is an integer of 1 to 4, and at least one of $R^1$ to $R^4$ forms a bond with $L^1$;

wherein when substitution is made, the substituents are independently one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino, and C3-C15 silyl that has 1 to 5 silicon atoms.

6. The organic light-emitting element of claim 5, wherein $n_1$ is 1 or 2.

7. The organic light-emitting element of claim 6, wherein the compound having thiophene-based structure, furan-based structure or pyrrole-based structure is as expressed in Formula (3):

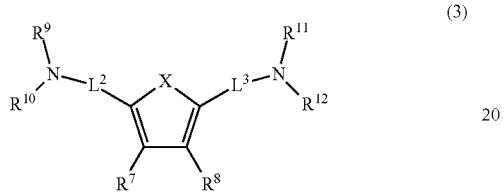
(3)

where, X is selected from a sulfur atom, an oxygen atom and N—R; and R is selected from hydrogen, deuterium, substitutable alkyl, substitutable cycloalkyl, substitutable heterocyclyl, substitutable alkenyl, substitutable cycloalkenyl, substitutable alkynyl, substitutable alkoxy, substitutable alkylthio, substitutable arylether, substitutable arylsulfide, substitutable aryl, substitutable heteroaryl, substitutable carbonyl, substitutable carboxyl, substitutable oxycarbonyl, substitutable carbamoyl, substitutable alkylamino and substitutable silyl;

where, $R^7$ and $R^8$ are identical or different, and each of $R^7$ and $R^8$ is independently selected from hydrogen, deuterium, halogen, substitutable alkyl, substitutable cycloalkyl, substitutable heterocyclyl, substitutable alkenyl, substitutable cycloalkenyl, substitutable alkynyl, substitutable alkoxy, substitutable alkylthio, substitutable arylether, substitutable arylsulfide, substitutable aryl, substitutable heteroaryl, substitutable cyano, substitutable carbonyl, substitutable carboxyl, substitutable oxycarbonyl, substitutable carbamoyl, substitutable alkylamino and substitutable silyl, and are optionally bonded with an adjacent substituent to form a ring;

each of $L^2$ and $L^3$ is selected from arylene and heteroarylene; and each of $R^9$ to $R^{12}$ is selected from substitutable alkyl, cycloalkyl, aryl, heteroaryl and heterocyclyl;

wherein when substitution is made, the substituents are independently one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino, and C3-C15 silyl that has 1 to 5 silicon atoms.

8. The organic light-emitting element of claim 1, wherein the covering layer contains a compound having pyrene-based structure.

9. The organic light-emitting element of claim 8, wherein the compound having pyrene-based structure is as expressed in Formula (4):

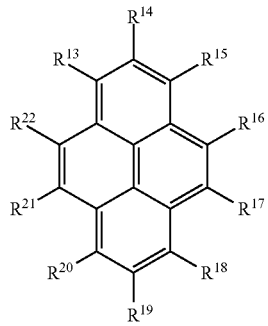
(4)

where, $R^{13}$ to $R^{22}$ are identical or different, and each of $R^{13}$ to $R^{22}$ is independently selected from hydrogen, deuterium, halogen, substitutable alkyl, substitutable cycloalkyl, substitutable heterocyclyl, substitutable alkenyl, substitutable cycloalkenyl, substitutable alkynyl, substitutable alkoxy, substitutable alkylthio, substitutable arylether, substitutable arylsulfide, substitutable aryl, substitutable heteroaryl, substitutable cyano, substitutable carbonyl, substitutable carboxyl, substitutable oxycarbonyl, substitutable carbamoyl, substitutable alkylamino and substitutable silyl, and are optionally bonded with an adjacent substituent to form a ring;

wherein when substitution is made, the substituents are independently one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino, and C3-C15 silyl that has 1 to 5 silicon atoms.

10. The organic light-emitting element of claim 9, wherein the compound having pyrene-based structure is as expressed in Formula (5):

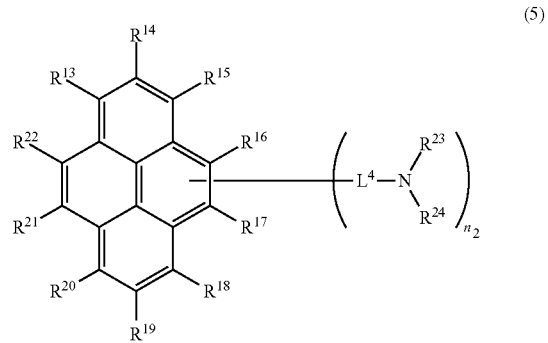
(5)

where at least one of $R^{13}$ to $R^{22}$ is heteroaryl or aryl substituted with heteroaryl; where, $R^{13}$ to $R^{22}$ are identical or different, and each of $R^{13}$ to $R^{22}$ is independently selected from hydrogen, deuterium, halogen, substitutable alkyl, substitutable cycloalkyl, substitutable heterocyclyl, substitutable alkenyl, substitutable cycloalkenyl, substitutable alkynyl, substitutable alkoxy, substitutable alkylthio, substitutable arylether, substitutable arylsulfide, substitutable aryl, substitutable heteroaryl, substitutable cyano, substitutable carbonyl, substitutable carboxyl, substitutable oxycarbonyl, substitutable carbamoyl, substitutable alkylamino and substitutable silyl, and are optionally bonded with an adjacent substituent to form a ring;

L$^4$ is selected from arylene and heteroarylene, and forms single bonds with one or more of R$^{13}$ to R$^{22}$; and R$^{23}$ and R$^{24}$ are identical or different, and each of R$^{23}$ and R$^{24}$ is independently selected from substitutable alkyl, substitutable cycloalkyl, substitutable aryl, substitutable heteroaryl and substitutable heterocyclyl, and n$_2$ is an integer of 1-4, and at least one of R$^{13}$ to R$^{22}$ forms a bond with L$^4$;

wherein when substitution is made, the substituents are independently one or more selected from deuterium, halogen, C1-C15 alkyl, 15 C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino, and C3-C15 silyl that has 1 to 5 silicon atoms.

11. The organic light-emitting element of claim 10, wherein n$_2$ is 1 or 2.

12. The organic light-emitting element of claim 11, wherein the compound having pyrene-based structure is as expressed in Formula (6):

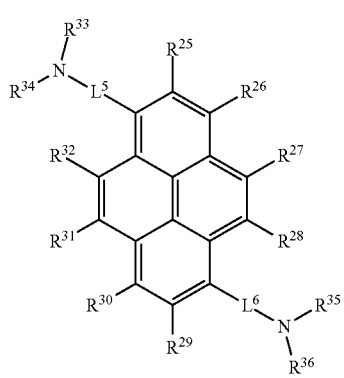

(6)

where, R$^{25}$ to R$^{32}$ are identical or different, each of R$^{25}$ to R$^{32}$ is and are independently selected from hydrogen, deuterium, halogen, substitutable alkyl, substitutable cycloalkyl, substitutable heterocyclyl, substitutable alkenyl, substitutable cycloalkenyl, substitutable alkynyl, substitutable alkoxy, substitutable alkylthio, substitutable arylether, substitutable arylsulfide, substitutable aryl, substitutable heteroaryl, substitutable cyano, substitutable carbonyl, substitutable carboxyl, substitutable oxycarbonyl, substitutable carbamoyl, substitutable alkylamino and substitutable silyl, and are optionally bonded with an adjacent substituent to form a ring;

each of L$^5$ and L$^6$ is independently selected from arylene and heteroarylene; and R$^{33}$ to R$^{36}$ are identical or different, and each of R$^{33}$ to R$^{36}$ is independently selected from substitutable alkyl, substitutable cycloalkyl, substitutable aryl, substitutable heteroaryl or substitutable heterocyclyl;

wherein when substitution is made, the substituents are independently one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino, and C3-C15 silyl that has 1 to 5 silicon atoms.

13. The organic light-emitting element of claim 1, wherein the covering layer contains a compound having anthracene-based structure.

14. The organic light-emitting element of claim 13, wherein the compound having anthracene-based structure is as expressed in Formula (7):

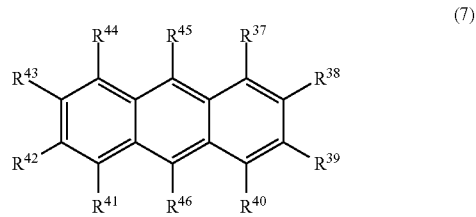

(7)

where, R$^{37}$ to R$^{46}$ are identical or different, and each of R$^{37}$ to R$^{46}$ is independently selected from hydrogen, deuterium, halogen, substitutable alkyl, substitutable cycloalkyl, substitutable heterocyclyl, substitutable alkenyl, substitutable cycloalkenyl, substitutable alkynyl, substitutable alkoxy, substitutable alkylthio, substitutable arylether, substitutable arylsulfide, substitutable aryl, substitutable heteroaryl, substitutable cyano, substitutable carbonyl, substitutable carboxyl, substitutable oxycarbonyl, substitutable carbamoyl, substitutable alkylamino and substitutable silyl, and are optionally bonded with an adjacent substituent to form a ring;

when substitution is made, the substituents are independently one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino, and C3-C15 silyl that has 1 to 5 silicon atoms.

15. The organic light-emitting element of claim 14, wherein the compound having anthracene-based structure is as expressed in Formula (8):

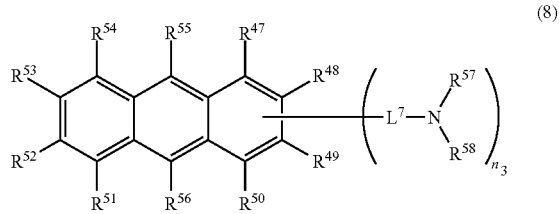

(8)

where, R$^{47}$ to R$^{56}$ are identical or different, and each of R$^{47}$ to R$^{56}$ is independently selected from hydrogen, deuterium, halogen, substitutable alkyl, substitutable cycloalkyl, substitutable heterocyclyl, substitutable alkenyl, substitutable cycloalkenyl, substitutable alkynyl, substitutable alkoxy, substitutable alkylthio, substitutable arylether, substitutable arylsulfide, substitutable aryl, substitutable heteroaryl, substitutable cyano, substitutable carbonyl, substitutable carboxyl, substitutable oxycarbonyl, substitutable carbamoyl, substitutable alkylamino and substitutable silyl, and are optionally bonded with an adjacent substituent to form a ring;

L$^7$ is selected from arylene and heteroarylene, and forms single bonds with one or more of R$^{47}$ to R$^{56}$;

R$^{57}$ and R$^{58}$ are identical or different, and each of R$^{57}$ and R$^{58}$ is independently selected from substitutable alkyl, substitutable cycloalkyl, substitutable aryl, substitutable heteroaryl and substitutable heterocyclyl, and n$_3$ is an integer of 1-4, and at least one of R$^{47}$-R$^{56}$ forms a bond with L$^7$;

wherein when substitution is made, the substituents are independently one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino, and C3-C15 silyl that has 1 to 5 silicon atoms.

16. The organic light-emitting element of claim 15, wherein n$_3$ is 1 or 2.

17. The organic light-emitting element of claim 16, wherein the compound having anthracene-based structure is as expressed in Formula (9):

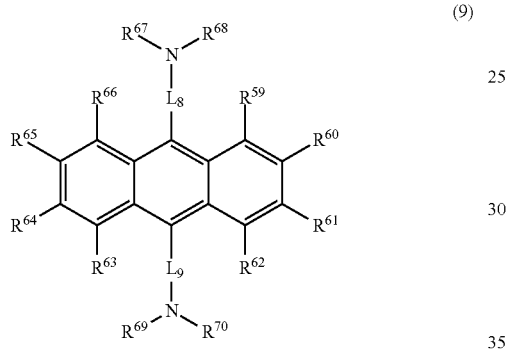

(9)

where, R$^{59}$ to R$^{66}$ are identical or different, and each of R$^{59}$ to R$^{66}$ is independently selected from hydrogen, deuterium, halogen, substitutable alkyl, substitutable cycloalkyl, substitutable heterocyclyl, substitutable alkenyl, substitutable cycloalkenyl, substitutable alkynyl, substitutable alkoxy, substitutable alkylthio, substitutable arylether, substitutable arylsulfide, substitutable aryl, substitutable heteroaryl, substitutable cyano, substitutable carbonyl, substitutable carboxyl, substitutable oxycarbonyl, substitutable carbamoyl, substitutable alkylamino and substitutable silyl, and are optionally bonded with an adjacent substituent to form a ring;

each of L$^8$ and L$^9$ is independently selected from arylene and heteroarylene; and R$^{67}$ to R$^{70}$ are identical or different, and each of R$^{67}$ to R$^{70}$ is independently selected from substitutable alkyl, substitutable cycloalkyl, substitutable aryl, substitutable heteroaryl and substitutable heterocyclyl;

wherein when substitution is made, the substituents are independently one or more selected from deuterium, halogen, C1-C15 alkyl, C3-C15 cycloalkyl, C3-C15 heterocyclyl, C2-C15 alkenyl, C4-C15 cycloalkenyl, C2-C15 alkynyl, C1-C15 alkoxy, C1-C15 alkylthio, C6-C55 arylether, C6-C55 arylsulfide, C6-C55 aryl, C5-C55 aromatic heterocyclyl, carbonyl, carboxyl, oxycarbonyl, carbamoyl, C1-C40 alkylamino, and C3-C15 silyl that has 1 to 5 silicon atoms.

\* \* \* \* \*